(12) United States Patent
Inoue et al.

(10) Patent No.: US 7,655,953 B2
(45) Date of Patent: Feb. 2, 2010

(54) SEMICONDUCTOR LASER APPARATUS

(75) Inventors: Daijiro Inoue, Kyoto (JP); Masayuki Hata, Kadoma (JP); Yasuyuki Bessho, Uji (JP)

(73) Assignee: Sanyo Electric Co., Ltd., Osaka (JP)

( * ) Notice: Subject to any disclaimer, the term of this patent is extended or adjusted under 35 U.S.C. 154(b) by 518 days.

(21) Appl. No.: 11/215,129

(22) Filed: Aug. 31, 2005

(65) Prior Publication Data

US 2006/0054906 A1    Mar. 16, 2006

(30) Foreign Application Priority Data

Aug. 31, 2004  (JP) ............................. 2004-253049
Aug. 9, 2005   (JP) ............................. 2005-231212

(51) Int. Cl.
*H01L 29/201* (2006.01)

(52) U.S. Cl. ............ 257/89; 372/50.121; 257/E27.014; 257/E27.015

(58) Field of Classification Search .............. 372/43.01, 372/46.01, 50.1, 50.121; 257/89, 99, 173, 257/328, 355, 546, E25.014–E25.015
See application file for complete search history.

(56) References Cited

U.S. PATENT DOCUMENTS

| 6,807,207 | B2 | 10/2004 | Shiomoto |
| 2001/0050531 | A1 | 12/2001 | Ikeda |
| 2004/0109481 | A1 | 6/2004 | Ikeda |

FOREIGN PATENT DOCUMENTS

| JP | 2000-223791 | 8/2000 |
| JP | 2001-230502 | 8/2001 |

*Primary Examiner*—Davienne Monbleau
*Assistant Examiner*—Matthew Reames
(74) *Attorney, Agent, or Firm*—McDermott Will & Emery LLP

(57) ABSTRACT

A sub-substrate, a blue-violet semiconductor laser device, an insulating layer, and a red semiconductor laser device are stacked in order on a support member through a plurality of fusion layers. The insulating layer is stacked on an n-side pad electrode of the blue-violet semiconductor laser device, and a conductive layer is formed on the insulating layer. The red semiconductor laser device is stacked on the conductive layer through a fusion layer. The conductive layer is electrically connected to a p-side pad electrode of the red semiconductor laser device. The n-side pad electrode of the blue-violet semiconductor laser device and the n-side pad electrode of the red semiconductor laser device are electrically connected to each other.

9 Claims, 50 Drawing Sheets

F I G. 4
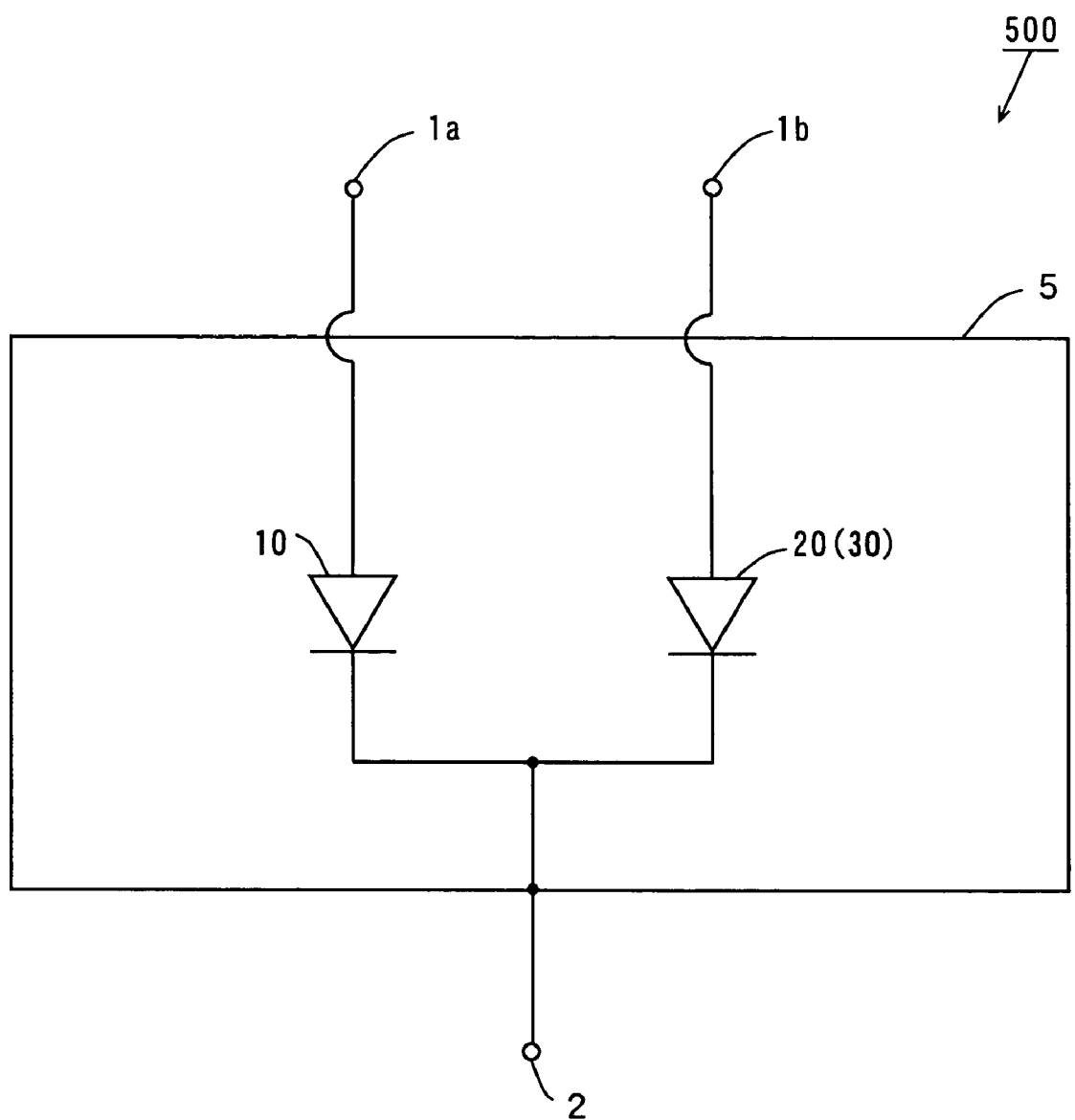

F I G. 6
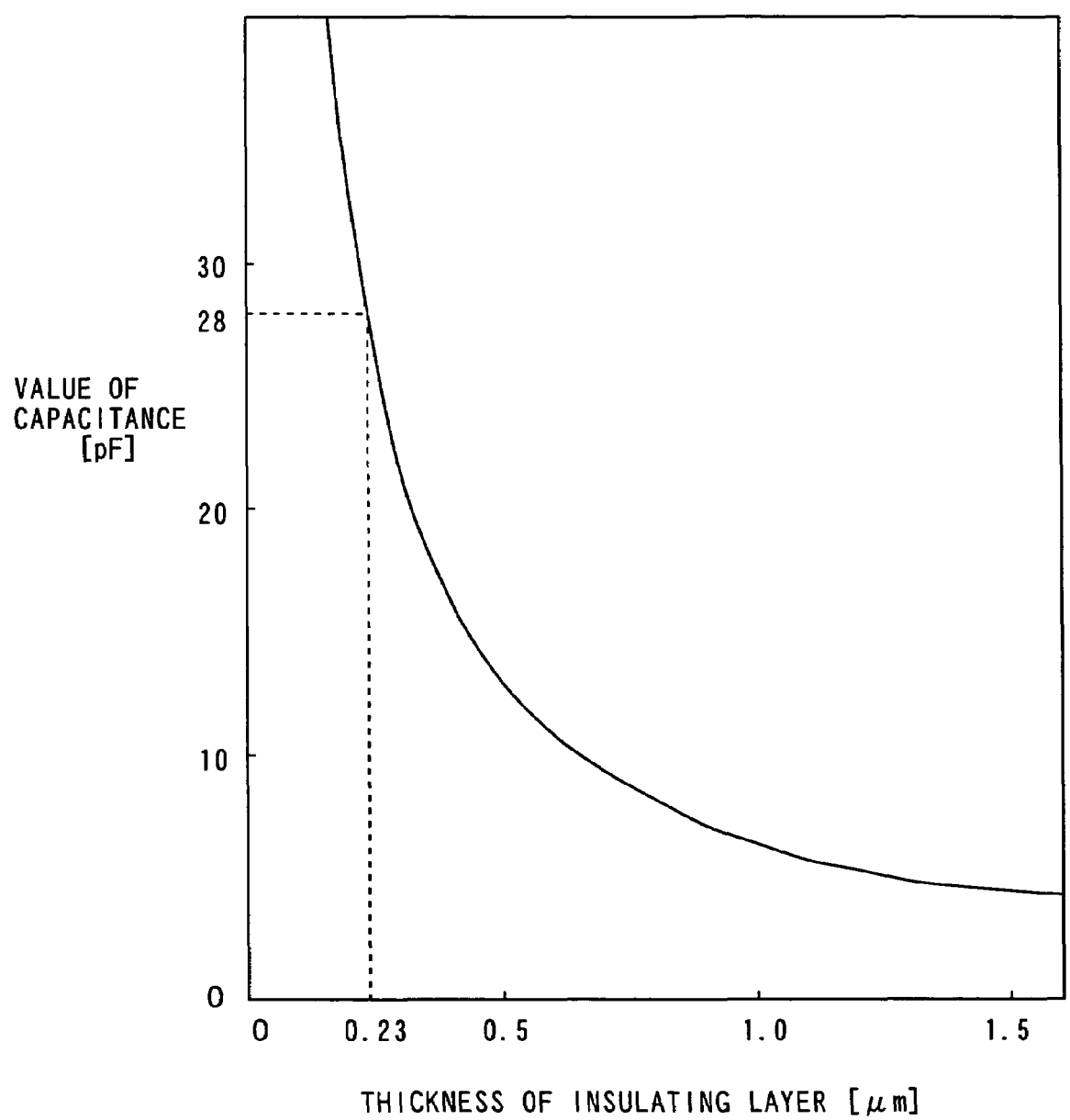

F I G. 1 8
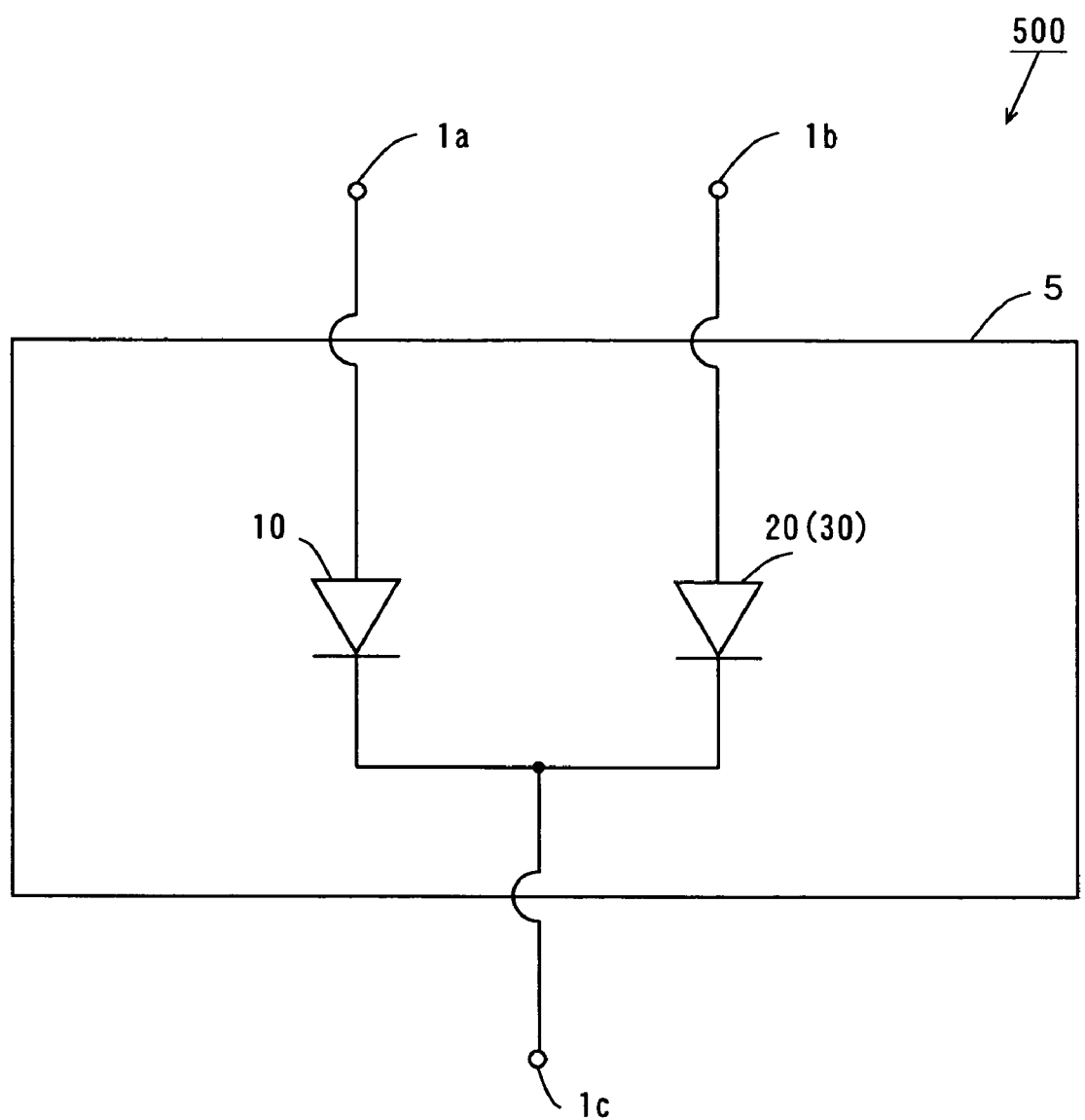

F I G. 2 0
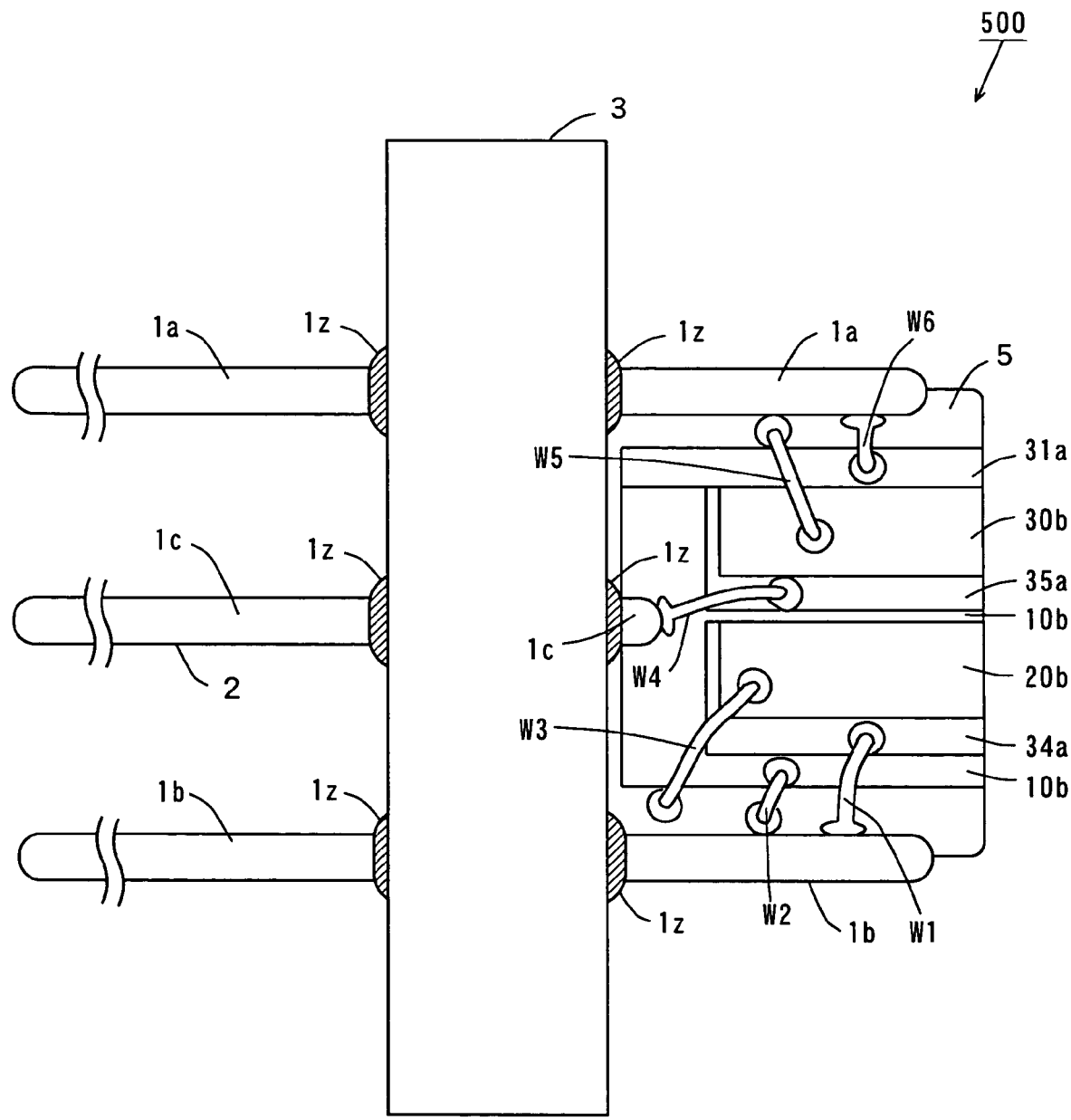

FIG. 22
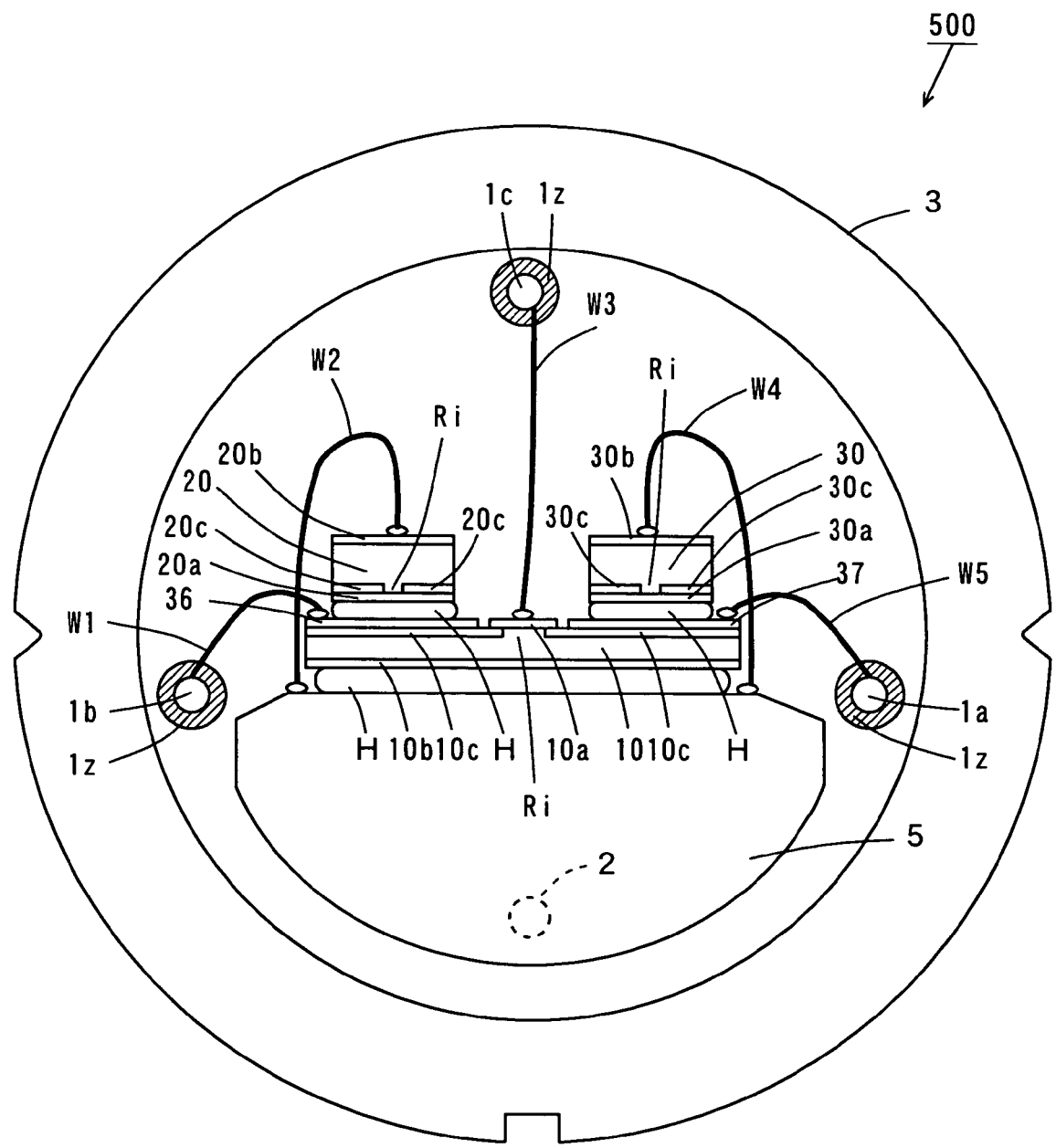
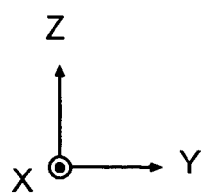

F I G. 3 8
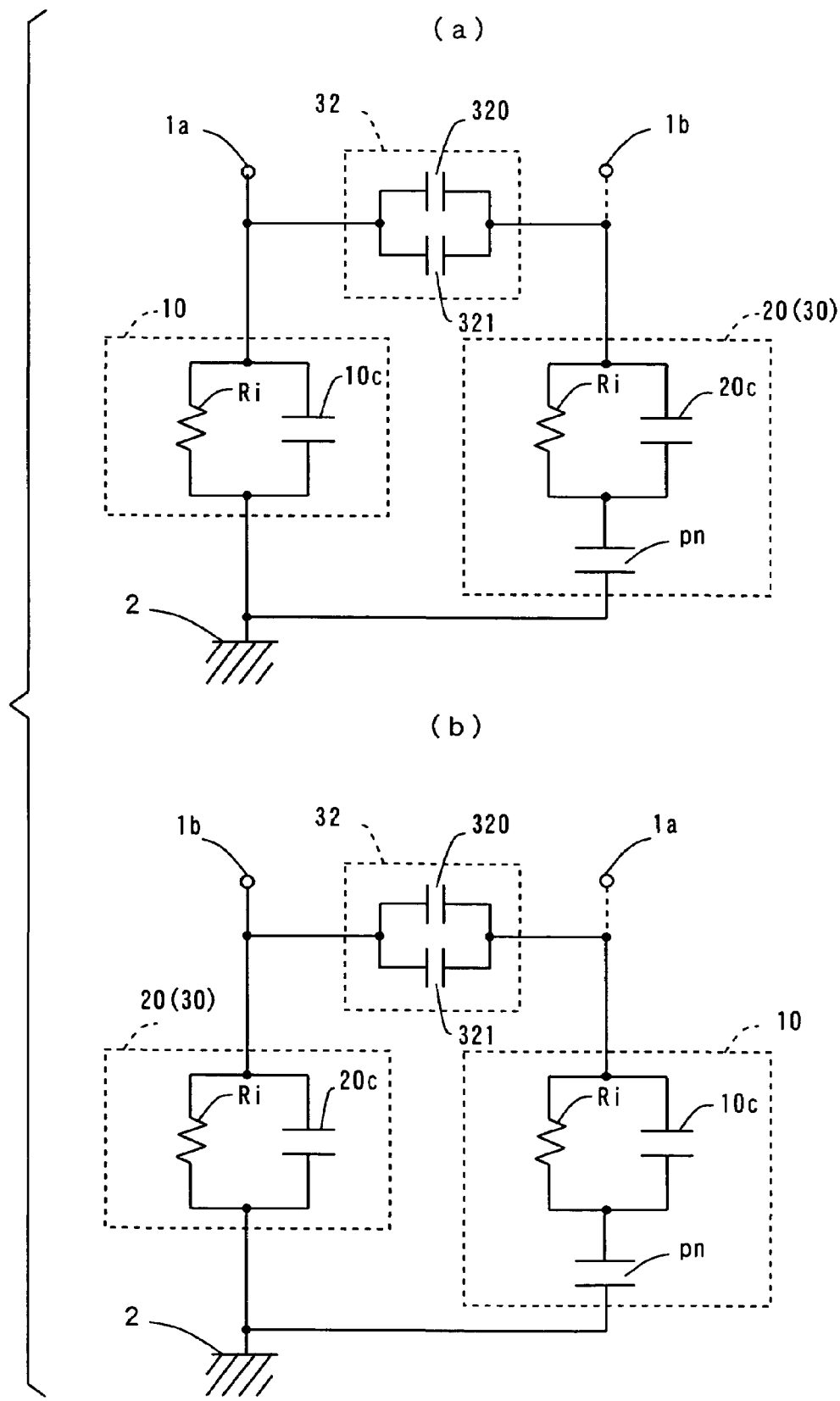

FIG. 46
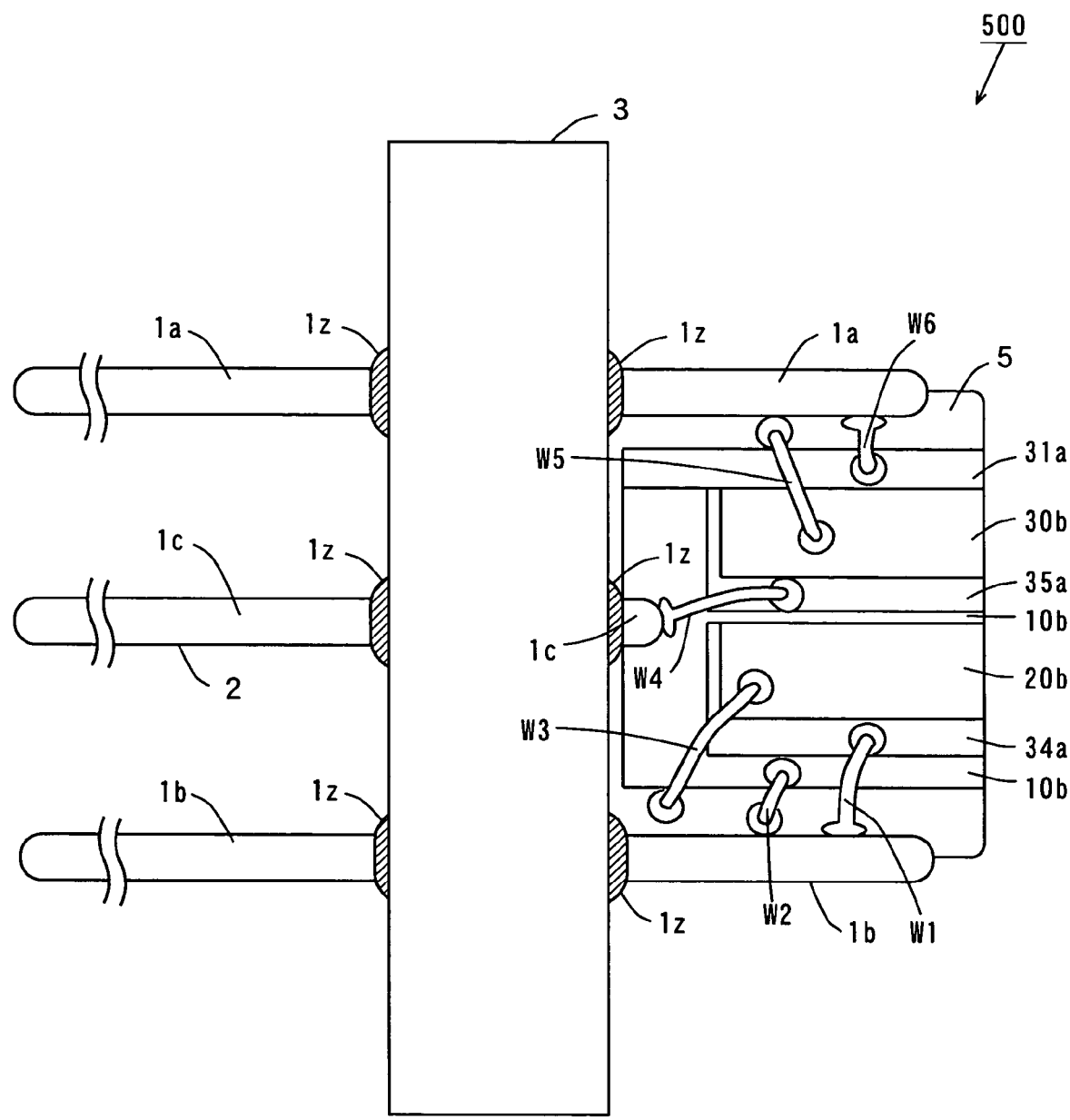
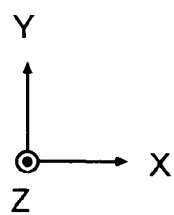

SEMICONDUCTOR LASER APPARATUS

BACKGROUND OF THE INVENTION

1. Field of the Invention

The present invention relates to semiconductor laser apparatuses comprising laser devices.

2. Description of the Background Art

With recent improvements in the performance of personal computers and multimedia equipment, the amount of information to be processed has significantly increased. The increase in the amount of information has led to the development of optical recording media and drives thereof that can handle increased speed and capacity of information processing.

Specific examples of such optical recording media include compact disks (hereinafter referred to as CDs) and digital versatile disks (hereinafter referred to as DVDs). Specific examples of drives for playing back and recording such optical recording media include semiconductor laser apparatuses for the CD and semiconductor laser apparatuses for the DVD. A semiconductor laser apparatus for the CD is capable of emitting an infrared laser beam (wavelength: around 790 nm) for use in playing back or recording the CD. A semiconductor laser apparatus for the DVD is capable of emitting a red laser beam (wavelength: around 658 nm) for use in playing back or recording the DVD.

In the specification, the semiconductor laser device that emits an infrared laser beam (wavelength: around 790 nm) is referred to as an infrared semiconductor laser device, and the semiconductor laser device that emits a red laser beam (wavelength: around 658 nm) is referred to as a red semiconductor laser device.

Among the drives of the optical recording media is a semiconductor laser apparatus capable of playing back or recording the CD and DVD. This semiconductor laser apparatus that comprises an infrared semiconductor laser device and a red semiconductor laser device is capable of emitting an infrared laser beam for the CD and a red laser beam for the DVD.

Using such a semiconductor laser apparatus enables a smaller parts count than using both a semiconductor laser apparatus for the CD and a semiconductor laser apparatus for the DVD, thus resulting in a simpler optical recording medium drive.

Both of an infrared semiconductor laser device and a red semiconductor laser device can be formed on a GaAs substrate. Accordingly, a monolithic red/infrared semiconductor laser device is fabricated by forming both the infrared semiconductor laser device and the red semiconductor laser device on a GaAs substrate as a single chip. Providing the monolithic red/infrared semiconductor laser device in the aforementioned semiconductor laser apparatus enables an interval between the emission points of an infrared laser beam and a red laser beam to be accurately controlled.

Meanwhile, in order to improve the recording density of optical disk systems, semiconductor laser devices that emit a blue-violet laser beam with a short lasing wavelength (wavelength: around 400 nm) have been developed for the next-generation DVD. Semiconductor laser apparatuses that incorporate such semiconductor laser devices emitting blue-violet laser beams have also been developed.

In the specification, a semiconductor laser device that emits a blue-violet laser beam (wavelength: around 400 nm) is referred to as a blue-violet semiconductor laser device.

Unlike the infrared semiconductor laser device and the red semiconductor laser device, the blue-violet semiconductor laser device is not formed on a GaAs substrate. It is thus very difficult to integrate the blue-violet semiconductor laser device with the infrared semiconductor laser device and the red semiconductor laser device into a single chip.

For this reason, JP 2001-230502 A, for example, suggests a semiconductor laser apparatus which is fabricated as follows. Infrared and red semiconductor laser devices are formed on the same chip to fabricate a monolithic red/infrared semiconductor laser device, while a blue-violet semiconductor laser device is formed on a separate chip. Then, the blue-violet semiconductor laser device chip and the monolithic red/infrared semiconductor laser device chip are stacked on each other.

The semiconductor laser apparatus disclosed in JP 2001-230502 A is described. FIG. 50 is a schematic diagram showing the semiconductor laser apparatus 900 according to JP 2001-230502 A.

As shown in FIG. 50, a blue-violet semiconductor laser device 901 is bonded on a support member 903a integral with a package body 903 through a fusion layer 905. The blue-violet semiconductor laser device 901 is connected with the support member 903a mechanically and electrically.

An electrode 901a and an insulating layer 904 are formed on a portion of the blue-violet semiconductor laser device 901. The electrode 901a is formed on the insulating layer 904. An infrared semiconductor laser device 902a is bonded on the electrode 901 through a fusion layer 906, and a red semiconductor laser device 902b is bonded on the electrode 901b through a fusion layer 907.

The infrared semiconductor laser device 902a and the red semiconductor laser device 902b constitute an integrated semiconductor laser device 902 that is monolithically integrated on the same substrate. An electrode 902c is formed on the integrated semiconductor laser device 902.

The electrode 901a, which is connected with the infrared semiconductor laser device 902a, is formed on the blue-violet semiconductor laser device 901 with the insulating layer 904 interposed therebetween. This allows either of the infrared semiconductor laser device 902a and the red semiconductor laser device 902b to be driven independently.

Power supply pins 909a, 909b, 909c are formed so that they are isolated from the package body 903 through respective insulating rings 908a, 908b, 908c.

Note that the electrode 901a is used as a p-electrode for the infrared semiconductor laser device 902a, the electrode 901b is used as an n-electrode for the blue-violet semiconductor laser device 901 and a p-electrode for the red semiconductor laser device 902b, and the electrode 902c is used as an n-electrode for the infrared semiconductor laser device 902a and the red semiconductor laser device 902b.

The electrodes 901a, 901b, 901c, respectively, are connected to wires JWa, JWb, JWc through the power supply pins 909a, 909b, 909c. The support member 903a receives power from the power supply pin 903b connected to the package body 903.

The semiconductor laser apparatus 900 in FIG. 50 is thus capable of selecting any of the infrared, red, and blue-violet laser beams, and emitting the selected laser beam.

FIG. 51 is a circuit diagram showing electrical wiring of the semiconductor laser apparatus 900 in FIG. 50.

As shown in FIG. 51, in order to drive the blue-violet semiconductor laser device 901, a negative voltage must be applied to the power supply pin 909b with respect to the package body 903 which is generally grounded when used. In order to drive the red semiconductor laser device 902b, a voltage that is higher than the voltage at the supply pin 909c must be applied to the power supply pin 909b. Further, in order to drive the infrared semiconductor laser device 902a, a voltage that is higher than the voltage at the power supply pin 909c must be applied to the power supply pin 909a.

Therefore, when driving each of the semiconductor laser devices in the semiconductor laser apparatus 900 in FIG. 50, control of the drive voltage thereof is complicated.

Moreover, when driving the infrared semiconductor laser device 902a by alternating voltage, the insulating layer 904 in contact with the electrode 901a in FIG. 50 functions as a dielectric as indicated by the broken line in FIG. 51. This may cause a current to flow in the red semiconductor laser device 902b through the insulating layer 904 to degrade the high frequency characteristics of the infrared semiconductor laser device 902a.

SUMMARY OF THE INVENTION

It is an object of the present invention to provide a semiconductor laser apparatus in which drive voltages are easily controlled, and deterioration of the high frequency characteristics of semiconductor laser devices due to the influence of an insulating layer can be sufficiently reduced.

(1)

According to one aspect of the present invention, a semiconductor laser apparatus comprises a conductive support member; an insulating layer; a conductive layer formed on one surface of the insulating layer; a first semiconductor laser device having a first semiconductor layer formed on a first substrate, a first electrode formed on the first semiconductor layer, and a second electrode formed on the first substrate, and emitting a light beam of a first wavelength; and a second semiconductor laser device having a second semiconductor layer formed on a second substrate, a third electrode formed on the second semiconductor layer, and a fourth electrode formed on the second substrate, and emitting a light beam of a second wavelength, the second semiconductor layer including a current blocking layer that blocks a current that flows from the third electrode to the fourth electrode, the first semiconductor laser device being provided on the support member so that the first electrode is positioned on the support member side, the insulating layer and the conductive layer being provided in order on the second electrode of the first semiconductor laser device, the second semiconductor laser device being provided on the conductive layer so that the third electrode is electrically connected to the conductive layer, the fourth electrode being electrically connected with the second electrode, a value of capacitance induced in the insulating layer being not more than a value of capacitance induced in the current blocking layer.

When a voltage is applied between the first and second electrodes in the semiconductor laser apparatus, the first semiconductor laser device emits the light beam of the first wavelength. Also, when a voltage is applied between the third electrode that is electrically connected with the conductive layer on the insulating layer and the fourth electrode, the second semiconductor laser device emits the light beam of the second wavelength.

During the drive of the second semiconductor laser device, the insulating current blocking layer and the insulating layer function as dielectrics. Note that the value of capacitance induced in the insulating layer is not more than the value of capacitance induced in the current blocking layer. Such a small capacitance value of the insulating layer sufficiently reduces the decrease in the cutoff frequency of the second semiconductor laser device due to the influence of the insulating layer. As a result, deterioration of the high frequency characteristics of the second semiconductor laser device due to the influence of the insulating layer is sufficiently reduced.

Moreover, the second and fourth electrodes are electrically connected. This allows the first and second semiconductor laser devices to be driven individually by applying voltages to the first and third electrodes, respectively. As a result, the drive voltage of each of the first and second semiconductor laser devices can be easily controlled.

As described above, the drive voltages can be easily controlled, and deterioration of the high frequency characteristics of the second semiconductor laser device due to the influence of the insulating layer can be sufficiently reduced.

In addition, a plurality of semiconductor laser apparatuses can be simultaneously fabricated by overlapping a wafer having a plurality of first semiconductor laser devices thereon with a wafer having a plurality of second semiconductor laser devices thereon. This improves the positioning accuracy of each of the first semiconductor laser devices and each of the second semiconductor laser devices. This results in improved positioning accuracy of the emission points of the first and second semiconductor laser devices.

Heat generated from the first and second semiconductor laser devices is dissipated through the support member. In the semiconductor laser apparatus according to the first invention, the first semiconductor laser device is provided on the support member with the first electrode thereof being positioned on the support member side. This brings the emission point positioned in the first semiconductor layer close to the support member. This results in improved heat dissipation capability of the first semiconductor laser device.

(2)

The value of capacitance induced in the insulating layer may be not more than one-fifth the value of capacitance induced in the current blocking layer. Such a very small capacitance value of the insulating layer significantly reduces the decrease in the cutoff frequency of the second semiconductor laser device due to the influence of the insulating layer. As a result, deterioration of the high frequency characteristics of the second semiconductor laser device due to the influence of the insulating layer is sufficiently reduced.

(3)

The first semiconductor laser device may have a first optical waveguide, the second semiconductor laser device may have a second optical waveguide, and a first portion of the insulating layer that corresponds to at least a region of the second optical waveguide on a light beam emitting facet side thereof has a thermal conductive property higher than that of a second portion of the insulating layer except the first portion thereof.

Where light is emitted from both facets of the second optical waveguide, the light beam emitting facet refers to a facet that emits a greater amount of light than the other facet.

During the drive of the first semiconductor laser device, the light beam of the first wavelength is produced in the first optical waveguide, and simultaneously emitted from the light beam emitting facet. Heat generated at the time around the first optical waveguide is transmitted to the support member, and dissipated through the support member.

Also, during the drive of the second semiconductor laser device, the light beam of the second wavelength is produced in the second optical waveguide, and emitted from the light beam emitting facet. Heat generated at the time in the second optical waveguide is transmitted to the support member by way of the insulating layer and the first semiconductor laser device, and dissipated through the support member. A region around the second optical waveguide on the light beam emitting facet side thereof generates a greater amount of heat than the remaining region of the second optical waveguide.

This allows heat that is intensively generated in the region around the second optical waveguide on the light beam emitting facet side thereof to be efficiently transmitted to the first semiconductor laser device via the first portion of the insulating layer having a high thermal conductive property.

Consequently, electrical isolation between the first and second semiconductor laser devices is ensured while the heat dissipation capability of a portion of the second semiconductor laser device is improved. This results in good heat dissipation capability of the semiconductor laser apparatus.

(4)

The first portion of the insulating layer may have a thickness smaller than that of the second portion. In this case, the thermal conductive property of the first portion of the insulating layer is higher than that of the second portion thereof. Thus, the thermal conductive property of the first portion of the insulating layer can be easily made higher than that of the second portion thereof. Moreover, the thickness of the second portion greater than that of the first portion minimizes the decrease in overall insulation of the insulating layer, even if the thickness of the first portion is small.

(5)

The first portion of the insulating layer may include a first material having a first thermal conductivity, and the second portion of the insulating layer may include a second material having a second thermal conductivity lower than the first thermal conductivity of the first portion. In this way, the thermal conductivity of the first portion of the insulating layer can be easily made higher than that of the second portion thereof. Moreover, by selecting the first material, the decrease in overall insulation of the insulating layer can be minimized.

In addition, by selecting the first material and the second material, the thickness of the first portion and the thickness of the second portion can be made substantially equal. This facilitates fabrication of the semiconductor laser apparatus.

(6)

According to another aspect of the present invention, a semiconductor laser apparatus comprises a conductive support member; an insulating layer; a conductive layer formed on one surface of the insulating layer; a first semiconductor laser device having a first semiconductor layer formed on a first substrate, a first electrode formed on the first semiconductor layer, and a second electrode formed on the first substrate, and emitting a light beam of a first wavelength; and a second semiconductor laser device having a second semiconductor layer formed on a second substrate, a third electrode formed on the second semiconductor layer, and a fourth electrode formed on the second substrate, and emitting a light beam of a second wavelength, the first semiconductor layer including a first current blocking layer that blocks a current that flows from the first electrode to the second electrode, the second semiconductor layer including a second current blocking layer that blocks a current that flows from the third electrode to the fourth electrode, the first semiconductor laser device being provided on the support member so that the second electrode is positioned on the support member side, the insulating layer and the conductive layer being provided in order on the first electrode of the first semiconductor laser device, the second semiconductor laser device being provided on the conductive layer so that the third electrode is electrically connected with the conductive layer, the fourth electrode being connected with the second electrode, a value of capacitance induced in the insulating layer being not more than a smaller one of values of capacitances induced in the first current blocking layer and the second current blocking layer.

When a voltage is applied between the first and second electrodes in the semiconductor laser apparatus, the first semiconductor laser device emits the light beam of the first wavelength. Also, when a voltage is applied between the third electrode that is electrically connected with the conductive layer on the insulating layer and the fourth electrode, the second semiconductor laser device emits the light beam of the second wavelength.

During the drive of the first semiconductor laser device, the insulating first current blocking layer and the insulating layer function as dielectrics. Note that the value of capacitance induced in the insulating layer is not more than the smaller one of the values of capacitances induced in the first current blocking layer and the second current blocking layer. Such a small capacitance value of the insulating layer sufficiently reduces the decrease in the cutoff frequency of the first semiconductor laser device due to the influence of the insulating layer. As a result, deterioration of the high frequency characteristics of the first semiconductor laser device due to the influence of the insulating layer is sufficiently reduced.

Also, during the drive of the second semiconductor laser device, the insulating second current blocking layer and the insulating layer function as dielectrics. Note that the value of capacitance induced in the insulating layer is not more than the value of capacitance induced in the second current blocking layer. Such a small capacitance value of the insulating layer sufficiently reduces the decrease in the cutoff frequency of the second semiconductor laser device due to the influence of the insulating layer. As a result, deterioration of the high frequency characteristics of the second semiconductor laser device due to the influence of the insulating layer is sufficiently reduced.

Moreover, the second and fourth electrodes are electrically connected. This allows the first and second semiconductor laser devices to be driven individually by applying voltages to the first and third electrodes, respectively. As a result, the drive voltage of each of the first and second semiconductor laser devices can be easily controlled.

As described above, the drive voltages can be easily controlled, and deterioration of the high frequency characteristics of each of the first and second semiconductor laser devices due to the influence of the insulating layer can be sufficiently reduced.

In addition, a plurality of semiconductor laser apparatuses can be simultaneously fabricated by overlapping a wafer having a plurality of first semiconductor laser devices thereon with a wafer having a plurality of second semiconductor laser devices thereon. This improves the positioning accuracy of each of the first semiconductor laser devices and each of the second semiconductor laser devices. This results in improved positioning accuracy of the emission points of the first and second semiconductor laser devices.

Furthermore, the first semiconductor laser device and the second semiconductor laser device are disposed so that the first electrode and the third electrode are positioned opposite to each other with the insulating layer therebetween. This brings the first and second semiconductor layers close to each other, thus allowing the emission points of the first and second semiconductor laser devices to approach each other.

(7)

The value of capacitance induced in the insulating layer may be not more than one-fifth the smaller one of the values of capacitances induced in the first current blocking layer and the second current blocking layer. Such a small capacitance value of the insulating layer significantly reduces the decrease in the cutoff frequency of each of the first and second semiconductor laser devices due to the influence of the insulating layer. As a result, deterioration of the high frequency characteristics of each of the first and second semiconductor laser devices due to the influence of the insulating layer is sufficiently reduced.

(8)

The value of capacitance induced in the insulating layer may be not more than about 10 pF. A capacitance value of not more than about 10 pF for the insulating layer reduces the decrease in the cutoff frequency of each of the first and second semiconductor laser device due to the influence of the insulating layer. As a result, deterioration of the high frequency characteristics of each of the first and second semiconductor laser devices due to the influence of the insulating layer is sufficiently reduced.

(9)

The first semiconductor laser device may have a first optical waveguide, the second semiconductor laser device may have a second optical waveguide, and a first portion of the insulating layer that corresponds to at least a region of the second optical waveguide on a light beam emitting facet side thereof may have a thermal conductive property higher than that of a second portion of the insulating layer except the first portion thereof.

Where light is emitted from both facets of the second optical waveguide, the light beam emitting facet refers to a facet that emits a greater amount of light than the other facet.

During the drive of the first semiconductor laser device, the light beam of the first wavelength is produced in the first optical waveguide, and simultaneously emitted from the light beam emitting facet. Heat generated at the time around the first optical waveguide is transmitted to the support member, and dissipated through the support member.

Also, during the drive of the second semiconductor laser device, the light beam of the second wavelength is produced in the second optical waveguide, and emitted from the light beam emitting facet. Heat generated at the time around the second optical waveguide is transmitted to the support member by way of the insulating layer and the first semiconductor laser device, and dissipated through the support member. A region around the second optical waveguide on the light beam emitting facet side thereof generates a greater amount of heat than the remaining region of the second optical waveguide.

This allows heat that is intensively generated in the region around the second optical waveguide on the light beam emitting facet side thereof to be efficiently transmitted to the first semiconductor laser device via the first portion of the insulating layer having a high thermal conductive property.

Consequently, electrical isolation between the first and second semiconductor laser devices is ensured while the heat dissipation capability of a portion of the second semiconductor laser device is improved. This results in good heat dissipation capability of the semiconductor laser apparatus.

(10)

The first portion of the insulating layer may have a thickness smaller than that of the second portion. In this case, the thermal conductive property of the first portion of the insulating layer is higher than that of the second portion thereof. Thus, the thermal conductive property of the first portion of the insulating layer can be easily made higher than that of the second portion thereof. Moreover, the thickness of the second portion greater than that of the first portion minimizes the decrease in overall insulation of the insulating layer, even if the thickness of the first portion is small.

(11)

The first portion of the insulating layer may include a first material having a first thermal conductivity, and the second portion of the insulating layer may include a second material having a second thermal conductivity lower than the first thermal conductive property of the first portion. In this way, the thermal conductive property of the first portion of the insulating layer can be easily made higher than that of the second portion thereof. Moreover, by selecting the first material, the decrease in overall insulation of the insulating layer can be minimized.

In addition, by selecting the first material and the second material, the thickness of the first portion and the thickness of the second portion can be made substantially equal. This facilitates fabrication of the semiconductor laser apparatus.

(12)

According to still another aspect of the present invention, a semiconductor laser apparatus comprises a conductive support member; a conductive layer; a first semiconductor laser device having a first semiconductor layer formed on a first substrate, a first electrode formed on the first semiconductor layer, and a second electrode formed on the first substrate, and emitting a light beam of a first wavelength; and a second semiconductor laser device having a second semiconductor layer formed on a second substrate, a third electrode formed on the second semiconductor layer, and a fourth electrode formed on the second substrate, and emitting a light beam of a second wavelength, the first semiconductor layer including an insulating first current blocking layer that blocks a current that flows from the first electrode to the second electrode, the second semiconductor layer including a second current blocking layer that blocks a current that flows from the third electrode to the fourth electrode, the conductive layer being formed on a predetermined region of the first current blocking layer so as to be isolated from the first electrode, the first semiconductor laser device being provided on the support member so that the second electrode is positioned on the support member side, the second semiconductor laser device being provided on the conductive layer so that the third electrode is electrically connected to the conductive layer, the fourth electrode being electrically connected with the second electrode, a value of capacitance induced in the first current blocking layer immediately below the conductive layer being not more than a value of capacitance induced in the second current blocking layer.

When a voltage is applied between the first electrode and the second electrode in the semiconductor laser apparatus, the first semiconductor laser device emits the light beam of the first wavelength. Also, when a voltage is applied between the third electrode that is electrically connected with the conductive layer on the predetermined region of the first current blocking layer and the fourth electrode, the second semiconductor laser device emits the light beam of the second wavelength.

During the drive of the second semiconductor laser device, the insulating first and second current blocking layers function as dielectrics. Note that the value of capacitance induced in the first current blocking layer is not more than the value of capacitance induced in the second current blocking layer. Such a small capacitance value of the first current blocking layer sufficiently reduces the decrease in the cutoff frequency of the second semiconductor laser device due to the influence of the first current blocking layer. As a result, deterioration of the high frequency characteristics of the second semiconductor laser device due to the influence of the first current blocking layer is sufficiently reduced.

Moreover, the second and fourth electrodes are electrically connected. This allows the first and second semiconductor laser devices to be driven individually by applying voltages to the first and third electrodes, respectively. As a result, the drive voltage of each of the first and second semiconductor laser devices can be easily controlled.

As described above, the drive voltages can be easily controlled, and deterioration of the high frequency characteristics of the second semiconductor laser device due to the influence of the insulating layer can be sufficiently reduced.

In addition, a plurality of semiconductor laser apparatuses can be simultaneously fabricated by overlapping a wafer having a plurality of first semiconductor laser devices thereon with a wafer having a plurality of second semiconductor laser devices thereon. This improves the positioning accuracy of each of the first semiconductor laser devices and each of the second semiconductor laser devices. This results in improved positioning accuracy of the emission points of the first and second semiconductor laser devices.

Furthermore, the first semiconductor laser device and the second semiconductor laser device are disposed so that the first electrode and the third electrode are positioned opposite to each other. This brings the first and second semiconductor layers close to each other, thus allowing the emission points of the first and second semiconductor laser devices to approach each other.

(13)

The value of capacitance induced in the first current blocking layer may be not more than one-fifth the value of capacitance induced in the second current blocking layer. Such a very small capacitance value of the first current blocking layer significantly reduces the decrease in the cutoff frequency of each of the first and second semiconductor laser devices due to the influence of the first current blocking layer. As a result, deterioration of the high frequency characteristics of each of the first and second semiconductor laser device due to the influence of the first current blocking layer is sufficiently reduced.

The value of capacitance induced in the first current blocking layer may be not more than about 10 pF. A capacitance value of not more than about 10 pF for the first current blocking layer reduces the decrease in the cutoff frequency of each of the first and second semiconductor laser device due to the influence of the first current blocking layer. As a result, deterioration of the high frequency characteristics of each of the first and second semiconductor laser devices due to the influence of the first current blocking layer is sufficiently reduced.

(14)

The first semiconductor laser device may have a first optical waveguide, the second semiconductor laser device may have a second optical waveguide, and a first portion of the first current blocking layer immediately below the conductive layer that corresponds to at least a region of the second optical waveguide on a light beam emitting facet side thereof has a thermal conductive property higher than that of a second portion of the first current blocking layer immediately below the conductive layer except the first portion thereof.

Where light is emitted from both facets of the second optical waveguide, the light beam emitting facet refers to a facet that emits a greater amount of light than the other facet.

During the drive of the first semiconductor laser device, the light beam of the first wavelength is produced in the first optical waveguide, and simultaneously emitted from the light beam emitting facet. Heat generated at the time around the first optical waveguide is transmitted to the support member, and dissipated through the support member.

Also, during the drive of the second semiconductor laser device, the light beam of the second wavelength is produced in the second optical waveguide, and emitted from the light beam emitting facet. Heat generated at the time around the second optical waveguide is transmitted to the support member by way of the first semiconductor laser device that includes the first current blocking layer immediately below the conductive layer, and dissipated through the support member. A region around the second optical waveguide on the light beam emitting facet side thereof generates a greater amount of heat than the remaining region of the second optical waveguide.

This allows heat that is intensively generated in the region around the second optical waveguide on the light beam emitting facet side thereof to be efficiently transmitted to the first semiconductor laser device via the first portion of the first current blocking layer having a high thermal conductive property immediately below the conductive layer.

Consequently, electrical isolation between the first and second semiconductor laser devices is ensured while the heat dissipation capability of a portion of the second semiconductor laser device is improved. This results in good heat dissipation capability of the semiconductor laser apparatus.

(15)

The first portion of the first current blocking layer immediately below the conductive layer may have a thickness smaller than that of the second portion. In this case, the thermal conductive property of the first portion of the first current blocking layer immediately below the conductive layer is higher than that of the second portion thereof. In this way, the thermal conductive property of the first portion of the first current blocking layer immediately below the conductive layer can be easily made higher than that of the second portion thereof. Moreover, the thickness of the second portion greater than that of the first portion minimizes the decrease in overall insulation of the first current blocking layer immediately below the conductive layer, even if the thickness of the first portion is small.

(16)

The first portion of the first current blocking layer immediately below the conductive layer may include a first material having a first thermal conductivity, and the second portion of the first current blocking layer immediately below the conductive layer may include a second material having a second thermal conductivity lower than the first thermal conductivity of the first portion. In this way, the thermal conductive property of the first portion of the first current blocking layer immediately below the conductive layer can be easily made higher than that of the second portion thereof. Moreover, by selecting the first material, the decrease in overall insulation of the first current blocking layer immediately below the conductive layer can be minimized.

In addition, by selecting the first material and the second material, the thickness of the first portion and the thickness of the second portion can be made substantially equal. This facilitates fabrication of the semiconductor laser apparatus.

(17), (20), (23)

The semiconductor laser apparatus may further comprise a sub-substrate having a predetermined thickness that is inserted between the support member and the first semiconductor laser device. This allows adjustments to be made to the positions of the emission points of the first and second semiconductor laser devices.

(18), (21), (24)

The first semiconductor laser device may include a nitride-based semiconductor. Nitride-semiconductors have high thermal conductivities. This improves the heat dissipation capability of the first semiconductor laser device. In addition, the second semiconductor laser device is stacked on the first semiconductor laser device, so that the heat dissipation capability of the second semiconductor laser device is also improved.

(19), (22), (25)

The second electrode and the fourth electrode may be electrically connected to each other while being electrically isolated from the support member. This allows voltages to be applied to the second and fourth electrodes.

(Others)

The semiconductor laser apparatus may further comprise a conductive fusion layer that is formed between the second semiconductor laser device and the conductive layer. This allows a gap in the joint of the second semiconductor laser device and the conductive layer to be filled with the fusion layer. This prevents the generation of voids between the second semiconductor laser device and the conductive layer.

As a result, during the drive of the second semiconductor laser device, heat generated from the second semiconductor laser device is efficiently transmitted to the first semiconductor laser device via the fusion layer, and dissipated through the support member. This further improves the heat dissipation capability of the semiconductor laser apparatus.

The first portion may be provided so as to extend from one facet of the second semiconductor laser device to another facet in parallel with the second optical waveguide. This allows heat generated from the second optical waveguide to be efficiently transmitted to the first semiconductor laser device and dissipated through the support member.

According to the semiconductor laser apparatus in the invention, the drive voltages can be easily controlled, and deterioration of the high frequency characteristics of each of the semiconductor laser devices due to the influence of the insulating layer can be sufficiently reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram showing electrical wiring of the semiconductor laser apparatus according to the first embodiment;

FIG. 6 is a graph showing the relationship between the value of capacitance induced in the insulating layer when driving the red semiconductor laser device in FIG. 2 and the thickness of the insulating layer;

FIG. 18 is a circuit diagram showing electrical wiring of the semiconductor laser apparatus according to the fourth embodiment;

FIG. 20 is a schematic top view showing the semiconductor laser apparatus according to the fifth embodiment with the cover thereof being removed;

FIG. 22 is a schematic front view showing a semiconductor laser apparatus according to a sixth embodiment with a cover thereof being removed;

FIGS. 38 (a) and 38 (b) are equivalent circuit diagrams for use in illustrating the insulating layer in FIG. 36 as a dielectric;

FIG. 46 is a schematic top view showing the semiconductor laser apparatus according to the eleventh embodiment with the cover thereof being removed;

DESCRIPTION OF THE PREFERRED EMBODIMENTS

Semiconductor laser apparatuses according to embodiments of the present invention will be described below.

1. First Embodiment

(1) Configuration and Connection of Semiconductor Laser Apparatus

A semiconductor laser apparatus according to a first embodiment comprises a first semiconductor laser device and a second semiconductor laser device. The first and second semiconductor laser devices emit laser beams having different wavelengths from each other.

In the specification, a semiconductor laser device that emits a blue-violet laser beam (wavelength: around 400 nm), hereinafter referred to as a blue-violet semiconductor laser device, is used as the first semiconductor laser device.

A semiconductor laser device that emits a red laser beam (wavelength: around 658 nm), hereinafter referred to as a red semiconductor laser device, is used as the second semiconductor laser device.

Figure 1:
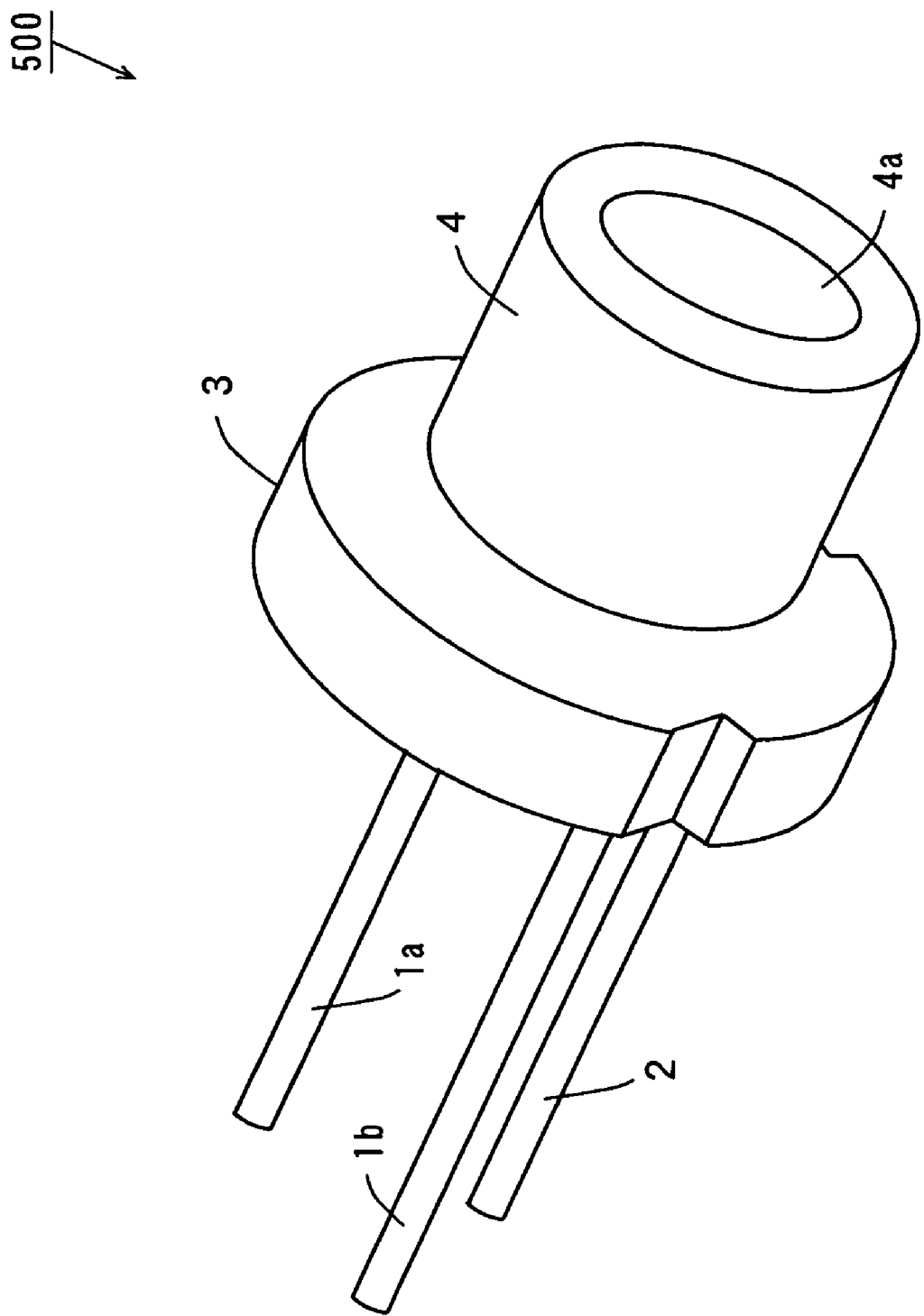
FIG. 1 is an external perspective view showing a semiconductor laser apparatus according to a first embodiment.

FIG. 1 is an external perspective view showing the semiconductor laser apparatus according to the first embodiment.

The semiconductor laser apparatus 500 in FIG. 1 comprises a conductive package body 3, power supply pins 1a, 1b, 2, and a cover 4.

A plurality of semiconductor laser devices described below are mounted on the package body 3, which are sealed with the cover 4. The cover 4 is provided with an extraction window 4a. The extraction window 4a is made of a material that transmits laser beams. The power supply pin 2 is mechanically and electrically connected to the package body 3. The power supply pin 2 is used as a grounding terminal.

The semiconductor laser apparatus 500 will be described in detail. The "front" as mentioned below defines the direction in which the semiconductor laser devices emit laser beams.

Figure 2:
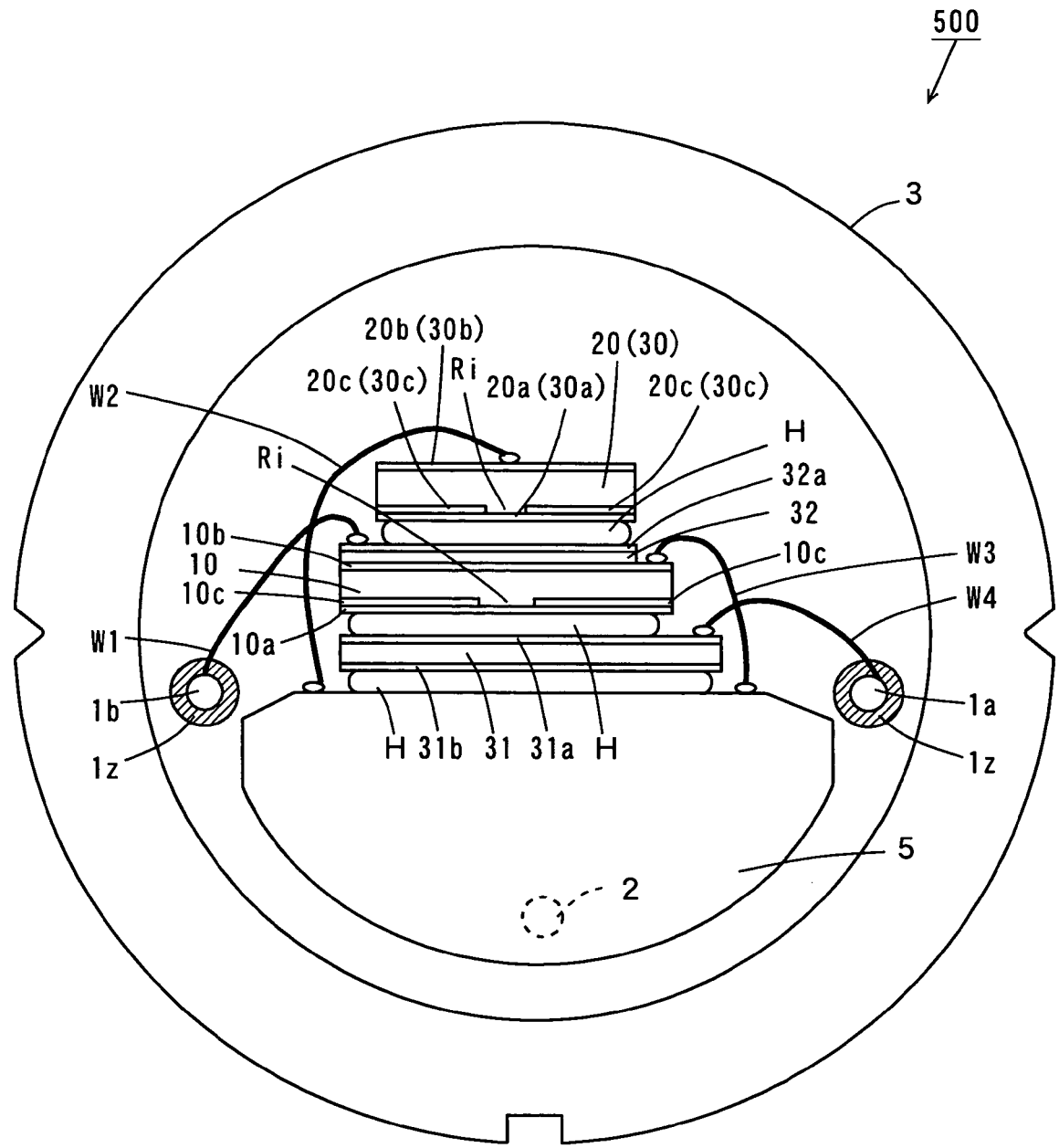
FIG. 2 is a schematic front view showing the semiconductor laser apparatus in FIG. 1 with a cover thereof being removed.
Figure 3:
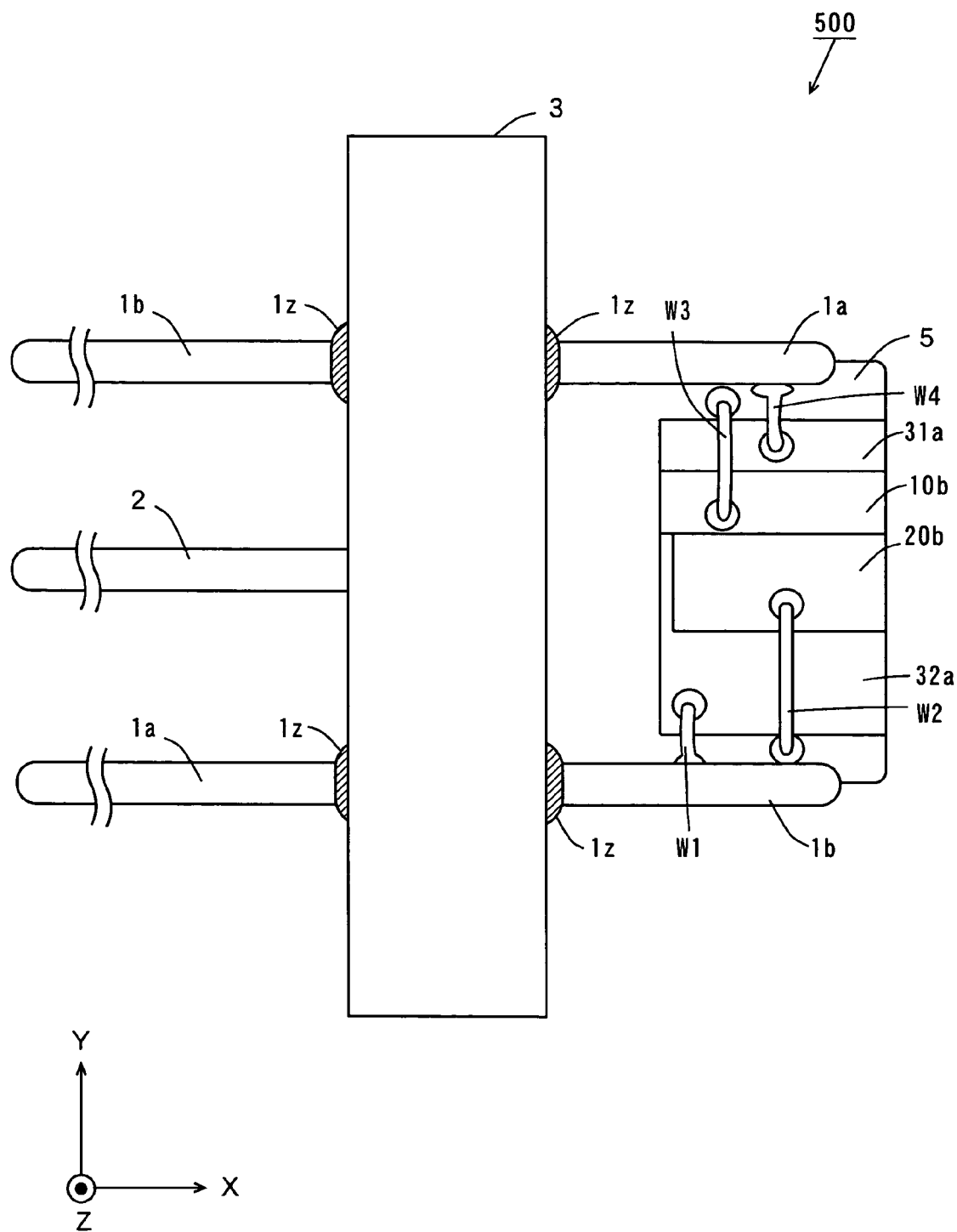
FIG. 3 is a schematic top view showing the semiconductor laser apparatus in FIG. 1 with the cover thereof being removed.

FIG. 2 is a schematic front view showing the semiconductor laser apparatus 500 in FIG. 1 with the cover 4 being removed, and FIG. 3 is a schematic top view showing the semiconductor laser apparatus 500 in FIG. 1 with the cover 4 being removed.

As shown in FIG. 2 and FIG. 3, X direction defines the direction in which a blue-violet semiconductor laser device 10 and a red semiconductor laser device 20 emit laser beams, and Y and Z directions define the two directions perpendicular to each other in a plane vertical to the X direction.

As shown in FIG. 2, a conductive fusion layer H is formed on a conductive support member 5 integral with the package body 3. The support member 5 is made of a material having good electrical conductivity and good thermal conductivity, and the fusion layer H is made of AuSn (gold-tin).

An insulating sub-substrate 31 having a conductive layer 31a on its upper surface and a conductive layer 31b on its lower surface is provided on the fusion layer H. The sub-substrate 31 is made of AlN (aluminum nitride). The sub-substrate 31 has a thickness of, e.g., about 200 μm.

The blue-violet semiconductor laser device 10 is bonded on the conductive layer 31a of the sub-substrate 31 through a fusion layer H made of AuSn.

The blue-violet semiconductor laser device 10 has a laminated structure that includes a p-side pad electrode 10a, an n-side pad electrode 10b, and a current blocking layer 10c. The blue-violet semiconductor laser device 10 is disposed so that the p-side pad electrode 10a lies on the support member side.

In FIG. 2, the n-side pad electrode 10b is positioned on an upper surface of the blue-violet semiconductor laser device 10, and the p-side pad electrode 10a is positioned on a lower surface thereof. The blue-violet semiconductor laser device also has a ridge portion Ri on the p-side pad electrode 10a, and a current blocking layer 10c on the sides of the ridge portion Ri. The blue-violet semiconductor laser device 10 will be described in detail below.

An insulating layer 32 made of SiO$_2$ (silicon oxide) is provided on the n-side pad electrode 10b of the blue-violet semiconductor device 10. The thickness of the insulating layer 32 is herein defined as t32. The thickness t32 of the insulating layer 32 will be described in detail below.

A conductive layer 32a containing Au is formed on the insulating layer 32. The red semiconductor laser device 20 is bonded on the conductive layer 32a through a fusion layer H of AuSn.

The red semiconductor laser device 20 has a laminated structure that includes a p-side pad electrode 20a, an n-side pad electrode 20b, and a first current blocking layer 20c. The red semiconductor laser device 20 is disposed so that the p-side pad electrode 20a lies on the support member 5 side.

In FIG. 2, the n-side pad electrode 20b is positioned on an upper surface of the red semiconductor laser device 20, and the p-side pad electrode 20a is positioned on a lower surface thereof. The red semiconductor laser device 20 has a ridge portion Ri on the p-side pad electrode 20a, and a first current blocking layer 20c on the sides of the ridge portion Ri. The red semiconductor laser device 20 will be described in detail below.

The blue-violet semiconductor laser device 10 is positioned on a central portion of the extraction window 4a of the cover 4 (see FIG. 1).

As shown in FIG. 2 and FIG. 3, each of the power supply pins 1a, 1b is electrically isolated from the package body 3 through an insulating ring 1z. The power supply pin 1a is electrically connected to the conductive layer 31a on the sub-substrate 31 through a wire W4. The power supply pin 1b is electrically connected to the conductive layer 32a on the insulating layer 32 through a wire W1.

On the other hand, an exposed portion of the upper surface of the support member 5 is electrically connected to the n-side pad electrode 10b of the blue-violet semiconductor laser device 10 through a wire W3, and an exposed portion of the upper surface of the support member 5 is electrically connected to the n-side pad electrode 20b of the red semiconductor laser device 20 through a wire W2. This provides for an electrical connection of the power supply pin 2 to the n-side pad electrode 10b of the blue-violet semiconductor laser device 10 and the n-side pad electrode 20b of the red semiconductor laser device 20. That is, a common cathode connection of the blue-violet semiconductor laser device 10 and the red semiconductor laser device 20 is achieved.

When a voltage is applied between the power supply pins 1a and 2, the blue-violet semiconductor laser device 10 can be driven individually. When a voltage is applied between the power supply pins 1b and 2, the red semiconductor laser device can be drive individually.

FIG. 4 is a circuit diagram showing electrical wiring of the semiconductor laser apparatus 500 according to the first embodiment.

As described above, the power supply pin 2 is electrically connected to the support member 5, and also electrically connected to the n-side pad electrode 10b of the blue-violet semiconductor laser device 10 and the n-side pad electrode 20b of the red semiconductor laser device 20.

On the other hand, the p-side pad electrode 10a of the blue-violet semiconductor laser device 10 and the p-side pad electrode 20a of the red semiconductor laser device 20 are electrically isolated from the support member 5, i.e., from the power supply pin 2.

In the semiconductor laser apparatus 500 according to the first embodiment, when a voltage higher than the ground potential is applied to either of the power supply pins 1a, 1b, the blue-violet semiconductor laser device 10 or the red semiconductor laser device 20 can be driven individually. As a result, the drive voltage of each of the semiconductor laser devices can be easily controlled.

(2) Functions of Sub-Substrate and Insulating Layer as Dielectrics and Effects Thereof By the way, the aforementioned semiconductor laser apparatus 500 is mounted in, e.g., an optical pickup apparatus. Optical pickup apparatuses, in general, are driven by alternating voltage. That is, the blue-violet semiconductor laser device 10 and the red semiconductor laser device 20 are driven by alternating voltage. In this case, each of the sub-substrate 31 and the insulating layer 32 in FIG. 2 functions as a dielectric.

Figure 5:
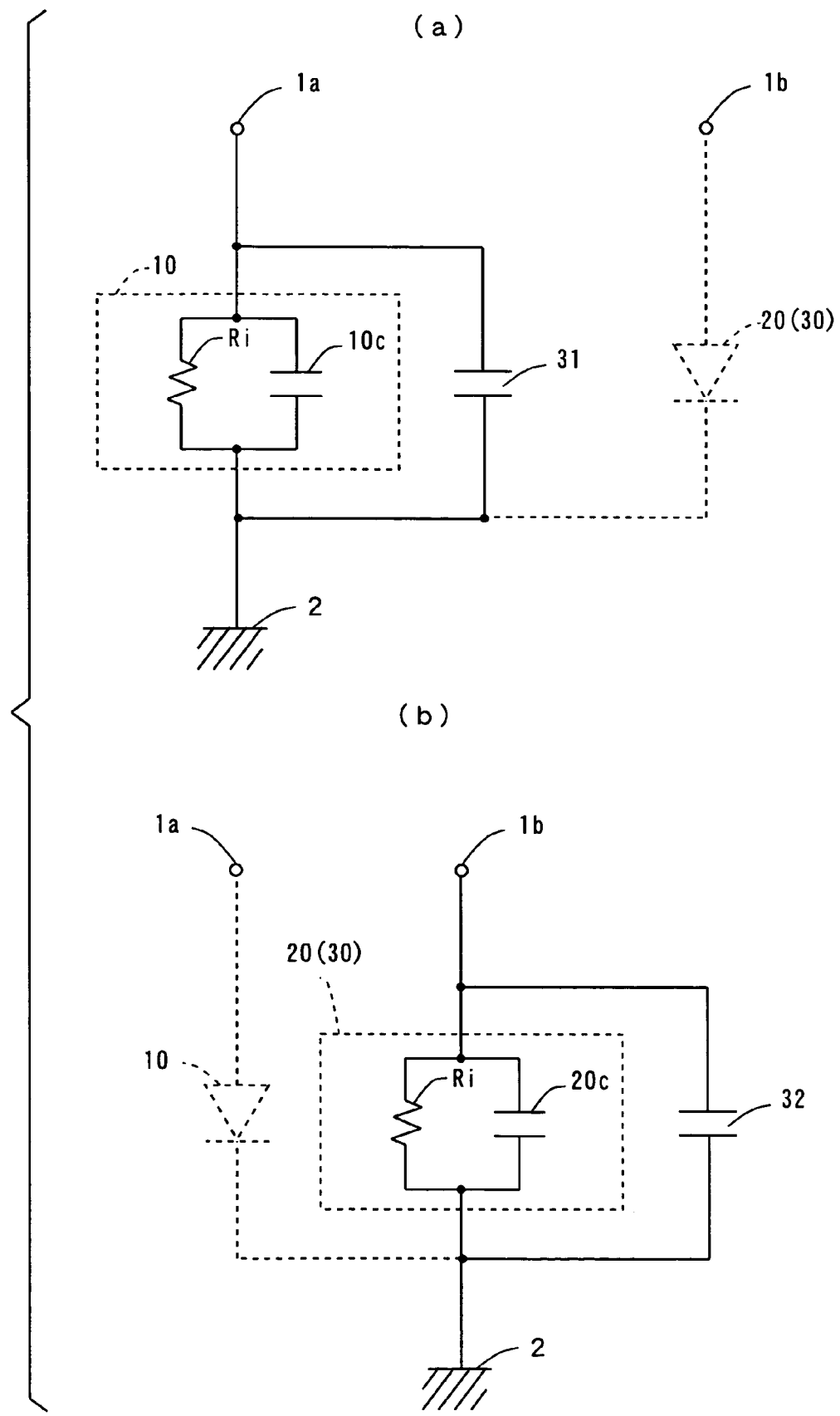
FIGS. 5 (a) and 5 (b) are equivalent circuit diagrams for use in illustrating the functions of the sub-substrate and the insulating layer in FIG. 2 as dielectrics.

FIG. 5 is an equivalent circuit diagram for use in illustrating the function of each of the sub-substrate 31 and the insulating layer 32 in FIG. 2 as a dielectric.

FIG. 5 (a) shows the equivalent circuit diagram in the case of driving the blue-violet semiconductor laser device 10, and FIG. 5 (b) shows the equivalent circuit diagram in the case of driving the red semiconductor laser device 20.

When the blue-violet semiconductor laser device 10 is driven by alternating voltage, the blue-violet semiconductor laser device 10 is represented by FIG. 5 (a), where the ridge portion Ri is a resistance, and the current blocking layer 10c is a dielectric. In this case, the insulating sub-substrate 31 functions as a dielectric that is connected in parallel with the blue-violet semiconductor laser device 10.

The value of capacitance induced in an insulating layer is generally given by the equation shown below:

$$C1 = \in_s \cdot \in_0 \cdot S/d \qquad (1)$$

where C1 is the value of capacitance induced in the insulating layer; $\in_s$ is the relative dielectric constant of the insulating layer; $\in_0$ is the dielectric constant of vacuum; S is the area of the insulating layer; and d is the thickness of the insulating layer.

In the first embodiment, the current blocking layer 10c as the insulating layer has a thickness of 0.5 μm (in the Z direction). The blue-violet semiconductor laser device 10 has a width of, e.g., about 350 μm (in the Y direction) and a length of, e.g., about 600 μm (in the X direction).

The relative dielectric constant of the current blocking layer 10c of SiO$_2$ and the submount 31 of AlN are four and nine respectively, and the vacuum dielectric constant is 8.854×10$^{-12}$ F/m.

The width of the ridge portion Ri (in the Y direction) formed in the blue-violet semiconductor laser device 10 is much smaller than the width of the blue-violet semiconductor laser device 10. Thus, the current blocking layer 10c is set to be 0.5 μm thick, 350 μm wide, and 600 μm long. Based on the equation (1), the value of capacitance induced in this current blocking current blocking layer 10c is about 15 pF.

On the other hand, the sub-substrate 31 has a thickness of about 200 μm, a width of about 450 μm (in the Y direction), and a length of about 600 μm (in the X direction). Thus, the value of capacitance induced in the sub-substrate 31 when driving the blue-violet semiconductor laser device 10 is about 100 fF, based on the equation (1).

As described above, in the first embodiment, the value of capacitance induced in the sub-substrate 31 is much smaller than the value of capacitance induced in the current blocking layer 10c of the blue-violet semiconductor laser device 10.

Therefore, when driving only the blue-violet semiconductor laser device 10, the sum of the values of capacitances induced in the sub-substrate 31 and the current blocking layer 10c (hereinafter referred to as a value of effective capacitance) is almost equal to the value of capacitance induced in the current blocking layer 10c.

The cutoff frequency of the blue-violet semiconductor laser device 10 is determined based on the value of effective capacitance. The higher the cutoff frequency, the better the high frequency characteristics during the drive of a semiconductor laser device.

The cutoff frequency of a semiconductor laser device is simply represented by the equation shown below:

$$fT = \frac{1}{2\pi\sqrt{LC}} \quad (2)$$

where fT is the cutoff frequency of the semiconductor laser device; L is the inductance of the semiconductor laser device; and C is the value of effective capacitance during the drive of the semiconductor laser device.

In this case, as represented by the equation (2), the cutoff frequency of the blue-violet semiconductor laser device 10 is inversely proportional to the half power of the value of effective capacitance. Accordingly, the smaller the value of effective capacitance of the blue-violet semiconductor laser device 10, the higher the cutoff frequency thereof.

When the value of capacitance induced in the sub-substrate 31 is much smaller than that induced in the current blocking layer 10c as described above, the decrease in the cutoff frequency due to the influence of the sub-substrate 31 is sufficiently reduced. As a result, deterioration in the high frequency characteristics of the blue-violet semiconductor laser device 10 due to the influence of the sub-substrate 31 is sufficiently suppressed.

When, on the other hand, driving only the red semiconductor laser device 20 by alternating voltage, the red semiconductor laser device 20 is represented by FIG. 5 (b), where the ridge portion Ri is a resistance, and the first current blocking layer 20c is a dielectric. In this case, the insulating layer 32 functions as a dielectric that is connected in parallel with the red semiconductor laser device 20.

In the first embodiment, the first current blocking layer 20c that serves as a depletion layer has a thickness of 0.5 μm (in the Z direction). The red semiconductor laser device 20 is about 200 μm wide (in the Y direction), and about 600 μm long (in the X direction). Note that the first current blocking layer 20c serving as the depletion layer is made of AlInP.

The width of the ridge portion Ri (in the Y direction) formed in the red semiconductor laser device 20 is much smaller than the width of the red semiconductor laser device 20. Thus, the first current blocking layer 20c is set to 0.5 μm thick, 200 μm wide, and 600 μm long. The relative dielectric constant of AlInP is about 13. In this case, the value of capacitance induced in the first current blocking layer 20c is about 28 pF, based on the equation (1).

Note that the thickness t32 of the insulating layer 32 is set so that the value of capacitance induced in the insulating layer 32 is not more than the value of capacitance induced in the first current blocking layer 20c.

For example, when the insulating layer 32 is about 300 μm wide (in the Y direction) and about 600 μm long (in the X direction), the value of capacitance induced in the insulating layer 32 when driving the red semiconductor laser device 20 is determined based on the thickness t32 and the equation (1) shown above. That is, the value of capacitance induced in the insulating layer 32 has the relationship inversely proportional to the thickness t32.

FIG. 6 is a graph showing the relationship between the value of capacitance induced in the insulating layer 32 when driving the red semiconductor laser device 20 in FIG. 2 and the thickness of the insulating layer 32. In FIG. 6, the ordinate represents the value of capacitance, and the abscissa represents the thickness t32 of the insulating layer 32.

According to FIG. 6, in order to provide a value of capacitance induced in the insulating layer 32 not more than the value of capacitance induced in the first current blocking layer 20c of the red semiconductor laser device 20, it is necessary to set the thickness t32 of the insulating layer 32 to not less than 0.23 μm.

By setting the thickness t32 of the insulating layer 32 to not less than 0.23 μm, the value of capacitance induced in the insulating layer 32 becomes not more than the value of capacitance induced in the first current blocking layer 20c of the red semiconductor laser device 20.

The value of effective capacitance in this case corresponds to the sum of the value of capacitance induced in the first current blocking layer 20c and the value of capacitance induced in the insulating layer 32, i.e., not more than twice the value of capacitance induced in the first current blocking layer 20c.

Based on the equation (2), the cutoff frequency of the red semiconductor laser device 20 is inversely proportional to the half power of the value of effective capacitance. As a result, when the value of capacitance induced in the insulating layer 32 is not more than the value of capacitance induced in the first current blocking layer 20c, the decrease in the cutoff frequency of the red semiconductor laser device 20 can be suppressed to a maximum of about 30% of the cutoff frequency thereof without the insulating layer 32.

In this way, by setting the thickness of the insulating layer 32 so that the value of capacitance induced in the insulating layer 32 is not more than the value of capacitance induced in the first current blocking layer 20c, the decrease in the cutoff frequency of the red semiconductor laser red semiconductor laser device 20 due to the influence of the insulating layer 32 is sufficiently reduced. That is, deterioration in the high frequency characteristics of the red semiconductor laser device 20 is sufficiently suppressed.

Now, the configuration of each of the blue-violet semiconductor laser device 10 and the red semiconductor laser device 20 is described in detail.

(3) Details of Configuration of Blue-Violet Semiconductor Laser Device

Figure 7:
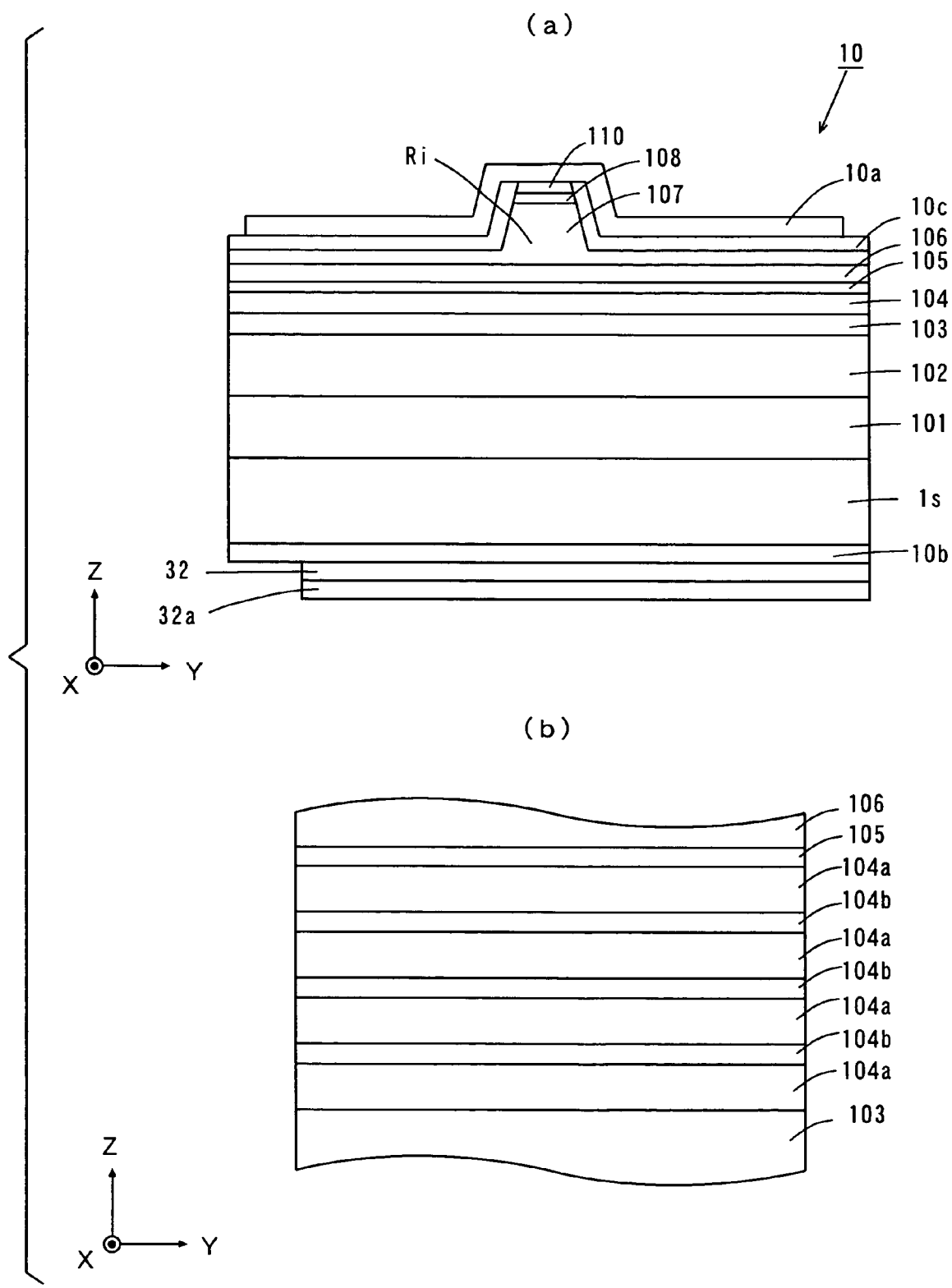
FIGS. 7 (a) and 7 (b) are schematic cross sections for use in illustrating details of the configuration of the blue-violet semiconductor laser device.

Referring to FIGS. 7 (a) and 7 (b), the configuration of the blue-violet semiconductor laser device 10 is described in detail along with the fabrication method thereof.

FIGS. 7 (a) and 7 (b) are schematic cross sections for use in illustrating details of the configuration of the blue-violet semiconductor laser device 10. The X, Y, and Z directions are defined below similarly to FIG. 2 and FIG. 3.

In the fabrication of the blue-violet semiconductor laser device 10, a semiconductor layer having a laminated structure is formed on an n-GaN substrate 1s. The n-GaN substrate 1s includes a (0001) Ga surface as the front surface, and has a thickness of about 100 μm. The n-GaN substrate 1s is also doped with O (oxygen).

As shown in FIG. 7 (a), the semiconductor layer having a lamianted structure is formed on the n-GaN substrate is, which includes, in order, an n-GaN layer 101, an n-AlGaN cladding layer 102, an n-GaN optical guide layer 103, a MQW (multi-quantum well) active layer 104, an undoped AlGaN cap layer 105, an undoped GaN optical guide layer 106, a p-AlGaN cladding layer 107, and an undoped GaInN contact layer 108. Each of these layers is formed by, e.g., MOCVD (Metal Organic Chemical Vapor Deposition).

As shown in FIG. 7 (b), the MQW active layer 104 has a structure that includes an alternate lamination of four undoped GaInN barrier layers 104a and three undoped GaInN well layers 104b.

For example, the n-AlGaN cladding layer 102 has an Al composition of 0.15 and a Ga composition of 0.85. The n-GaN layer 101 and the n-AlGaN cladding layer 102 are doped with Si.

The undoped GaInN barrier layers 104a have a Ga composition of 0.95 and an In composition of 0.05. The undoped GaInN well layers 104b have a Ga composition of 0.90 and an In composition of 0.10. The p-AlGaN cap layer 105 has an Al composition of 0.30 and a Ga composition of 0.70.

The p-AlGaN cladding layer 107 has an Al composition of 0.15 and a Ga composition of 0.85. The p-AlGaN cladding layer 107 is doped with Mg. The undoped GaInN contact layer 108 has a Ga composition of 0.95 and an In composition of 0.05.

A strip-like ridge portion Ri that extends in the X direction is formed in the p-AlGaN cladding layer 107 in the aforementioned semiconductor layer. The ridge portion Ri in the p-AlGaN cladding layer 107 has a width of about 1.5 μm.

The undoped GaInN contact layer 108 is formed on an upper surface of the ridge portion Ri in the p-AlGaN cladding layer 107. On top of the undoped GaInN contact layer 108, a p-electrode 110 made of Pd/Pt/Au is formed.

A current blocking layer 10c made of $SiO_2$ is formed on a flat upper surface of the p-AlGaN cladding layer 107, side surfaces of the ridge portion Ri, side surfaces of the undoped GaInN contact layer 108, and upper and side surfaces of the p-electrode 110. The current blocking current blocking layer 10c formed on the p-electrode 110 is etched away. Then, a p-side pad electrode 10a is formed by sputtering, vacuum deposition, or electron beam deposition, so as to cover the p-electrode 110 and the upper surface of the current blocking layer 10c exposed outside.

In this way, the semiconductor layer having the laminated structure is formed on one surface of the n-GaN substrate 1s. An n-side pad electrode 10b made of Ti/Pt/Au is also formed on the other surface of the n-GaN substrate is. Further, an insulating layer 32 made of $SiO_2$ is formed on a portion of the n-side pad electrode 10b, followed by the formation of a conductive layer 32a containing Au on the insulating layer 32.

As described above, the current blocking layer 10c of $SiO_2$ in the first embodiment has a thickness of, e.g., 0.5 μm.

The blue-violet semiconductor laser device 10 has a blue-violet beam emission point situated in the MQW active layer below the ridge portion Ri. Note that the MQW active layer 104 corresponds to the p-n junction surface of the blue-violet semiconductor laser device 10.

(4) Details of Configuration of Red Semiconductor Laser Device

Figure 8:
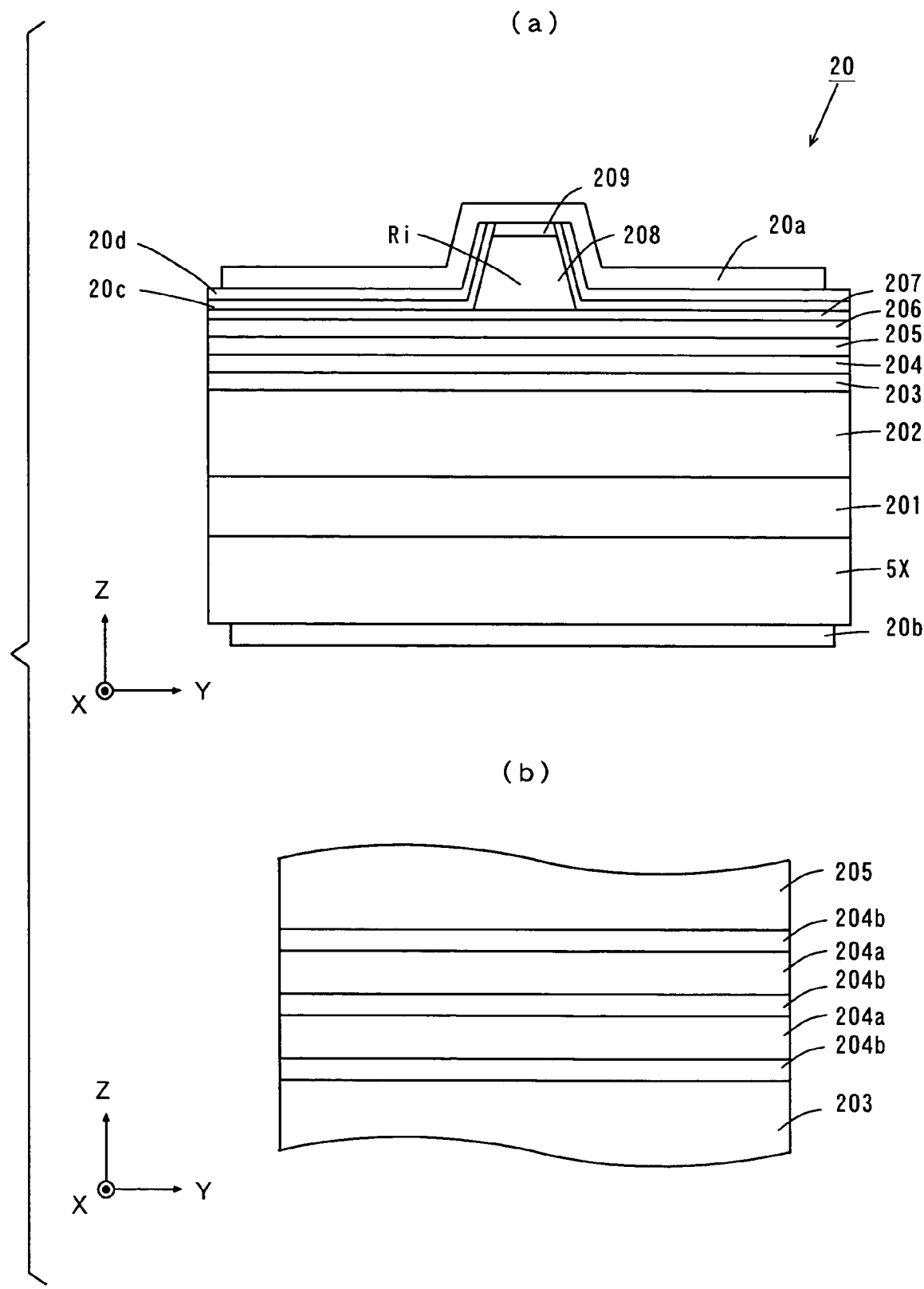
FIGS. 8 (a) and 8 (b) are schematic cross sections for use in illustrating details of the configuration of the red semiconductor laser device.

Referring to FIGS. 8 (a) and 8 (b), the configuration of the red semiconductor laser device 20 is described along with the fabrication method thereof.

FIGS. 8 (a) and 8 (b) are schematic cross sections for use in illustrating details of the configuration of the red semiconductor laser device 20.

In the fabrication of the red semiconductor laser device 20, a semiconductor layer having a laminated structure is formed on an n-GaAs substrate 5X. The n-GaAs substrate 5X is doped with Si.

As shown in FIG. 8 (a), the semiconductor layer having a laminated structure is formed on the n-GaAs substrate 5X, which includes, in order, an n-GaAs layer 201, an n-AlGaInP cladding layer 202, an undoped AlGaInP optical guide layer 203, a MQW (multi-quantum well) active layer 204, an undoped AlGaInP optical guide layer 205, a p-AlGaInP first cladding layer 206, a p-GaInP etching stop layer 207, a p-AlGaInP second cladding layer 208, and a p-contact layer 209. Each of these layers is formed by, e.g., MOCVD (Metal Organic Chemical Vapor Deposition).

As shown in FIG. 8 (b), the MQW active layer 204 has a structure that includes an alternate lamination of two undoped AlGaInP barrier layers 204a and three undoped GaInP well layers 204b.

For example, the n-AlGaInP cladding layer 202 has an Al composition of 0.70, a Ga composition of 0.30, an In composition of 0.50, and a P composition of 0.50. The n-GaAs layer 201 and the n-AlGaInP cladding layer 202 are doped with Si.

The undoped AlGaInP optical guide layer 203 has an Al composition of 0.50, a Ga composition of 0.50, an In composition of 0.50, and a P composition of 0.50.

The undoped AlGaInP barrier layers 204a have an Al composition of 0.50, a Ga composition of 0.50, an In composition of 0.50, and a P composition of 0.50. The undoped GaInP well layers 204b have an In composition of 0.50 and a Ga composition of 0.50. The undoped AlGaInP optical guide layer 205 has an Al composition of 0.50, a Ga composition of 0.50, an In composition of 0.50, and a P composition of 0.50.

The p-AlGaInP first cladding layer 206 has an Al composition of 0.70, a Ga composition of 0.30, an In composition of 0.50, and a P composition of 0.50. The p-GaInP etching stop layer 207 has an In composition of 0.50 and a Ga composition of 0.50.

The p-AlGaInP second cladding layer 208 has an Al composition of 0.70, a Ga composition of 0.30, an In composition of 0.50, and a P composition of 0.50.

The p-contact layer 209 has a laminated structure of a p-GaInP layer and a p-GaAs layer. The p-GaInP layer has a Ga composition of 0.5 and an In composition of 0.5.

Note that the composition of the aforementioned AlGaInP-based materials is represented by the general formula; $(Al_aGa_b)_{0.5}In_cP_d$, where a is the Al composition, b is the Ga composition, c is the In composition, and d is the P composition.

Each of the p-AlGaInP first cladding layer 206, p-GaInP etching stop layer 207, p-AlGaInP second cladding layer 208, and p-contact layer 209 consist of p-GaInP and p-GaAs is doped with Zn.

The p-AlGaInP second cladding layer 208 and the p-contact layer 209 on the p-GaInP etching stop layer 207 are etched away except particular portions thereof (central portions).

Thus, the p-AlGaInP second cladding layer 208 and the p-contact layer 209 in the aforementioned semiconductor layer form a strip-like ridge portion Ri that extends in the X-direction. The ridge portion formed of the p-AlGaInP second cladding layer 208 and the p-contact layer 209 has a width of about 2.5 μm.

A first current blocking layer 20c having a thickness of about 0.5 µm and a second current blocking layer 20d having a thickness of about 0.3 µm are selectively formed in order on an upper surface of the p-GaInP etching stop layer 207, side surfaces of the p-AlGaInP second cladding layer 208, and side surfaces of the p-contact layer 209. Then, a p-side pad electrode 20a made of Cr/Au is formed by sputtering, vacuum evaporation, or electron beam evaporation, so as to cover an upper surface of the p-contact layer 209 and an upper surface of the second current blocking layer 20d exposed outside.

Note that the first current blocking layer 20c, made of undoped AlInP, serves as a depletion layer. The second current blocking layer 20d is made of n-GaAs.

In this way, the semiconductor layer having the laminated structure is formed on one surface of the n-GaAs substrate. An n-side pad electrode 20b made of AuGe/Ni/Au is also formed on the other side of the n-GaAs substrate 5X.

The red semiconductor laser device 20 has a red beam emission point situated in the MQW active layer 204 below the ridge portion Ri. The MQW active layer 204 corresponds to the p-n junction surface of the red semiconductor laser device 20.

In the aforementioned semiconductor laser apparatus 500 according to the first embodiment, a semiconductor laser device that emits an infrared laser beam (wavelength: around 790 nm), hereinafter referred to as an infrared semiconductor laser device, may alternatively be used as the second semiconductor laser device. In this case, as indicated by the parentheses in FIG. 2, FIG. 4, and FIG. 5, a p-side pad electrode of the infrared semiconductor laser device 30 is bonded on the n-side pad electrode 10b of the blue-violet semiconductor laser device 10.

(5) Details of Configuration Of Infrared Semiconductor Laser Device

Figure 9:
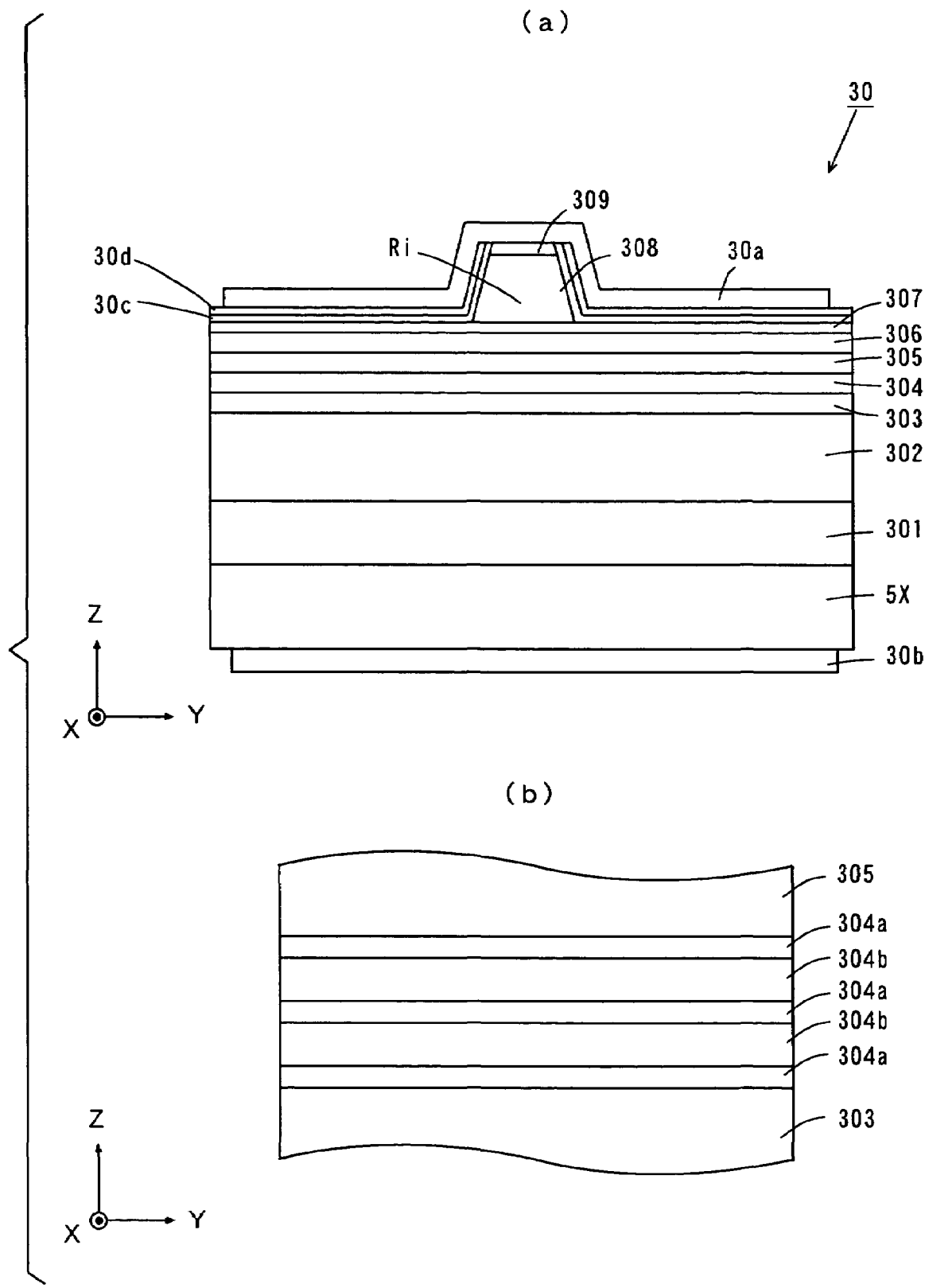
FIGS. 9 (a) and 9 (b) are schematic cross sections for use in illustrating details of the configuration of the infrared semiconductor laser device.

Referring to FIGS. 9 (a) and 9 (b), the configuration of the infrared semiconductor laser device 30 is described in detail along with the fabrication method thereof.

FIGS. 9 (a) and 9 (b) are schematic cross sections for use in illustrating details of the configuration of the infrared semiconductor laser device 30. In fabrication of the infrared semiconductor laser device 30, a semiconductor layer having a laminated structure is formed on an n-GaAs substrate 5X. The n-GaAs substrate 5X is doped with Si.

As shown in FIG. 9 (a), the semiconductor layer having a laminated structure is formed on the n-GaAs substrate 5X, which includes, in order, an n-GaAs layer 301, an n-AlGaAs cladding layer 302, an undoped AlGaAs optical guide layer 303, a MQW (multi-quantum well) active layer 304, an undoped AlGaAs optical guide layer 305, a p-AlGaAs first cladding layer 306, a p-AlGaAs etching stop layer 307, a p-AlGaAs second cladding layer 308, and a p-GaAs contact layer 309. Each of these layers is formed by, e.g., MOCVD (Metal Organic Chemical Vapor Deposition).

As shown in FIG. 9 (b), the MQW active layer 304 has a structure that includes an alternate lamination of two undoped AlGaAs barrier layers 304a and three undoped AlGaAs well layers 304b.

For example, the n-AlGaAs cladding layer 302 has an Al composition of 0.45 and a Ga composition of 0.55. The n-GaAs layer 301 and the n-AlGaAs cladding layer 302 are doped with Si.

The undoped AlGaAs optical guide layer 303 has an Al composition of 0.35 and a Ga composition of 0.65. The undoped AlGaAs barrier layers 304a have an Al composition of 0.35 and a Ga composition of 0.65. The undoped AlGaAs well layers 304b have an Al composition of 0.10 and a Ga composition of 0.90. The undoped AlGaAs optical guide layer 305 has an Al composition of 0.35 and a Ga composition of 0.65.

The p-AlGaAs first cladding layer 306 has an Al composition of 0.45 and a Ga composition of 0.55. The p-AlGaAs etching stop layer 307 has an Al composition of 0.70 and a Ga composition of 0.30.

The p-AlGaAs second cladding layer 308 has an Al composition of 0.45 and a Ga composition of 0.55.

The p-AlGaAs first cladding layer 306, p-AlGaAs etching stop layer 307, p-AlGaAs second cladding layer 308, and p-GaAs contact layer 309 are doped with Zn.

The p-AlGaAs second cladding layer 308 formed on the p-AlGaAs etching stop layer 307 and the p-GaAs contact layer 309 formed on the p-AlGaAs second cladding layer 308 are etched away except a particular portion thereof (central portion).

Thus, the p-AlGaAs second cladding layer 308 and the p-GaAs contact layer 309 in the aforementioned semiconductor layer form a strip-like ridge portion Ri that extends in the X direction. The ridge portion Ri formed of the p-AlGaAs second cladding layer 308 and the p-GaAs contact layer 309 has a width of about 2.8 µm.

A first current blocking layer 30c having a thickness of about 0.5 µm and a second current blocking layer 30d having a thickness of about 0.3 µm are selectively formed in order on an upper surface of the p-AlGaAs etching stop layer 307, side surfaces of the p-AlGaAs second cladding layer 308, and side surfaces of the p-GaAs contact layer 309. Then, a p-side pad electrode 30a made of Cr/Au is formed by sputtering, vacuum evaporation, or electron beam evaporation, so as to cover an upper surface of the p-GaAs contact layer 309 and an upper surface of the second current blocking layer 30d exposed outside.

The first current blocking layer 30c, made of undoped AlGaAs, serves as a depletion layer. The second current blocking layer 20d is made of n-GaAs. The first current blocking layer 30c has an Al composition of 0.65 and a Ga composition of 0.35. The relative dielectric constant of the first current blocking layer 30c is about 13.

In this way, the semiconductor layer having the laminated structure is formed on one surface of the n-GaAs substrate 5X. An n-side pad electrode 30b made of AuGe/Ni/Au is also formed on the other side of the n-GaAs substrate 5X.

The infrared semiconductor laser device 30 has an infrared beam emission point situated in the MQW active layer 304 below the ridge portion Ri. The MQW active layer 304 corresponds to the p-n junction surface of the infrared semiconductor laser device 30.

Also when using the infrared semiconductor laser device 30 that emits an infrared laser beam (wavelength: around 790 nm) as the second semiconductor laser device, setting the thickness t32 of the insulating layer 32 to not less than 0.23 µm provides a value of capacitance induced in the insulating layer 32 not more than the value of capacitance induced in the first current blocking layer 30c of the infrared semiconductor laser device 30.

This results in similar effects to those provided using the red semiconductor laser device 20 as the second semiconductor laser device.

(6) Other Examples of Configuration of Semiconductor Laser Apparatus and Effects Thereof In the semiconductor laser apparatus 500 according to the first embodiment, the thickness t32 of the insulating layer 32 may be set to not less than 0.46 µm to provide a value of capacitance induced in the insulating layer 32 not more than about half the value of capacitance of the first current blocking layer 20c of the red semiconductor laser device 20 or the first current blocking layer 30c of the infrared semiconductor laser device 30.

When the value of capacitance induced in the insulating layer 32 is not more than about half the value of capacitance induced in the current blocking layer 20c or 30c, the decrease in the cutoff frequency of the red semiconductor laser device 20 or the infrared semiconductor laser device 30 is suppressed to a maximum of about 20% of the cutoff frequency thereof without the insulating layer 32.

By setting the thickness of the insulating layer 32 so that the value of capacitance induced in the insulating layer 32 is not more than about half the value of capacitance induced in the first current blocking layer 20c or 30c as described above, the decrease in the cutoff frequency of the red semiconductor laser device 20 or the infrared semiconductor laser device 30 due to the influence of the insulating layer 32 is further reduced. That is, deterioration in the high frequency characteristics of the red semiconductor laser device 20 or the infrared semiconductor laser device 30 due to the influence of the insulating layer 32 is reduced more sufficiently.

Moreover, in the semiconductor laser apparatus 500 according to the first embodiment, the thickness t32 of the insulating layer 32 may be set to not less than 1.20 µm to provide a value of capacitance induced in the insulating layer 32 about not more than one-fifth of the value of capacitance induced in the first current blocking layer 20c of the red semiconductor laser device 20 or the first current blocking layer 30c of the infrared semiconductor laser device 30.

When the value of capacitance induced in the insulating layer 32 is not more than about one-fifth of the value of capacitance induced in the first current blocking layer 20c or 30c, the decrease in the cutoff frequency of the red semiconductor laser device 20 or the infrared semiconductor laser device 30 is suppressed to about a maximum of 10% of the cutoff frequency thereof without the insulating layer 32.

The cutoff frequencies of red semiconductor laser devices 20 or infrared semiconductor laser devices 30, in general, are varied in the range of about 10% by, e.g., nonuniformity in the arrangement of semiconductor laser devices. When, therefore, the decrease in the cutoff frequency of the red semiconductor laser device 20 or the infrared semiconductor laser device 30 is suppressed to about 10%, deterioration in the cutoff frequency is almost negligible.

By setting the thickness of the insulating layer 32 so that the value of capacitance induced in the insulating layer 32 is about not more than one-fifth of the value of capacitance induced in the first current blocking layer 20c or 30c as described above, the decrease in the cutoff frequency of the red semiconductor laser device 20 or the infrared semiconductor laser device 30 due to the influence of the insulating layer 32 is significantly reduced. That is, deterioration in the high frequency characteristics of the red semiconductor laser device 20 or the infrared semiconductor laser device 30 due to the influence of the insulating layer 32 is reduced extremely sufficiently.

In the first embodiment, the value of capacitance induced in the insulating layer 32 is not more than the value of capacitance induced in the first current blocking layer 20c. In addition, the n-side pad electrode 10b of the blue-violet semiconductor laser device 10 and the n-side pad electrode 20b of the red semiconductor laser device 20 are electrically connected to each other. This facilitates controlling the drive voltages of the blue-violet semiconductor laser device 10 and the red semiconductor laser device 20 while sufficiently reducing deterioration in the high frequency characteristics of the red semiconductor laser device 20 due to the influence of the insulating layer.

(7) Other Effects of Semiconductor Laser Apparatus

A plurality of semiconductor laser apparatuses 500 can be simultaneously fabricated by overlapping a wafer having a plurality of blue-violet semiconductor laser devices 10 thereon with a wafer having a plurality of red semiconductor laser devices 20 thereon. This improves the positioning accuracy of each of the blue-violet semiconductor laser devices 10 and each of the red semiconductor laser devices 20. This results in improved positioning accuracy of the emission points of the blue-violet semiconductor laser devices 10 and the red semiconductor laser devices 20.

Also, providing the sub-substrate 31 between the support member 5 and the blue-violet semiconductor laser device 10 allows adjustments to be made to the positions of the emission points of the blue-violet semiconductor laser devices 10 and the red semiconductor laser devices 20.

The use of the blue-violet semiconductor laser device 10 that includes a nitride-based semiconductor as the first semiconductor laser device improves heat dissipation capability of the blue-violet semiconductor laser device 10. Stacking the red semiconductor laser device 20 on the blue-violet semiconductor laser device 10 also improves heat dissipation capability of the red semiconductor laser device 20.

Heat generated from the blue-violet semiconductor laser device 10 and the red semiconductor laser device 20 is dissipated through the support member 5. In the first embodiment, the blue-violet semiconductor laser device 10 is disposed on the support member 5 so that the p-side pad electrode 10a is positioned on the support member 5 side. This brings the emission point of the blue-violet semiconductor laser device 10 close to the support member 5. This results in improved heat dissipation capability of the blue-violet semiconductor laser device 10.

The red semiconductor laser device 20 is disposed so that the p-side pad electrode 20a is positioned on the support member 5 side. This brings the emission point of the red semiconductor laser device 20 close to the support member 5, resulting in improved heat dissipation capability.

In the foregoing embodiment, the red semiconductor laser device 20 as the second semiconductor laser device is stacked on the blue-violet semiconductor laser device 10 as the first semiconductor laser device. However, not only the single semiconductor laser device but also a plurality of semiconductor laser devices may be aligned on the blue-violet semiconductor laser device 10 in the Y direction. This allows for increases in the kinds (i.e., wavelengths) and the number of laser beams emitted from the semiconductor laser apparatus 500.

Furthermore, in the foregoing embodiment, the n-side pad electrode 10b of the blue-violet semiconductor laser device 10 and the n-side pad electrode 20b of the red semiconductor laser device 20 are both connected to the support member 5. However, then-side pad electrodes 10b and 20b may be electrically isolated from the support member 5.

In this case, a floating connection of the blue-violet semiconductor laser device 10 and the red semiconductor laser device 20 is achieved. This allows arbitrary voltages to be applied to the power supply pins that are electrically connected to the n-side pad electrode 10b of the blue-violet semiconductor laser device 10 and the n-side pad electrode 20b of the red semiconductor laser device 20. As a result, the drive voltages of the blue-violet semiconductor laser device 10 and the red semiconductor laser device 20 can be easily controlled by the drive device of the semiconductor laser apparatus 500.

(8) Correspondence Between Each Claim Element and Each Component in Embodiment

In the first embodiment, the support member 5 corresponds to a support member; the insulating layer 32 corresponds to an insulating layer; and the conductive layer 32a corresponds to a conductive layer.

The n-GaN substrate is corresponds to a first substrate; the semiconductor layer on the n-GaN substrate is corresponds to a first semiconductor layer; the p-side pad electrode 10a corresponds to a first electrode; the n-side pad electrode 10b corresponds to a second electrode; the blue-violet laser beam corresponds to a light beam of a first wavelength; and the blue-violet semiconductor laser device 10 corresponds to a first semiconductor laser device.

The n-GaAs substrate 5X corresponds to a second substrate; the semiconductor layer on the n-GaAs substrate 5X corresponds to a second semiconductor layer; each of the p-side pad electrode 20a and the p-side pad electrode 30a corresponds to a third electrode; each of the n-side pad electrode 20b and the n-side pad electrode 30b corresponds to a fourth electrode; each of the red laser beam and the infrared laser beam corresponds to a light beam of a second wavelength; each of the red semiconductor laser device 20 and the infrared semiconductor laser device 30 corresponds to a second semiconductor laser device; and each of the first current blocking layer 20c and the first current blocking layer 30c corresponds to a current blocking layer.

Second Embodiment (1) Configuration and Connection of Semiconductor Laser Apparatus A semiconductor laser apparatus according to a second embodiment differs from the semiconductor laser apparatus 500 according to the first embodiment in configuration and operation as described below.

Figure 10:
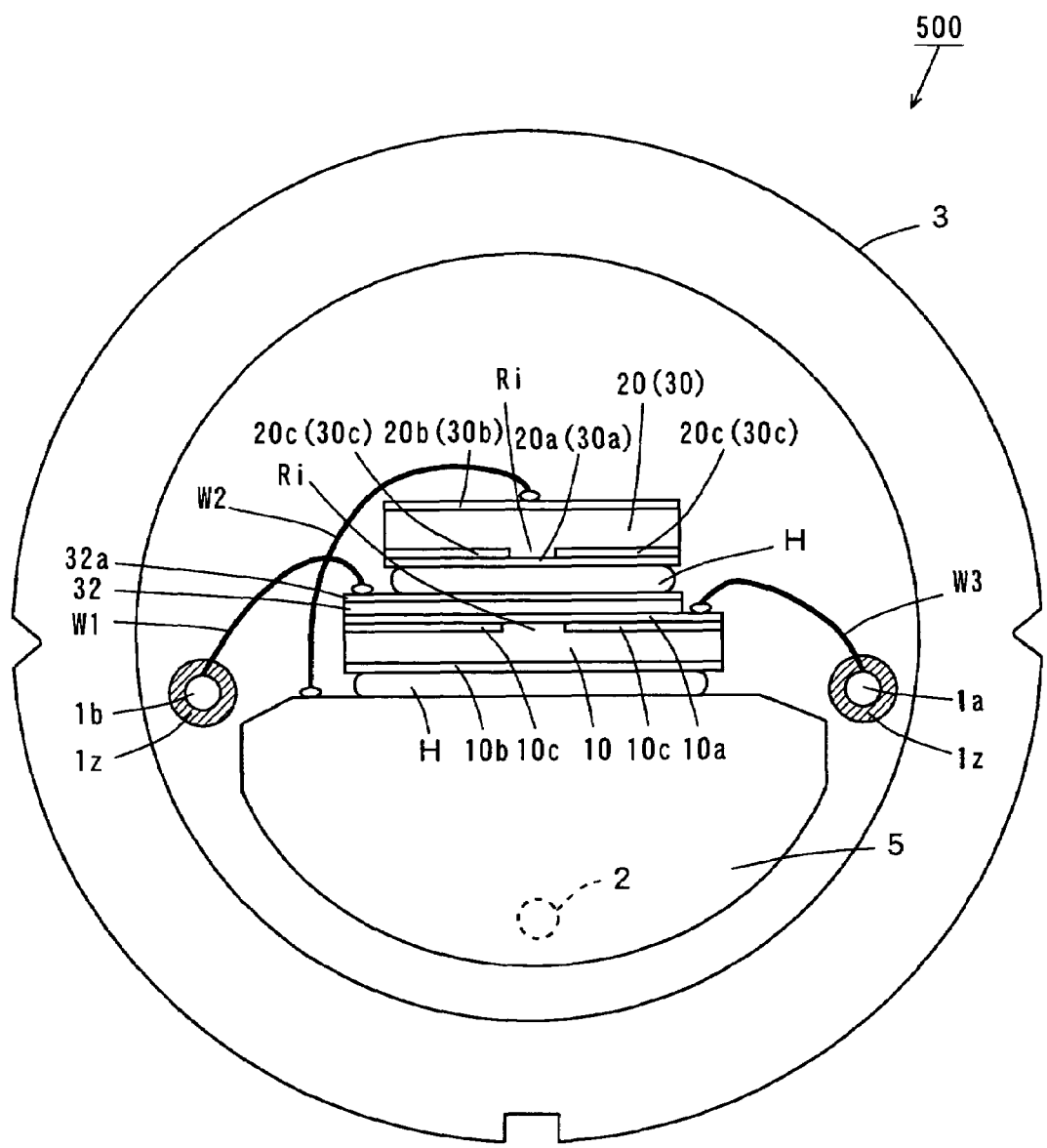
FIG. 10 is a schematic front view showing a semiconductor laser apparatus according to a second embodiment with a cover thereof being removed.
Figure 11:
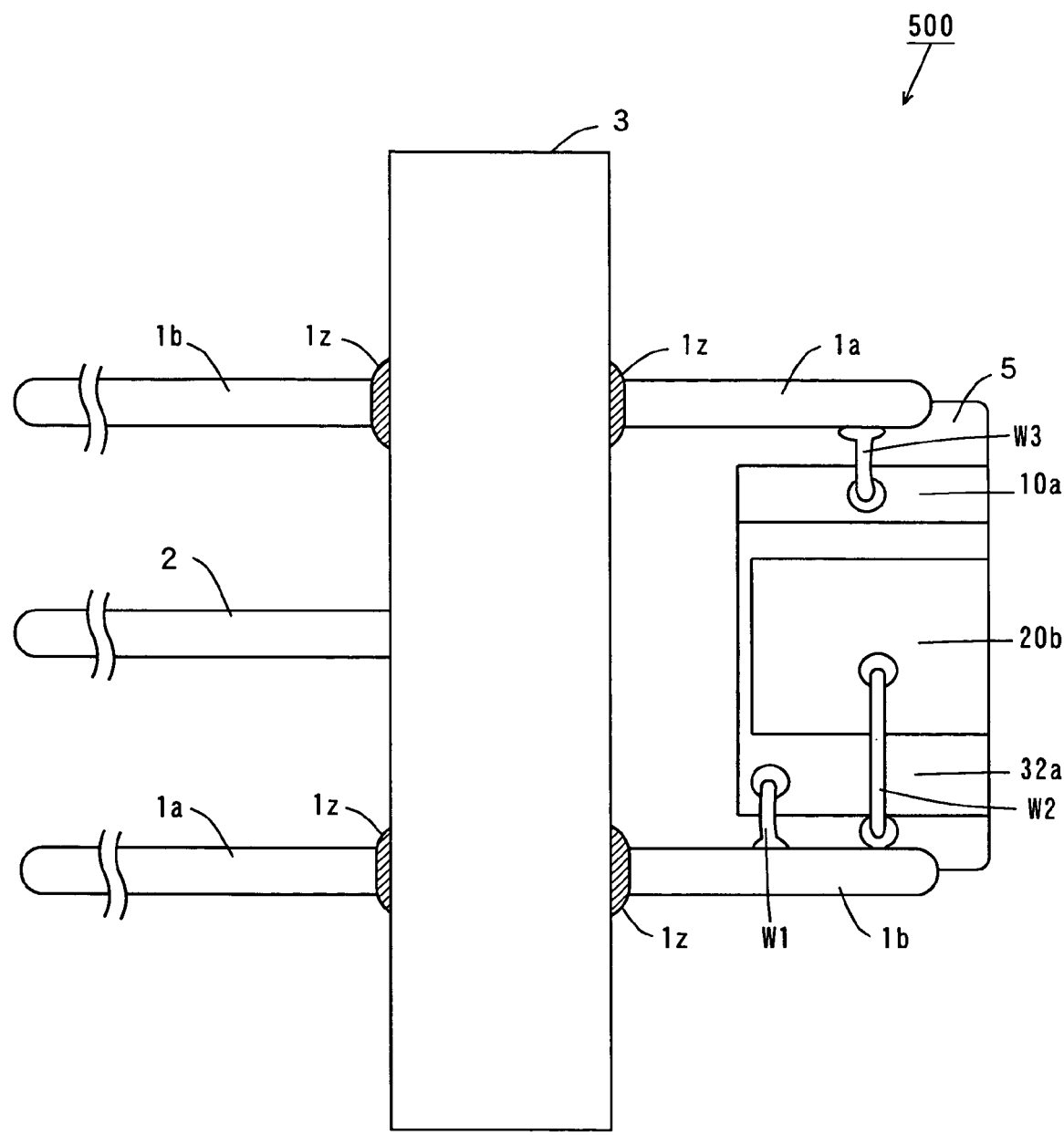
FIG. 11 is a schematic top view showing the semiconductor laser apparatus according to the second embodiment with the cover thereof being removed.

FIG. 10 is a schematic front view showing the semiconductor laser apparatus according to the second embodiment with a cover 4 being removed, and FIG. 11 is a schematic top view showing the semiconductor laser apparatus according to the second embodiment with the cover 4 being removed.

As shown in FIG. 10, a conductive fusion layer H is formed on a conductive support member 5 integral with a package body 3.

A blue-violet semiconductor laser device 10 is bonded on the fusion layer H so that an n-side pad electrode 10b lies on the support member 5 side.

An insulating layer 32 made of SiO$_2$ (silicon oxide) is provided on a p-side pad electrode 10a of the blue-violet semiconductor laser device 10. In the second embodiment also, the thickness of the insulating layer 32 is defined as t32. The thickness t32 of the insulating layer 32 will be described in detail below.

A conductive layer 32a containing Au is formed on the insulating layer 32. A red semiconductor laser device 20 is bonded on the conductive layer 32a so that a p-side pad electrode 20a lies on the support member 5 side.

As indicated by the parentheses in FIG. 10, an infrared semiconductor laser device 30 may be stacked on the blue-violet semiconductor laser device 10 instead of the red semiconductor laser device 20. When stacking the infrared semiconductor laser device 30 on the blue-violet semiconductor laser device 10, the infrared semiconductor laser device 30 is disposed so that a p-side pad electrode 30a lies on the support member 5 side.

As shown in FIG. 10 and FIG. 11, each of power supply pins 1a, 1b is electrically isolated from the package body 3 through an insulating ring 1z. The power supply pin 1a is electrically connected to the p-side pad electrode 10a of the blue-violet semiconductor laser device 10 through a wire W3. The power supply pin 1b is electrically connected to the conductive layer 32a on the insulating layer 32 through a wire W1. An exposed upper surface of the support member 5 and the n-side pad electrode 20b of the red semiconductor laser device 20 are electrically connected through a wire W2.

The n-side pad electrode 10b of the blue-violet semiconductor laser device 10 is electrically connected on the support member 5 through the fusion layer H. This provides an electrical connection of a power supply pin 2 to the n-side pad electrode 10b of the blue-violet semiconductor laser device 10 and the n-side pad electrode 20b of the red semiconductor laser device 20. That is, a common cathode connection of the blue-violet semiconductor laser device 10 and the red semiconductor laser device 20 is achieved.

When voltages are applied to the power supply pins 1a and 2 and between the power supply pins 1b and 2, respectively, the blue-violet semiconductor laser device 10 and the red semiconductor laser device 20 can be driven individually. The semiconductor laser apparatus 500 according to the second embodiment has electrical wiring similar to that shown in FIG. 4. Accordingly, the drive voltage of each of the semiconductor laser devices can be easily controlled also in the semiconductor laser apparatus 500 according to the second embodiment.

(2) Function of Insulating Layer As a Dielectric and Effects Thereof

When driving the semiconductor laser apparatus 500 according to the second embodiment by alternating voltage, the insulating layer 32 in FIG. 10 functions as a dielectric, similarly to the first embodiment.

Figure 12:
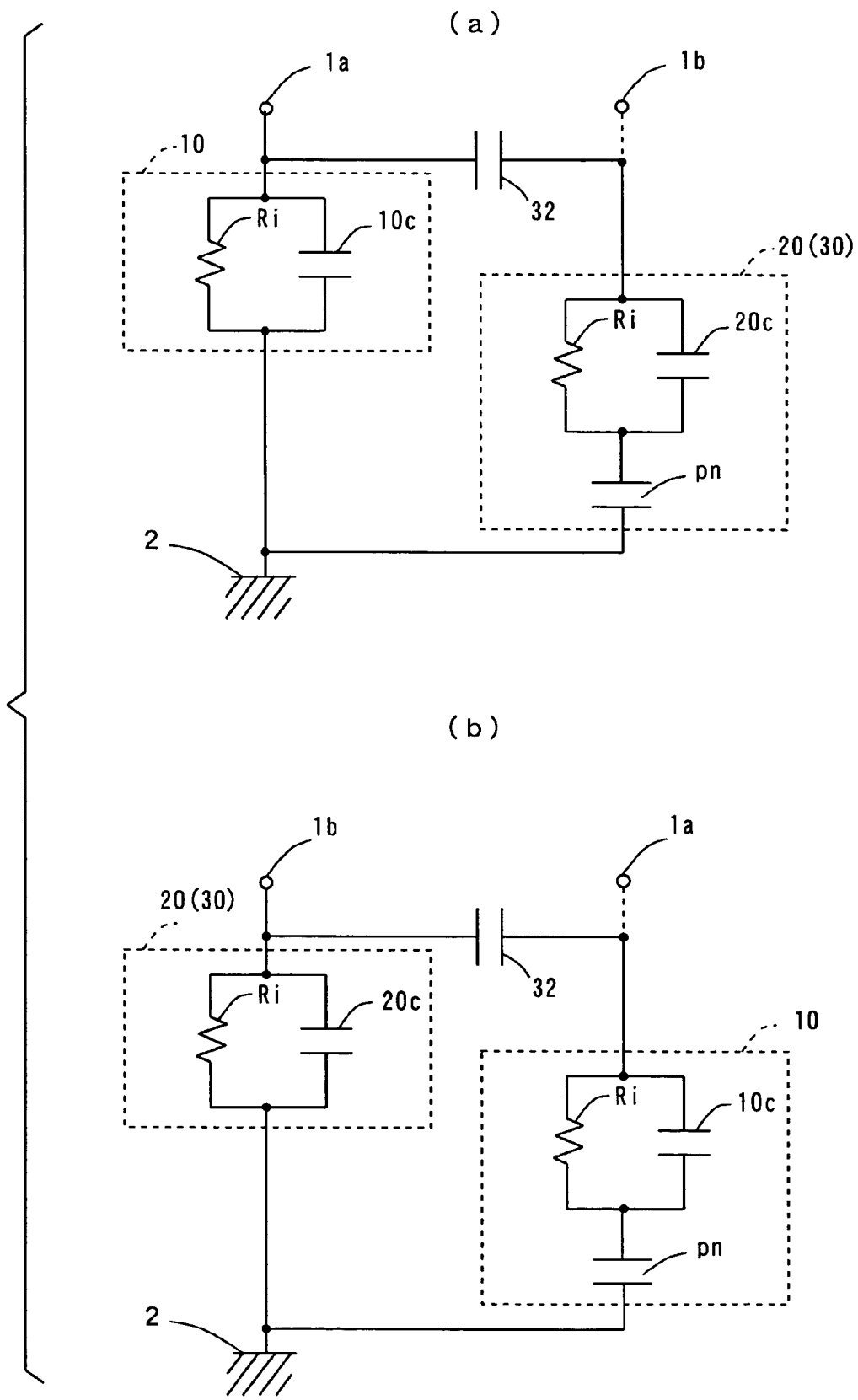
FIGS. 12 (a) and 12 (b) are equivalent circuit diagrams for use in illustrating the function of the insulating layer in FIG. 10 as a dielectric.

FIG. 12 is an equivalent circuit for use in illustrating the function of the insulating layer 32 in FIG. 10 as a dielectric.

FIG. 12 (a) shows an equivalent circuit diagram in the case of driving the blue-violet semiconductor laser device 10, and FIG. 12 (b) shows an equivalent circuit diagram in the case of driving the red semiconductor laser device 20.

When driving the blue-violet semiconductor laser device 10 by alternating voltage, the blue-violet semiconductor laser device 10 is also represented by FIG. 12 (a), where the ridge portion Ri is a resistance, and the current blocking layer 10c is a dielectric. The red semiconductor laser device 20 is represented by FIG. 12 (a), where the ridge portion Ri is a resistance, the first current blocking layer 20c is a dielectric, and the p-n junction surface is a dielectric. The insulating layer 32 functions as a dielectric, similarly to the first embodiment.

In this way, when driving the blue-violet semiconductor laser device 10 by alternating voltage, the series circuit of the insulating layer 32 and the red semiconductor laser device 20 is connected in parallel to the blue-violet semiconductor laser device 10.

On the other hand, when driving the red semiconductor laser device 20 by alternating voltage, the red semiconductor laser device 20 is represented by FIG. 12 (b), where the ridge portion Ri is a resistance, and the first current blocking layer 20c is a dielectric.

When driving the blue-violet semiconductor laser device 10 by alternating voltage, the blue-violet semiconductor laser device 10 is also represented by FIG. 12 (b), where the ridge portion Ri is a resistance, the current blocking layer 10c is a dielectric, and the p-n junction surface is a dielectric. In this case also, the insulating layer 32 functions as a dielectric.

As shown in FIGS. 12 (a) and 12 (b), when driving either of the semiconductor laser devices, the current blocking layer of the other semiconductor laser device and the p-n junction surface thereof are connected in series with the insulating layer 32. This reduces the value of combined capacitance of the insulating layer 32, the current blocking layer of the other semiconductor laser device, and the p-n junction surface thereof. As a result, the influence of the insulating layer 32 on the other semiconductor laser device is reduced.

Besides, as described in the first embodiment, the value of capacitance induced in the current blocking layer 10c when driving the blue-violet semiconductor laser device 10 is about 15 pF. It is thus preferred to adjust the value of capacitance induced in the insulating layer 32 to be not more than about 15 pF when driving the blue-violet semiconductor laser device 10. This sufficiently reduces deterioration of the high frequency characteristics of the blue-violet semiconductor laser device 10 due to the influence of the insulating layer 32.

Moreover, the value of capacitance induced in the first current blocking layer 20c when driving the red semiconductor laser device 20 is about 28 pF. It is thus preferred to adjust the value of capacitance induced in the insulating layer 32 to not more than about 28 pF when driving the red semiconductor laser device 20. This sufficiently reduces deterioration of the high frequency characteristics of the red semiconductor laser device 20 due to the influence of the insulating layer 32.

It is accordingly possible to sufficiently suppress deterioration in the high frequency characteristics of each of the blue-violet semiconductor laser device 10 and the red semiconductor laser device 20 due to the influence of the insulating layer 32 by setting the value of capacitance induced in the insulating layer 32 to not more than about 15 pF.

Therefore, in the second embodiment, the thickness t32 of the insulating layer 32 is set so that the value of capacitance induced in the insulating layer 32 is not more than the value of capacitance induced in the current blocking layer 10c or 20c.

In order to provide a value of capacitance induced in the insulating layer 32 not more than about 15 pF, the thickness t32 of the insulating layer 32 must be set to not less than 0.43 μm, based on FIG. 6.

By setting the thickness t32 of the insulating layer 32 to not less than 0.43 μm, the value of capacitance induced in the insulating layer 32 becomes not more than the value of capacitance induced in the current blocking layer 10c of the blue-violet semiconductor laser device 10 or the current blocking layer 20c of the red semiconductor laser device 20.

The resultant value of effective capacitance is not more than twice the value of capacitance induced in the current blocking layer 10c or 20c. As a result, when the value of capacitance induced in the insulating layer 32 is not more than the value of capacitance induced in the current blocking layer 10c or 20c, the decrease in the cutoff frequency of the blue-violet semiconductor laser device 10 or the red semiconductor laser device 20 is suppressed to a maximum of about 30% of the cutoff frequency thereof without the insulating layer 32.

By setting the thickness of the insulating layer 32 so that the value of capacitance induced in the insulating layer 32 is not more than the value of capacitance induced in the current blocking layer 10c or 20c, the decrease in the cutoff frequency of the blue-violet semiconductor laser device 10 or the red semiconductor laser device 20 due to the influence of the insulating layer 32 is sufficiently reduced. That is, the decrease in the high frequency characteristics of both the blue-violet semiconductor laser device 10 and the red semiconductor laser device 20 due to the influence of the insulating layer 32 is sufficiently reduced.

Note that the thickness t32 of the insulating layer 32 may be set to not less than 0.86 μm to provide a value of capacitance induced in the insulating layer 32 not more than about half the value of capacitance induced in the current blocking layer 10c of the blue-violet semiconductor laser device 10.

When the value of capacitance induced in the insulating layer 32 is not more than about half the value of capacitance induced in the current blocking layer 10c, the decrease in the cutoff frequency of the blue-violet semiconductor laser device 10 is suppressed to a maximum of about 20% of the cutoff frequency thereof without the insulating layer 32.

By setting the thickness of the insulating layer 32 so that the value of capacitance induced in the insulating layer 32 is not more than about half the value of capacitance induced in the current blocking layer 10c, the decrease in the cutoff frequency of the blue-violet semiconductor laser device 10 due to the influence of the insulating layer 32 is further reduced. That is, deterioration in the high frequency characteristics of the blue-violet semiconductor laser device 10 due to the influence of the insulating layer 32 is reduced more sufficiently.

In addition, the value of capacitance induced in the first current blocking layer 20c of the red semiconductor laser device 20 is greater than the value of capacitance induced in the current blocking layer 10c of the blue-violet semiconductor laser device 10. Therefore, the decrease in the cutoff frequency of the red semiconductor laser device 20 due to the influence of the insulating layer 32 is also smaller. That is, deterioration in the high frequency characteristics of the red semiconductor laser device 20 due to the influence of the insulating layer 32 is reduced more sufficiently.

Moreover, the thickness t32 of the insulating layer 32 may be set to not less than 2.30 μm to provide a value of capacitance induced in the insulating layer 32 not more than about one-fifth the value of capacitance induced in the current blocking layer 10c of the blue-violet semiconductor laser device 10.

When the value of capacitance induced in the insulating layer 32 is not more than about one-fifth the value of capacitance induced in the current blocking layer 20c or 30c, the decrease in the cutoff frequency of the blue-violet semiconductor laser device 10 is suppressed to a maximum of about 10% of the cutoff frequency thereof without the insulating layer 32.

By setting the thickness of the insulating layer 32 so that the value of effective capacitance is not more than about one-fifth the value of capacitance induced in the current blocking layer 10c, the decrease in the cutoff frequency of the blue-violet semiconductor laser device 10 due to the influence of the insulating layer 32 is significantly reduced. That is, deterioration in the high frequency characteristics of the blue-violet semiconductor laser device 10 due to the influence of the insulating layer 32 is reduced extremely sufficiently.

In addition, the value of capacitance induced in the first current blocking layer 20c of the red semiconductor laser device 20 is greater than the value of capacitance induced in the current blocking layer 10c of the blue-violet semiconductor laser device 10. This makes the decrease in the cutoff frequency of the red semiconductor laser device 20 due to the influence of the insulating layer 32 so small that it is negligible. That is, the decrease in the deterioration of the high frequency characteristics of the red semiconductor laser device 20 due to the influence of the insulating layer 32 is suppressed extremely sufficiently.

The thickness t32 of the insulating layer 32 may be set to not less than 0.65 μm. According to FIG. 6, it is possible to provide a value of capacitance induced in the insulating layer 32 not more than 10 pF by setting the thickness t32 of the insulating layer 32 to not less than 0.65 μm. The value of effective capacitance of the blue-violet semiconductor laser device 10 during drive is thus on the order of 23 to 24 pF. Note that the value of capacitance induced in the p-n junction surface of the red semiconductor laser device 20 is excluded from considerations.

Usually, the inductance of the blue-violet semiconductor laser device 10 is about 3 nH. The cutoff frequency of the blue-violet semiconductor laser device 10 is determined based on the value of effective capacitance and the equation (2) shown above. When the value of capacitance induced in the insulating layer 32 is not more than 10 pF, the cutoff frequency of the blue-violet semiconductor laser device 10 is not less than 600 MHz.

In optical pickup apparatuses comprising blue-violet semiconductor laser devices 10, in general, the cutoff frequency of the blue-violet semiconductor laser devices 10 is preferably set to not less than 600 MHz.

Therefore, with the semiconductor laser apparatus 500 according to the second embodiment, the thickness t32 of the insulating layer 32 is set to not less than 0.65 μm to set the cutoff frequency of the blue-violet semiconductor laser device 10 to not less than 600 MHz. The semiconductor laser apparatus 500 thus provides good performance when used in an optical pickup apparatus or the like.

In the second embodiment, the value of capacitance induced in the insulating layer 32 is not more than the smaller one of the values of capacitances induced in the current blocking layer 10c and the first current blocking layer 20c. Besides, the n-side pad electrode 10b of the blue-violet semiconductor laser device 10 and the n-side pad electrode 20b of the red semiconductor laser device 20 are electrically connected to each other. This facilitates controlling the drive voltages of the blue-violet semiconductor laser device 10 and the red semiconductor laser device 20 while sufficiently reducing deterioration in the high frequency characteristics of the red semiconductor laser device 20 due to the influence of the insulating layer.

(3) Other Effects of Semiconductor Laser Apparatus

A plurality of semiconductor laser apparatuses 500 can be simultaneously fabricated by overlapping a wafer having a plurality of blue-violet semiconductor laser devices 10 thereon with a wafer having a plurality of red semiconductor laser devices 20 thereon. This improves the positioning accuracy of each of the blue-violet semiconductor laser devices 10 and each of the red semiconductor laser devices 20. This results in improved positioning accuracy of the emission points of the blue-violet semiconductor laser devices 10 and the red semiconductor laser devices 20.

In addition, the blue-violet semiconductor laser device 10 and the red semiconductor laser device 20 are disposed so that the p-side pad electrode 10a and the p-side pad electrode 20a are positioned opposite to each other with the insulating layer 32 therebetween. This brings the semiconductor layer of the blue-violet semiconductor laser device 10 and the semiconductor layer of the red semiconductor laser device 20 close to each other, allowing the emission points of the blue-violet semiconductor laser device 10 and the red semiconductor laser device 20 to approach each other. Thus, when the laser beams emitted from the blue-violet semiconductor laser device 10 and the red semiconductor laser device 20 pass through a converging lens, aberration due to the lens can be reduced.

A sub-substrate 31 may be provided between the support member 5 and the blue-violet semiconductor laser device 10, although it is not provided in the semiconductor laser apparatus 500 according to the second embodiment.

In this case, the thickness of the sub-substrate 31 allows adjustments to be made to the position of each of the emission points of the blue-violet semiconductor laser device 10 and the red semiconductor laser device 20.

When the sub-substrate 31 is provided between the support member 5 and the blue-violet semiconductor laser device 10, the n-side pad electrode 10b of the blue-violet semiconductor laser device 10 and the support member 5 may be electrically isolated through the sub-substrate 31. In this case, a floating connection of the blue-violet semiconductor laser device 10 is achieved. This allows an arbitrary voltage to be applied to the power supply pin that is electrically connected to the n-side pad electrode 10b of the blue-violet semiconductor laser device 10. As a result, the drive voltages of the blue-violet semiconductor laser device 10 and the red semiconductor laser device 20 can be easily controlled by the drive device of the semiconductor laser apparatus 500.

(4) Correspondence Between Each Claim Element and Each Component in Embodiment

In the second embodiment, the current blocking layer 10c corresponds to a first current blocking layer, and each of the first current blocking layers 20c, 30c corresponds to a second current blocking layer.

(3) Third Embodiment (1) Configuration and Connection of Semiconductor Laser Apparatus A semiconductor laser apparatus according to a third embodiment differs from the semiconductor laser apparatus 500 according to the second embodiment in configuration and operation as described below.

Figure 13:
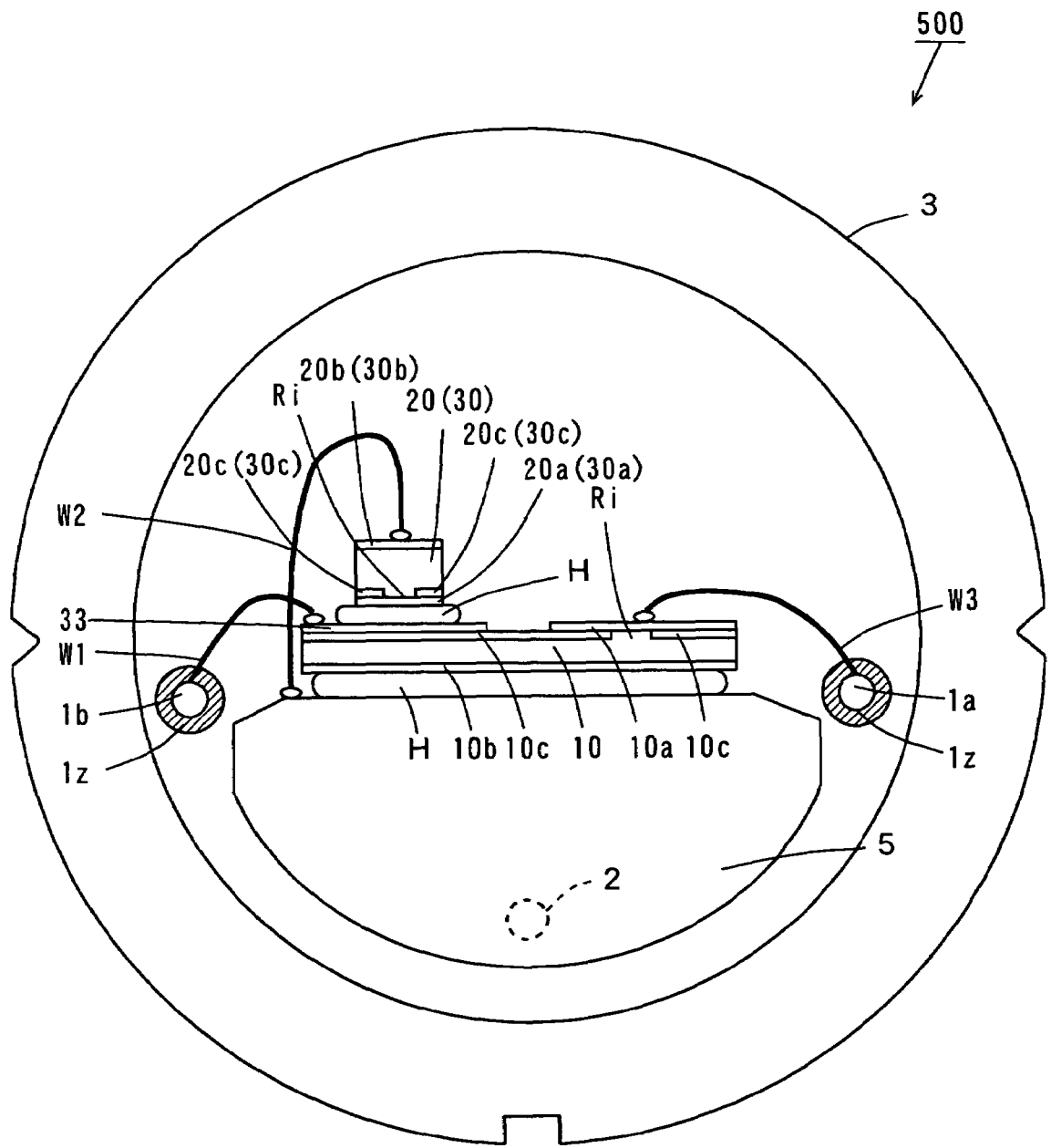
FIG. 13 is a schematic front view showing a semiconductor laser apparatus according to a third embodiment with a cover thereof being removed.
Figure 14:
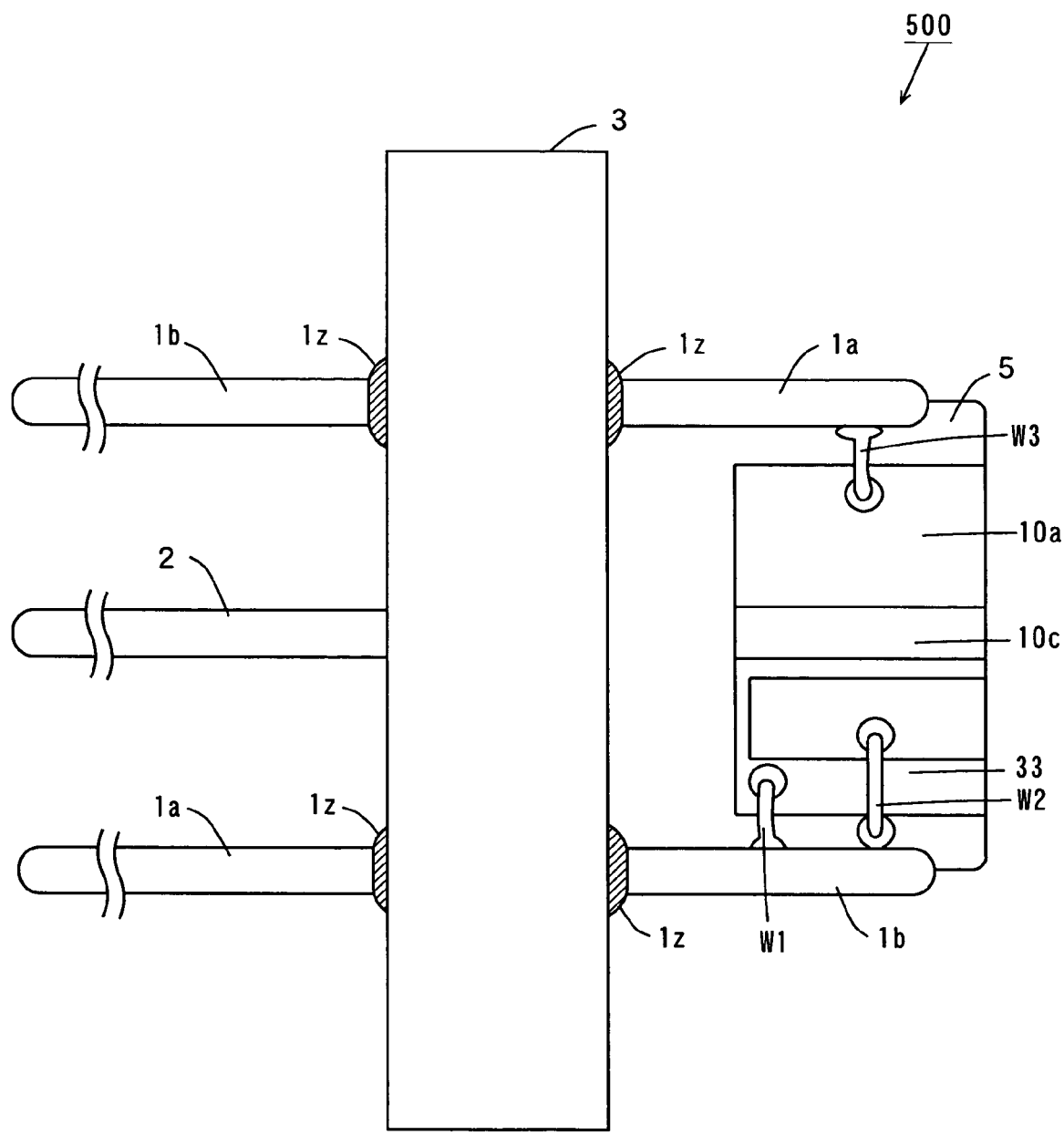
FIG. 14 is a schematic top view showing the semiconductor laser apparatus according to the third embodiment with the cover thereof being removed.

FIG. 13 is a schematic front view showing the semiconductor laser apparatus according to the third embodiment with a cover 4 being removed, and FIG. 14 is a schematic top view showing the semiconductor laser apparatus according to the third embodiment with the cover 4 being removed.

As shown in FIG. 13, a conductive fusion layer H is formed on a conductive support member 5 integral with a package body 3. A blue-violet semiconductor laser device 10 is bonded on the fusion layer H so that an n-side pad electrode 10b lies on the support member 5 side.

The blue-violet semiconductor laser device 10 in the third embodiment is greater in width (in the Y direction) than the semiconductor laser device 10 in the first embodiment.

A p-side pad electrode 10a of the blue-violet semiconductor laser device 10 is formed on a portion of a current blocking layer 10c. The current blocking layer 10c thus blocks the current flowing in the blue-violet semiconductor laser device 10 under the p-side pad electrode 10a except the ridge portion Ri. As described above, the current blocking layer 10c is made of $SiO_2$.

A conductive layer 33 containing Au is formed on another portion of the current blocking layer 10c at a distance from the p-side pad electrode 10a in the X-Y plane. The region where the conductive layer 33 is formed in the X-Y plane is referred to as a conductive layer forming region.

A red semiconductor laser device 20 is bonded on the conductive layer 33 through a fusion layer H made of AuSn so that a p-side pad electrode 20a lies on the support member 5 side.

As indicated by the parentheses in FIG. 13, an infrared semiconductor laser device 30 may be stacked on the blue-violet semiconductor laser device 10 instead of the red semiconductor laser device 20.

As shown in FIG. 13 and FIG. 14, each of power supply pins 1a, 1b is electrically isolated from the package body 3 through an insulating ring 1z. The power supply pin 1a is electrically connected to the p-side pad electrode 10a of the blue-violet semiconductor laser device 10 through a wire W3. The power supply pin 1b is electrically connected to the conductive layer 33 through a wire W1. An exposed upper surface of the support member 5 and the n-side pad electrode 20b of the red semiconductor laser device 20 are electrically connected through a wire W2.

The n-side pad electrode 10b of the blue-violet semiconductor laser device 10 is electrically connected on the support member 5 through the fusion layer H. This provides an electrical connection of a power supply pin 2 to the n-side pad electrode 10b of the blue-violet semiconductor laser device 10 and the n-side pad electrode 20b of the red semiconductor laser device 20. That is, a common cathode connection of the blue-violet semiconductor laser device 10 and the red semiconductor laser device 20 is achieved.

When voltages are applied between the power supply pins 1a and 2 and between the power supply pins 1b and 2, respectively, the blue-violet semiconductor laser device 10 and the red semiconductor laser device 20 can be driven individually.

The semiconductor laser apparatus 500 according to the third embodiment has electrical wiring similar to that shown in FIG. 4. Accordingly, the drive voltage of each of the semiconductor laser devices can be easily controlled also in the semiconductor laser apparatus 500 according to the third embodiment.

(2) Function of Current Blocking Laser as a Dielectric and Effects Thereof

Also in the third embodiment, the current blocking layer 10c below the conductive layer forming region functions as a dielectric when driving the red semiconductor laser device 20 by alternating voltage. Thus, the value of capacitance induced in the current blocking layer 10c under the conductive layer forming region is preferably not more than the value of capacitance induced in the first current blocking layer 20c in the third embodiment.

As demonstrated in the first embodiment, when the first current blocking layer 20c is 0.5 μm thick, 200 μm wide, and 600 μm long, the value of capacitance induced in the first current blocking layer 20c is about 28 pF.

Note that the area of the conductive layer forming region in the X-Y plane is the same as that of the insulating layer 32 (conductive layer 32a) described in the first embodiment. That is, the conductive layer forming region is about 300 μm wide (in the Y direction) and about 600 μm long (in the X direction).

Thus, in order to provide a value of capacitance induced in the current blocking layer 10c under the conductive layer forming region not more than about 28 pF, it is necessary to set the thickness of the current blocking layer 10c not less than 0.23 μm, based on FIG. 6.

By setting the thickness of the current blocking layer 10c to not less than 0.23 μm, the value of capacitance induced in the current blocking layer 10c under the conductive layer 33 becomes not more than the value of capacitance induced in the first current blocking layer 20c of the red semiconductor laser device 20.

The resulting value of effective capacitance is not more than twice the value of capacitance induced in the first current blocking layer 20c. As a result, when the value of capacitance induced in the current blocking layer 10c under the conductive layer 33 is not more than the value of capacitance induced in the first current blocking layer 20c, the decrease in the cutoff frequency of the red semiconductor laser device 20 is suppressed to a maximum of about 30% of the cutoff frequency thereof without the current blocking layer 10c.

By setting the thickness of the current blocking layer 10c so that the value of capacitance induced in the current blocking layer 10c is not more than the value of capacitance induced in the first current blocking layer 20c as described above, the decrease in the cutoff frequency of the red semiconductor laser device 20 due to the influence of the current blocking layer 10c is sufficiently reduced. That is, deterioration in the high frequency characteristics of the red semiconductor laser device 20 due to the influence of the current blocking layer 10c is sufficiently suppressed.

The thickness of the current blocking layer 10c may be set to not less than 0.46 μm to provide a value of capacitance induced in the current blocking layer 10c not more than about half the value of capacitance induced in the first current blocking layer 20c of the red semiconductor laser device 20.

When the value of capacitance induced in the current blocking layer 10c is not more than about half the value of capacitance induced in the first current blocking layer 20c, the decrease in the cutoff frequency of the red semiconductor laser device 20 is suppressed to a maximum of about 20% of the cutoff frequency thereof without the insulating layer 32.

By setting the thickness of the current blocking layer 10c so that the value of capacitance induced in the current blocking layer 10c is not more than about half the value of capacitance induced in the first current blocking layer 20c, the decrease in the cutoff frequency of the red semiconductor laser device 20 due to the influence of the current blocking layer 10c is further reduced. That is, deterioration in the high frequency characteristics of the red semiconductor laser device 20 due to the influence of the current blocking layer 10c is suppressed more sufficiently.

The thickness of the current blocking layer 10c may also be set to not less than 1.20 μm to provide a value of capacitance induced in the current blocking layer 10c not more than about one-fifth the value of capacitance induced in the first current blocking layer 20c of the red semiconductor laser device 20.

When the value of capacitance induced in the current blocking layer 10c is not more than about one-fifth the value of the capacitance induced in the first current blocking layer 20c, the decrease in the cutoff frequency of the red semiconductor laser device 20 is suppressed to a maximum of about 10% of the cutoff frequency thereof without the current blocking layer 10c.

The cutoff frequencies of semiconductor laser devices, in general, are varied in the range of about 10% by, e.g., non-uniformity in the arrangement of the semiconductor laser devices. When, therefore, the decrease in the cutoff frequency of the red semiconductor laser device 20 is suppressed to about 10%, deterioration of the cutoff frequency is almost negligible.

By setting the thickness of the current blocking layer 10c so that the value of capacitance induced in the current blocking layer 10c is not more than about one-fifth the value of capacitance induced in the first current blocking layer 20c, the decrease in the cutoff frequency of the red semiconductor laser device 20 due to the influence of the current blocking layer 10c is significantly reduced. That is, deterioration in the high frequency characteristics of the red semiconductor laser device 20 due to the influence of the current blocking layer 10c is suppressed extremely sufficiently.

In the aforementioned embodiment, the thickness of the current blocking layer 10c is set to a predetermined value in order to adjust the value of capacitance induced in the current blocking layer 10c. However, the value of capacitance induced in the current blocking layer 10c may also be adjusted by setting the material, the width (in the Y direction), and the length (in the X direction) of the current blocking layer 10c.

In the third embodiment, the value of capacitance induced in the current blocking layer 10c is not more than the value of capacitance induced in the first current blocking layer 20c. Besides, the n-side pad electrode 10b of the blue-violet semiconductor laser device 10 and the n-side pad electrode 20b of the red semiconductor laser device 20 are electrically connected to each other. This facilitates controlling the drive voltages of the blue-violet semiconductor laser device 10 and the red semiconductor laser device 20 while sufficiently reducing deterioration in the high frequency characteristics of the red semiconductor laser device 20 due to the influence of the insulating layer.

(3) Other Effects of Semiconductor Laser Apparatus

A plurality of semiconductor laser apparatuses 500 can be simultaneously fabricated by overlapping a wafer having a plurality of blue-violet semiconductor laser devices 10 thereon with a wafer having a plurality of red semiconductor laser devices 20 thereon. This improves the positioning accuracy of each of the blue-violet semiconductor laser devices 10 and each of the red semiconductor laser devices 20. This results in improved positioning accuracy of the emission points of the blue-violet semiconductor laser devices 10 and the red semiconductor laser devices 20.

In addition, the blue-violet semiconductor laser device 10 and the red semiconductor laser device 20 are disposed so that the p-side pad electrode 10a and the p-side pad electrode 20a are positioned opposite to each other. This brings the semiconductor layer of the blue-violet semiconductor laser device 10 and the semiconductor layer of the red semiconductor laser device 20 close to each other, allowing the emission points of the blue-violet semiconductor laser device 10 and the red semiconductor laser device 20 to approach each other. Thus, when the laser beams emitted from the blue-violet semiconductor laser device 10 and the red semiconductor laser device 20 pass through a converging lens, aberration due to the lens can be reduced.

(4) Correspondence Between Each Claim Element and Each Component in Embodiment In the third embodiment, the conductive layer 33 corresponds to a conductive layer; the current blocking layer 10c corresponds to a first current blocking layer; and each of the first current blocking layers 20c, 30c corresponds to a second current blocking layer.

4. Fourth Embodiment

(1) Configuration and Connection of Semiconductor Laser Apparatus

A semiconductor laser apparatus according to a fourth embodiment differs from the semiconductor laser apparatus 500 according to the first embodiment in configuration and operation as described below.

Figure 15:
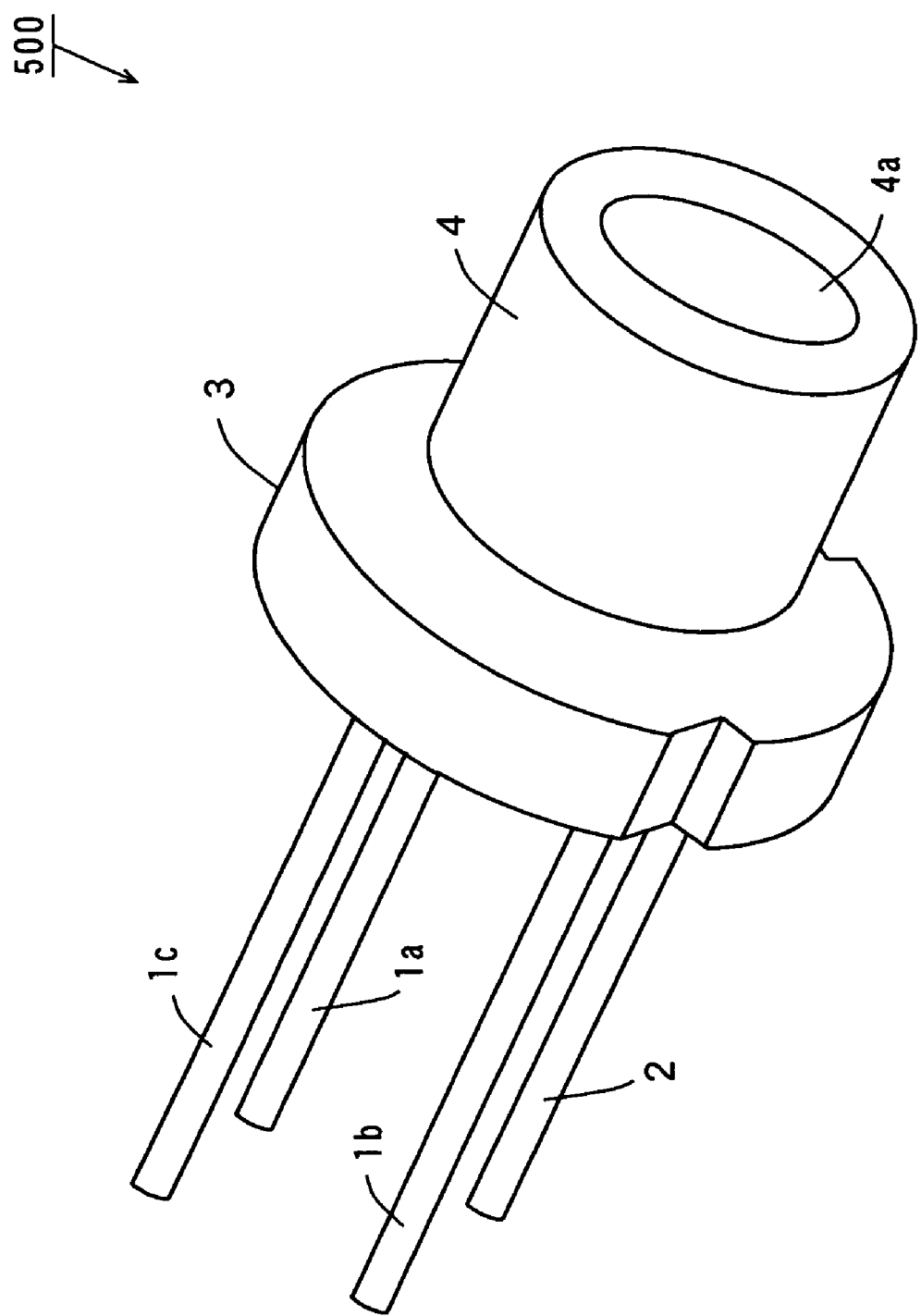
FIG. 15 is an external perspective view showing a semiconductor laser apparatus according to a fourth embodiment.

FIG. 15 is an external perspective view showing the semiconductor laser apparatus according to the fourth embodiment.

The semiconductor laser apparatus 500 according to the fourth embodiment in FIG. 15 further comprises a power supply pin 1c in addition to the semiconductor laser apparatus 500 according to the first embodiment.

Figure 16:
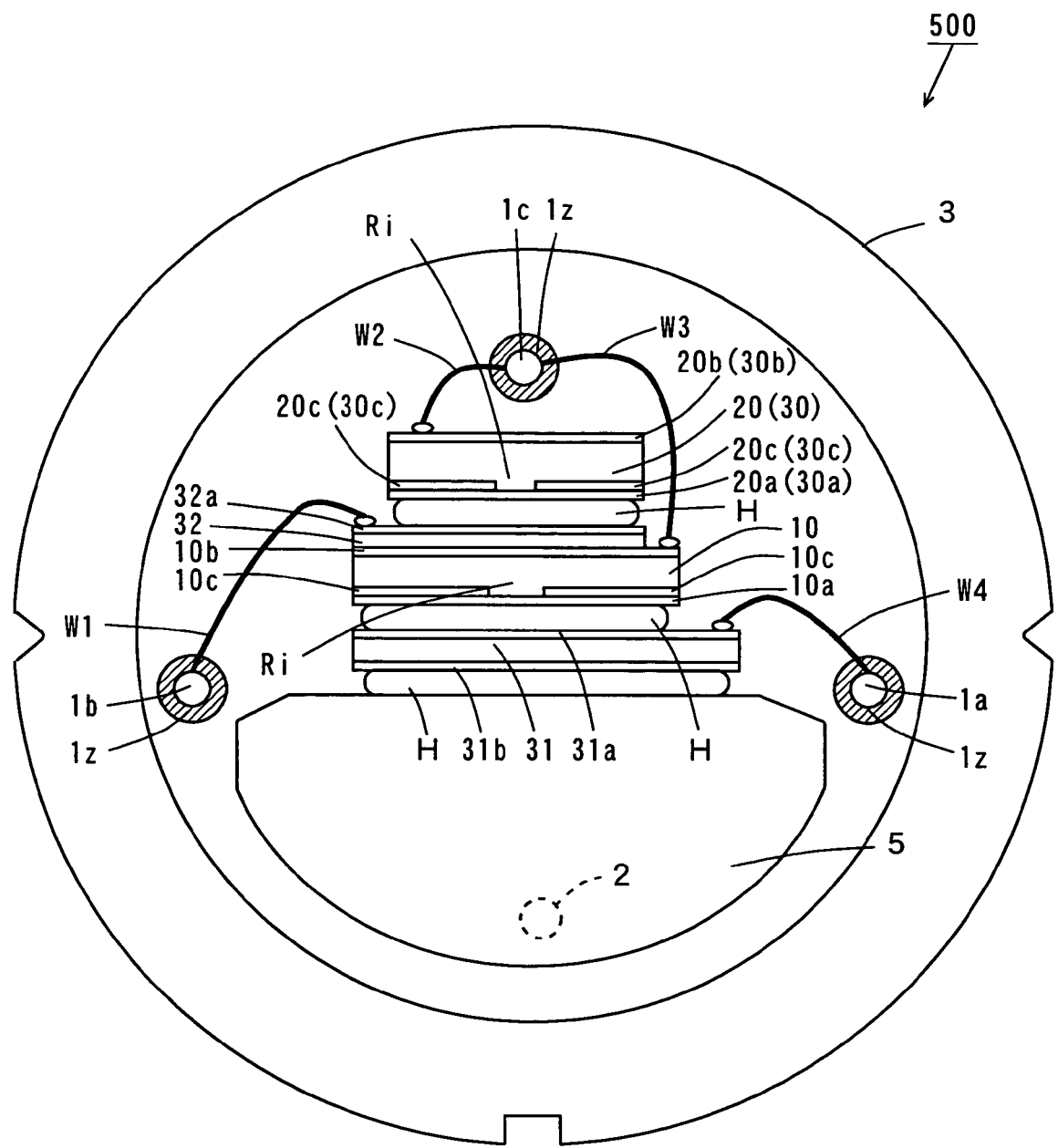
FIG. 16 is a schematic front view showing the semiconductor laser apparatus in FIG. 15 with a cover thereof being removed.
Figure 17:
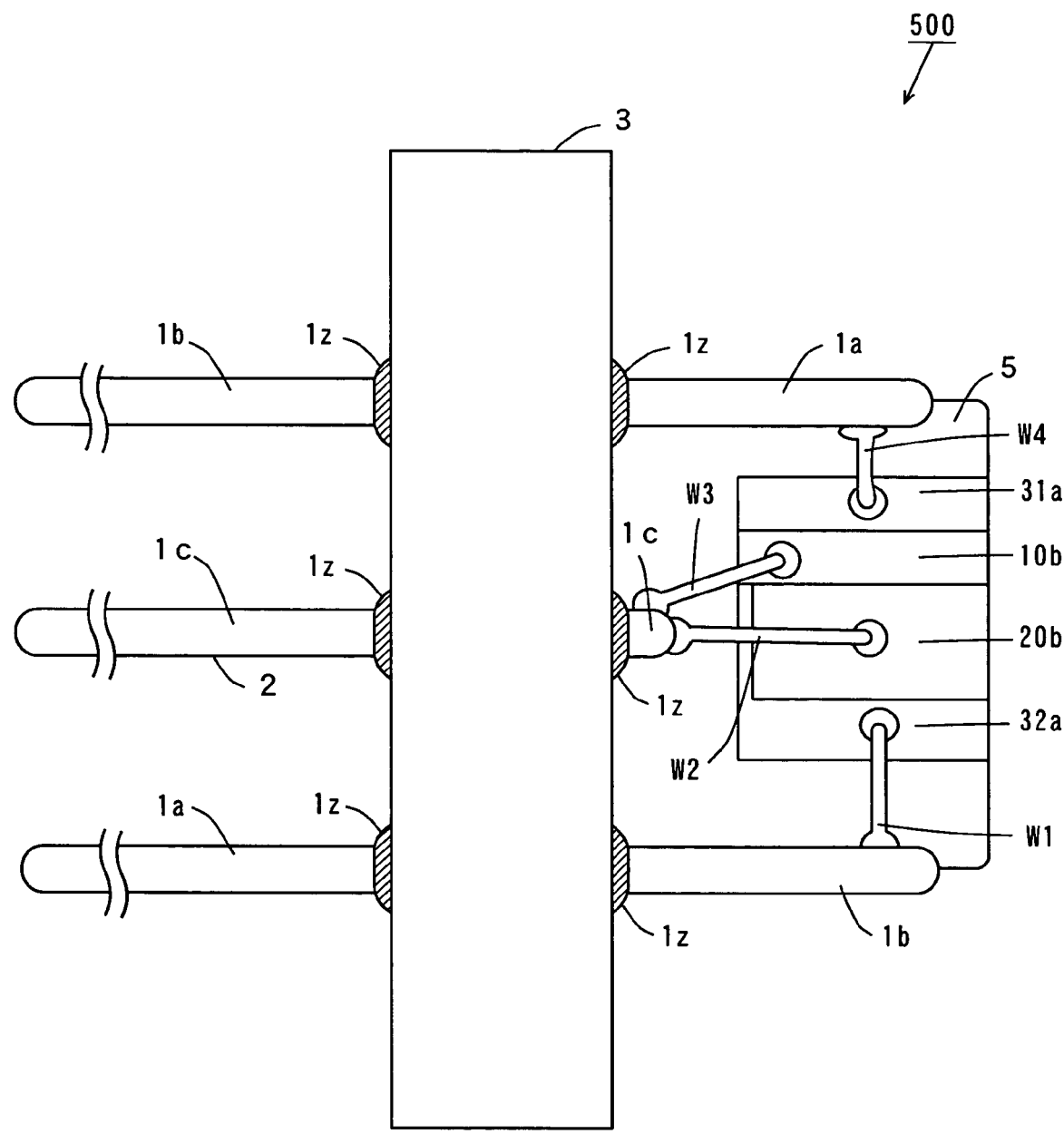
FIG. 17 is a schematic top view showing the semiconductor laser apparatus in FIG. 15 with the cover thereof being removed.

FIG. 16 is a schematic front view showing the semiconductor laser apparatus 500 in FIG. 15 with a cover 4 being removed, and FIG. 17 is a schematic top view showing the semiconductor laser apparatus 500 in FIG. 15 with the cover 4 being removed.

As shown in FIG. 16, similarly to the semiconductor laser apparatus 500 according to the first embodiment, a sub-substrate 31, a blue-violet semiconductor laser device 10, an insulating layer 32, and a red semiconductor laser device 20 are stacked in order through a plurality of fusion layers H on a conductive support member 5 integral with a package body 3.

In this embodiment also, the sub-substrate 31 has a conductive layer 31a on its upper surface and a conductive layer 31b on its lower surface. A conductive layer 32a is formed on the insulating layer 32.

As indicated by the parentheses in FIG. 16, an infrared semiconductor laser device 30 may be stacked on the blue-violet semiconductor laser device 10 instead of the red semiconductor laser device 20.

As shown in FIG. 16 and FIG. 17, each of the power supply pins 1a, 1b, 1c is electrically isolated from the package body 3 through an insulating ring 1z.

The power supply pin 1a is electrically connected to the conductive layer 31a on the sub-substrate 31 through a wire W4. This provides an electrical connection of the power supply pin 1a to a p-side pad electrode 10a of the blue-violet semiconductor laser device 10.

The power supply pin 1b is electrically connected to the conductive layer 21a on the insulating layer 32 through a wire W1. This provides an electrical connection of the power supply pin 1b to a p-side pad electrode 20a of the red semiconductor laser device 20.

The power supply pin 1c is electrically connected to an n-side pad electrode 20b of the red semiconductor laser device 20 through a wire 2W, and also electrically connected to an n-side pad electrode 10b of the blue-violet semiconductor laser device 10 through a wire W3. The power supply pin 1c thus functions as a common n-side pad electrode for the blue-violet semiconductor laser device 10 and the red semiconductor laser device 20. That is, a common cathode connection of the blue-violet semiconductor laser device 10 and the red semiconductor laser device 20 is achieved.

In the fourth embodiment, in particular, each of the blue-violet semiconductor laser device 10 and the red semiconductor laser device 20 is electrically isolated from the conductive support member 5. That is, the blue-violet semiconductor laser device 10 and the red semiconductor laser device 20 are connected in a floating state from the support member 5.

When voltages are applied between the power supply pins 1a and 1c and between the power supply pins 1b and 1c, respectively, the blue-violet semiconductor laser device 10 and the red semiconductor laser device 20 can be driven individually.

(2) Effects of Semiconductor Laser Apparatus

FIG. 18 is a circuit diagram showing electrical wiring of the semiconductor laser apparatus 500 according to the fourth embodiment.

As described above, the blue-violet semiconductor laser device 10 and the red semiconductor laser device 20 are both electrically isolated from the support member 5. This allows an arbitrary voltage to be applied to the power supply pin 1c.

For example, when driving the red semiconductor laser device 20, a ground potential is applied to the power supply pin 1c, and a voltage higher than the ground potential is applied to the power supply pin 1a. When, on the other hand, driving the blue-violet semiconductor laser device 10 that requires a drive voltage higher than that of the red semiconductor laser device 20, a negative voltage is applied to the power supply pin 1c, and a voltage equal to the drive voltage of the red semiconductor laser device 20 is applied to the power supply pin 1a.

The blue-violet semiconductor laser device 10 and the red semiconductor laser device 20 are thus electrically isolated from the support member 5. Besides, an arbitrary voltage can be applied to the power supply pin 1a that is electrically connected to the n-side pad electrode 10b of the blue-violet semiconductor laser device 10 and the n-side pad electrode 20b of the red semiconductor laser device 20, which facilitates controlling the drive voltage of each of the semiconductor laser devices.

In the fourth embodiment, the n-side pad electrode 10b of the blue-violet semiconductor laser device 10 and the n-side pad electrode 20b of the red semiconductor laser device 20 are electrically connected to each other while being electrically isolated from the support member 5. This allows voltages to be applied to the n-side pad electrode 10b of the blue-violet semiconductor laser device 10 and the n-side pad electrode 20b of the red semiconductor laser device 20, respectively.

(5) Fifth Embodiment (1) Configuration and Connection of Semiconductor Laser Apparatus A semiconductor laser apparatus according to a fifth embodiment differs from the semiconductor laser apparatus 500 according to the first embodiment in configuration and operation as described below. The semiconductor laser apparatus according to the fifth embodiment is externally similar to the semiconductor laser apparatus 500 in FIG. 15, and further comprises a power supply pin 1c in addition to the semiconductor laser apparatus 500 according to the first embodiment, similarly to the fourth embodiment.

Figure 19:
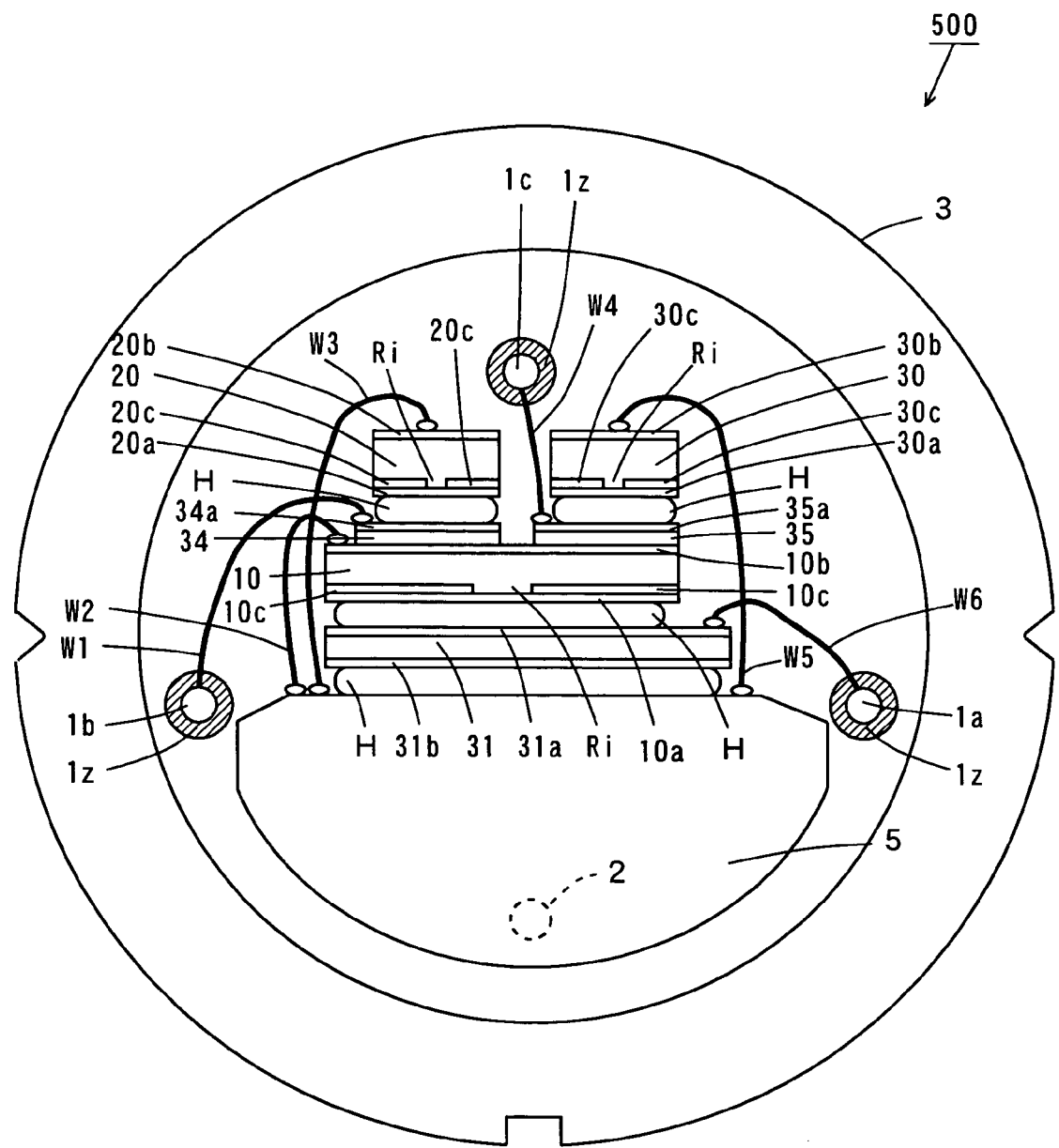
FIG. 19 is a schematic front view showing a semiconductor laser apparatus according to a fifth embodiment with a cover thereof being removed.

FIG. 19 is a schematic front view showing the semiconductor laser apparatus according to the fifth embodiment with a cover 4 being removed, and FIG. 20 is a schematic top view showing the semiconductor laser apparatus according to the fifth embodiment with the cover 4 being removed.

Similarly to the semiconductor laser apparatus 500 according to the first embodiment, a sub-substrate 31 and a blue-violet semiconductor laser device 10 are stacked in order on a conductive support member 5 integral with a package body 3 through a plurality of fusion layers H therebetween. In the fifth embodiment also, the sub-substrate 31 has a conductive layer 31a on its upper surface and a conductive layer 31b on its lower surface.

An insulating layer 34 made of $SiO_2$ is provided on a portion of an n-side pad electrode 10b (hereinafter referred to as a first insulating region) of the blue-violet semiconductor laser device 10. The thickness of the insulating layer 34 is herein defined as t34, details of which are described below. A conductive layer 34a containing Au is formed on the insulating layer 34.

Also, an insulating layer 35 made of $SiO_2$ is provided on a portion of the n-side pad electrode 10b, except the first insulating region, (hereinafter referred to as a second insulating region) of the blue-violet semiconductor laser device 10. The thickness of the insulating layer 35 is herein defined as t35, of which details are described below. A conductive layer 35a containing Au is formed on the insulating layer 35.

These first and second insulating regions are spaced from each other on the n-side pad electrode 10b. The conductive layer 34a on the insulating layer 34 and the conductive layer 35a on the insulating layer 35 are thus electrically isolated from each other.

A red semiconductor laser device 20 is bonded on the conductive layer 34a through a fusion layer H so that a p-side pad electrode 20a lies on the support member 5 side. An infrared semiconductor laser device 30 is bonded on the conductive layer 35a through a fusion layer H so that a p-side pad electrode 30a lies on the support member 5 side.

The blue-violet semiconductor laser device 10 in the fifth embodiment is about 700 μm wide (in the Y direction) and about 600 μm long (in the X direction). The red semiconductor laser device 20 is about 200 μm wide (in the Y direction) and about 600 μm long (in the X direction). The infrared semiconductor laser device 30 is about 200 μm wide (in the Y direction) and about 600 μm long (in the X direction).

Further, each of the insulating layers 34, 35 is about 300 μm wide (in the Y direction) and about 600 μm long (in the X direction), similarly to the insulating layer 32 in the first embodiment.

As shown in FIG. 19 and FIG. 20, each of power supply pins 1a, 1b, 1c is electrically isolated from the package body 3 through an insulating ring 1z.

The power supply pin 1a is electrically connected to the conductive layer 31a on the sub-substrate 31 through a wire W6. This provides an electrical connection of the power supply pin 1a to the p-side pad electrode 10a of the blue-violet semiconductor laser device 10.

The power supply pin 1b is electrically connected to the conductive layer 34a on the insulating layer 34 through a wire W1. This provides an electrical connection of the power supply pin 1b to the p-side pad electrode 20a of the red semiconductor laser device 20.

The power supply pin 1c is electrically connected to the conductive layer 35a on the insulating layer 35 through a wire W4. This provides an electrical connection of the power supply pin 1b to the p-side pad electrode 30a of the infrared semiconductor laser device 30.

An exposed portion of the upper surface of the support member 5 and the n-side pad electrode 10b of the blue-violet semiconductor laser device 10 are electrically connected through a wire W2, an exposed portion of the upper surface of the support member 5 and the n-side pad electrode 20b of the red semiconductor laser device 20 are electrically connected through a wire W3, and an exposed portion of the upper surface of the support member 5 and the n-side pad electrode 30b of the infrared semiconductor laser device 30 are electrically connected through a wire W5.

This provides an electrical connection of a power supply pin 2 to the n-side pad electrode 10b of the blue-violet semiconductor laser device 10, the n-side pad electrode 20b of the red semiconductor laser device 20, and the n-side pad electrode 30b of the infrared semiconductor laser device 30. That is, a common cathode connection of the blue-violet semiconductor laser device 10, the red semiconductor laser device 20, and the infrared semiconductor laser device 30 is achieved.

When voltages are applied between the power supply pins 1a and 2, between the power supply pins 1b and 2, and between the power supply pins 1c and 2, respectively, the blue-violet semiconductor laser device 10, the red semiconductor laser device 20, and the infrared semiconductor laser device 30 can be driven individually.

Figure 21:
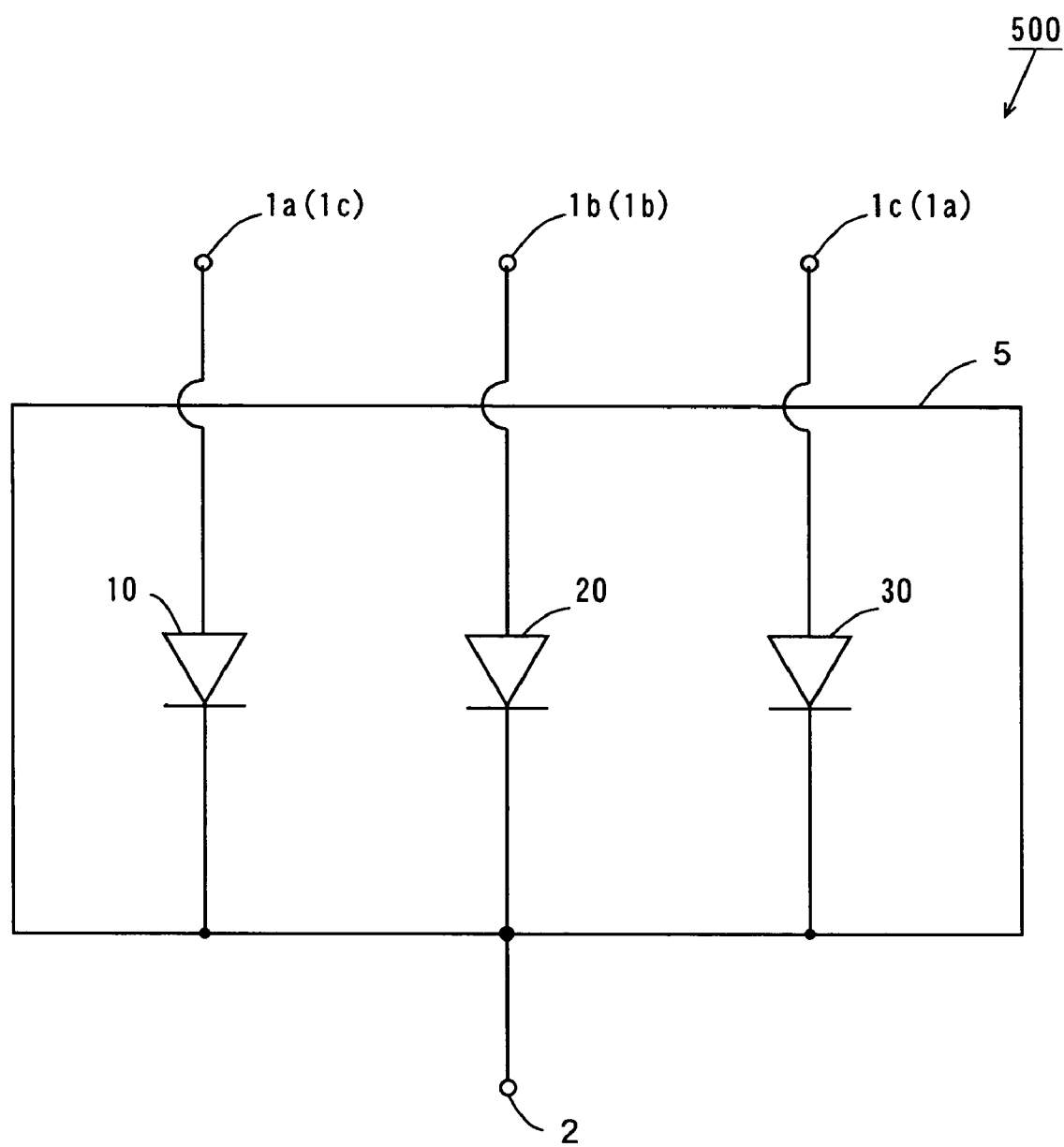
FIG. 21 is a circuit diagram showing electrical wiring of the semiconductor laser apparatus according to the fifth embodiment.

FIG. 21 is a circuit diagram showing electrical wiring of the semiconductor laser apparatus 500 according to the fifth embodiment.

As described above, the power supply pin 2 is electrically connected to the support member 5, and also electrically connected to the n-side pad electrode 10b of the blue-violet semiconductor laser device 10, the n-side pad electrode 20b of the red semiconductor laser device 20, and the n-side pad electrode 30b of the infrared semiconductor laser device 30.

On the other hand, the p-side pad electrode 10a of the blue-violet semiconductor laser device 10, the p-side pad electrode 20a of the red semiconductor laser device 20, and the p-side pad electrode 30a of the infrared semiconductor laser device 30 are electrically isolated from the support member 5, i.e., from the power supply pin 2.

In order to drive the blue-violet semiconductor laser device 10, therefore, it is necessary to apply a voltage higher than the ground potential at the power supply pin 2 to the power supply pin 1a. In order to drive the red semiconductor laser device 20, it is necessary to apply a voltage higher than the ground potential at the power supply pin 2 to the power supply pin 1b. In order to drive the infrared semiconductor laser device 30, it is necessary to apply a voltage higher than the ground potential at the power supply pin 2 to the power supply pin 1c.

By applying a voltage higher than the ground potential to any of the power supply pins 1a, 1b, 1c in this way, the blue-violet semiconductor laser device 10, the red semiconductor laser device 20, or the infrared semiconductor laser device 30 can be driven individually in the semiconductor laser apparatus 500 according to the fifth embodiment. As a result, the drive voltage of each of the semiconductor laser devices can be easily controlled.

(2) Functions of Sub-Substrate and Insulating Layer as Dielectrics and Effects Thereof In the fifth embodiment, when driving the blue-violet semiconductor laser device 10 by alternating voltage, the sub-substrate 31 functions as a dielectric. Similarly to the first embodiment, however, the thickness of the sub-substrate 31 is about 200 μm, which is significantly greater than a thickness of 0.5 μm for the current blocking layer 10c. Therefore, the influence of the sub-substrate 31 upon the blue-violet semiconductor laser device 10 is almost negligible.

When, on the other hand, driving the red semiconductor laser device 20 by alternating voltage, the insulating layer 34 functions as a dielectric. In the fifth embodiment, the shape of the first current blocking layer 20c is similar to that of the first current blocking layer 20c described in the first embodiment. The shape of the insulating layer 34 is also similar to that of the insulating layer 32 described in the first embodiment.

Therefore, the thickness t34 of the insulating layer 34 is preferably set to not less than 0.23 μm, more preferably not less than 0.46 μm, still more preferably not less than 1.20 μm.

When, on the other hand, driving the infrared semiconductor laser device 30 by alternating voltage, the insulating layer 35 functions as a dielectric. In the fifth embodiment, the shape of the first current blocking layer 30c is similar to that of the first current blocking layer 20c described in the first embodiment. The shape of the insulating layer 35 is also similar to that of the insulating layer 32 described in the first embodiment.

Therefore, the thickness t35 of the insulating layer 35 is preferably set to not less than 0.23 μm, more preferably not less than 0.46 μm, still more preferably not less than 1.20 μm.

The fifth embodiment describes the value of capacitance induced in the first current blocking layer 20c of the red semiconductor laser device 20 and the value of capacitance induced in the first current blocking layer 30c of the infrared semiconductor laser device 30 to be almost equal to each other.

When, however, the values of capacitances induced in the first current blocking layers 20c, 30c are greatly different from each other, the thicknesses t34, t35 may be set according to their respective values of capacitances.

(3) Other Effects of Semiconductor Laser Apparatus

In the fifth embodiment, the red semiconductor laser device 20 and the infrared semiconductor laser device 30 may be fabricated on the same substrate. The resultant monolithic structure of the red semiconductor laser device 20 and the infrared semiconductor laser device 30 allows a significant improvement in the accuracy of the interval between the red beam emission point of the red semiconductor laser device 20 and the infrared emission point of the infrared semiconductor laser device 30.

The semiconductor laser apparatus 500 according to the fifth embodiment comprises the blue-violet semiconductor laser device 10, the red semiconductor laser device 20, and the infrared semiconductor laser device 30. The semiconductor laser apparatus 500 is thus capable of emitting the laser beams of three kinds of wavelengths.

(4) Correspondence Between Each Claim Element and Each Component in Embodiment

In the fifth embodiment, each of the insulating layers 34, 35 corresponds to an insulating layer, and each of the conductive layers 34a, 35a corresponds to a conductive layer.

6. Sixth Embodiment (1) Configuration and Connection of Semiconductor Laser Apparatus A semiconductor laser apparatus according to a sixth embodiment differs from the semiconductor laser apparatus 500 according to the fifth embodiment in configuration and operation as described below. Similarly to the fifth embodiment, the semiconductor laser apparatus according to the sixth embodiment is externally similar to the semiconductor laser apparatus 500 in FIG. 15.

Figure 23:
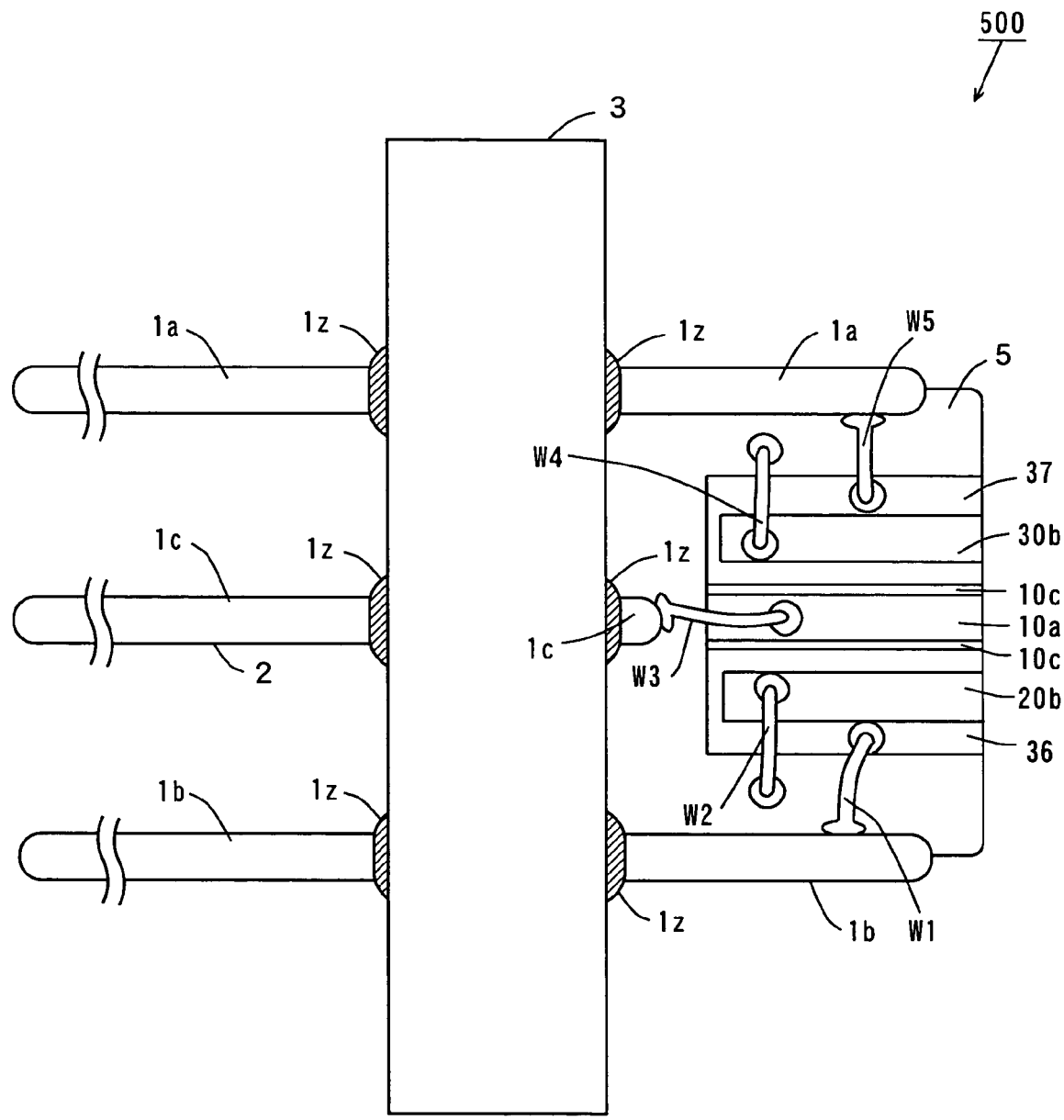
FIG. 23 is a schematic top view showing the semiconductor laser apparatus according to the sixth embodiment with the cover thereof being removed.

FIG. 22 is a schematic front view showing the semiconductor laser apparatus according to the sixth embodiment with a cover 4 being removed, and FIG. 23 is a schematic top view showing the semiconductor laser apparatus according to the sixth embodiment with the cover 4 being removed.

As shown in FIG. 22, a conductive fusion layer H is formed on a conductive support member 5 integral with a package body 3. A blue-violet semiconductor laser device 10 is bonded on the fusion layer H so that an n-side pad electrode 10b lies on the support member 5 side.

The blue-violet semiconductor laser device 10 in the sixth embodiment is about 800 μm wide (in the Y direction) and about 600 μm long (in the X direction).

A p-side pad electrode 10a of the blue-violet semiconductor laser device 10 is formed on a portion of a current blocking layer 10c. Similarly to the third embodiment, a ridge portion Ri of the blue-violet semiconductor laser device 10 is formed under the p-side pad electrode 10a. The current blocking layer 10c is made of $SiO_2$.

In the sixth embodiment, the portion where the p-side pad electrode 10a is formed is about one-fourth the size of the entire blue-violet semiconductor laser device 10 in the X-Y plane. For example, the p-side pad electrode 10a is about 200 μm wide (in the Y direction) and about 600 μm long (in the X direction).

Conductive layers 36, 37 containing Au are formed on other regions of the current blocking layer 10c at a distance from the p-side pad electrode 10a in the X-Y plane. The region where the conductive layer 36 is formed in the X-Y plane is referred to as a first conductive forming region. The region where the conductive layer 37 is formed in the X-Y plane is referred to as a second conductive forming region. The p-side pad electrode 10a is positioned between the first and second conductive forming regions in the Y direction.

Both of the conductive layers 36, 37 are about 300 μm wide (in the Y direction) and about 600 μm long (in the X direction).

A red semiconductor laser device 20 is bonded on the conductive layer 36 through a fusion layer H made of AuSn so that the p-side pad electrode 20a lies on the support member 5 side.

An infrared semiconductor laser device 30 is bonded on the conductive layer 37 through a fusion layer H made of AuSn so that the p-side pad electrode 30a lies on the support member 5 side.

As shown in FIG. 22 and FIG. 23, each of power supply pins 1a, 1b, 1c is electrically isolated from a package body 3 through an insulating ring 1z.

The power supply pin 1a is electrically connected to the conductive layer 37 through a wire W5. This provides an electrical connection of the power supply pin 1a to the p-side pad electrode 30a of the infrared semiconductor laser device 30.

The power supply pin 1b is electrically connected to the conductive layer 36 through a wire W1. This provides an electrical connection of the power supply pin 1b to the p-side pad electrode 20a of the red semiconductor laser device 20.

The power supply pin 1c is electrically connected to the p-side pad electrode 10a of the blue-violet semiconductor laser device 10 through a wire W3.

An exposed portion of the upper surface of the support member 5 and the n-side pad electrode 20b of the red semiconductor laser device 20 are electrically connected through a wire W2. An exposed portion of the upper surface of the support member 5 and the n-side pad electrode 30b of the infrared semiconductor laser device 30 are electrically connected through a wire W4.

In the sixth embodiment, the n-side pad electrode 10b of the blue-violet semiconductor laser device 10 is electrically connected on the support member 5 through the fusion layer H. This provides an electrical connection of a power supply pin 2 to then-side pad electrode 10b of the blue-violet semiconductor laser device 10, the n-side pad electrode 20b of the red semiconductor laser device 20, and the n-side pad electrode 30b of the infrared semiconductor laser device 30. That is, a common cathode connection of the blue-violet semiconductor laser device 10, the red semiconductor laser device 20, and the infrared semiconductor laser device 30 is achieved.

When voltages are applied between the power supply pins 1c and 2, between the power supply pins 1b and 2, and between the power supply pins 1a and 2, respectively, the blue-violet semiconductor laser device 10, the red semiconductor laser device 20, and the infrared semiconductor laser device 30 can be driven individually. The semiconductor laser apparatus 500 according to the sixth embodiment has electrical wiring similar to that shown in FIG. 21. The power supply pins according to the sixth embodiment are shown in parentheses in FIG. 21. Thus, in the semiconductor laser apparatus 500 according to the sixth embodiment also, the drive voltage of each of the semiconductor laser devices 10, 20, 30 can be easily controlled.

(2) Function of Current Blocking Layer as a Dielectric and Effects Thereof

When driving the blue-violet semiconductor laser device 10 by alternating voltage, the portion of the current blocking layer 10c where the p-side pad electrode 10a is formed functions as a dielectric.

Figure 24:
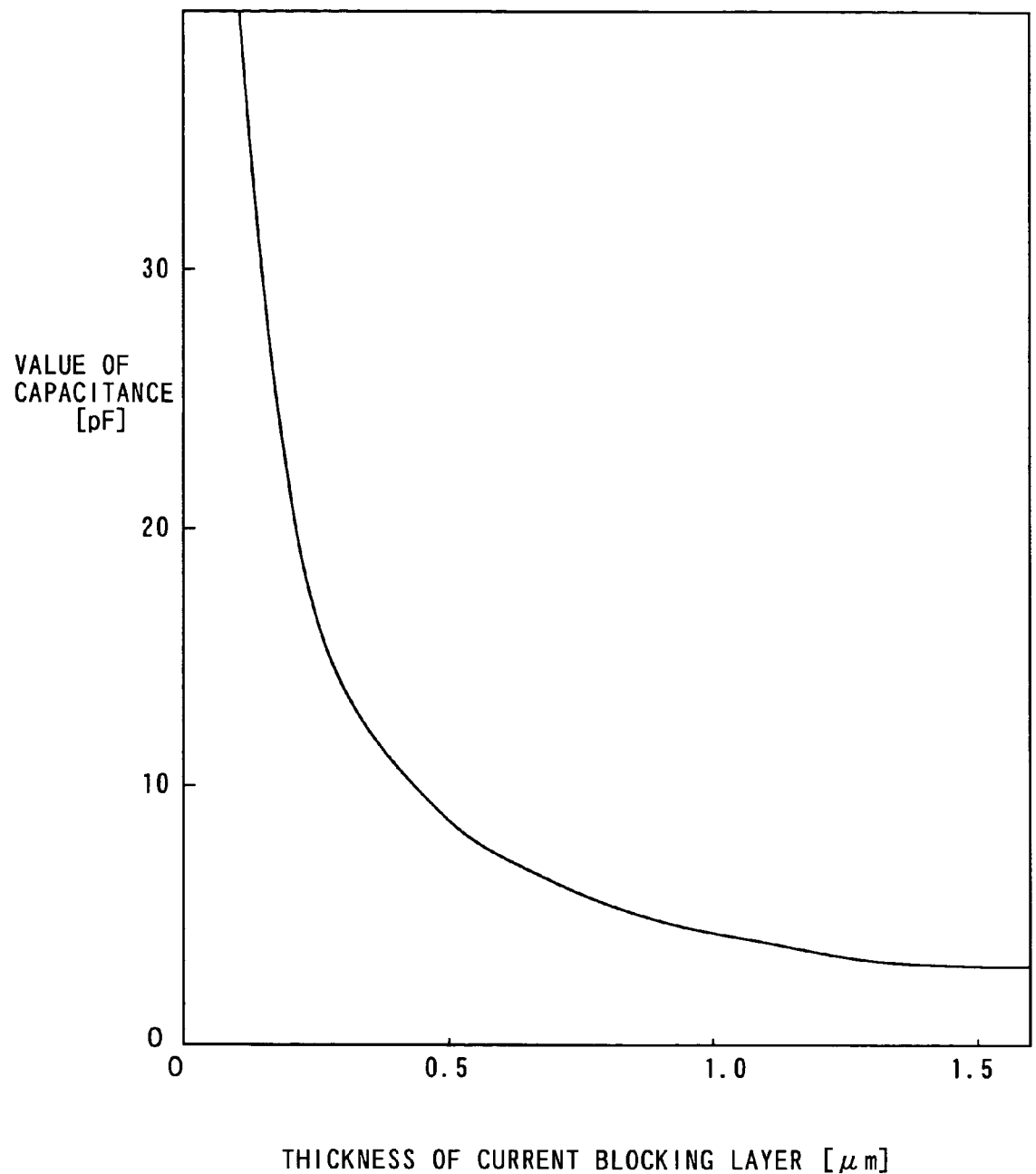
FIG. 24 is a graph showing the relationship between the value of capacitance induced in the current blocking layer when driving the blue-violet semiconductor laser device in FIG. 22 and the thickness of the current blocking layer.

FIG. 24 is a graph showing the relationship between the value of capacitance induced in the current blocking layer 10c when driving the blue-violet semiconductor laser device 10 in FIG. 22 and the thickness of the current blocking layer 10c. In FIG. 24, the ordinate indicates the value of capacitance, and the abscissa indicates the thickness of the current blocking layer 10c. As shown in the graph, the value of capacitance induced in the partly formed p-side pad electrode 10a varies according to the thickness of the current blocking layer 10c. Note that in the sixth embodiment, the thickness of the current blocking layer 10c differs depending on the thickness of each of first current blocking layers 20c, 30c mentioned below.

When driving the red semiconductor laser device 20 by alternating voltage, the current blocking layer 10c under the first conductive layer forming region functions as a dielectric. The shape of the first current blocking layer 20c in the sixth embodiment is similar to that of the first current blocking layer 20c described in the first embodiment. The current blocking layer 10c under the first conductive layer forming region has the width and the length equal to those of the conductive layer 36.

When driving the infrared semiconductor laser device 30 by alternating voltage, the current blocking layer 10c on the second conductive layer forming region functions as a dielectric. The shape of the first current blocking layer 30c in the sixth embodiment is similar to that of the first current blocking layer 30 described in the first embodiment. The current blocking layer 10c under the second conductive layer forming region has the width and the length equal to those of the conductive layer 37.

Accordingly, based on FIG. 6, the thickness of the current blocking layer 10c is preferably not less than 0.23 μm, more preferably not less than 0.46 μm, still preferably not less than 1.20 μm.

Setting the thickness of the current blocking layer 10c to not less than 0.23 μm, in particular, allows the value of capacitance induced in the current blocking layer 10c when driving the red semiconductor laser device 20 and the infrared semiconductor laser device 30 to be not more than about 28 pF based on FIG. 6. Accordingly, deterioration of the high frequency characteristics of each of the red semiconductor laser device 20 and the infrared semiconductor laser device 30 due to the influence of the current blocking layer 10c is sufficiently suppressed.

The value of capacitance induced in the current blocking layer 10c when driving the blue-violet semiconductor laser device 10 also is not more than about 20 pF based on FIG. 24, which further improves the high frequency characteristics of the blue-violet semiconductor laser device 10. Particularly since the cutoff frequency of the blue-violet semiconductor laser device 10 is set to not less than 600 MHz, the semiconductor laser apparatus 500 provides good performance when used in an optical pickup apparatus or the like.

Moreover, setting the thickness of the current blocking layer 10c to not less than 0.46 µm allows the value of capacitance induced in the current blocking layer 10c when driving the red semiconductor laser device 20 and the infrared semiconductor laser device 30 to be not more than about 14 pF. Accordingly, deterioration of the high frequency characteristics of each of the red semiconductor laser device 20 and the infrared semiconductor laser device 30 due to the influence of the current blocking layer 10c is suppressed more sufficiently.

In addition, setting the thickness of the current blocking layer 10c to not less than 1.20 µm allows the value of capacitance induced in the current blocking layer 10c when driving the red semiconductor laser device 20 and the infrared semiconductor laser device 30 to be not more than about 6 pF. Accordingly, deterioration of the high frequency characteristics of each of the red semiconductor laser device 20 and the infrared semiconductor laser device 30 due to the influence of the current blocking layer 10c is suppressed extremely sufficiently.

Furthermore, the value of capacitance induced in the current blocking layer 10c when driving the blue-violet semiconductor laser device 10 also is not more than about 4 pF, which significantly improves the high frequency characteristics of the blue-violet semiconductor laser device 10. The semiconductor laser apparatus 500 thus provides good performance when used in an optical pickup apparatus or the like.

The sixth embodiment describes the value of capacitance induced in the first current blocking layer 20c of the red semiconductor laser device 20 and the value of capacitance induced in the first current blocking layer 30c of the infrared semiconductor laser device 30 to be almost the same.

However, when the values of capacitances induced in the first current blocking layers 20c, 30c are greatly different from each other, the thicknesses of the first current blocking layers 20c, 30c may be set according to their respective capacitance values.

(3) Other Effects of Semiconductor Laser Apparatus

As described above, in the semiconductor laser apparatus 500 according to the sixth embodiment, the p-side pad electrode 10a of the blue-violet semiconductor laser device 10 is disposed opposite to the p-side pad electrode 20a of the red semiconductor laser device 20 and the p-side pad electrode 30a of the infrared semiconductor laser device 30.

This allows the emission points of the respective blue-violet semiconductor laser device 10, the red semiconductor laser device 20, and the infrared semiconductor laser device 30 to be disposed almost in a line in the Y-Z plane.

In the sixth embodiment, the red semiconductor laser device 20 and the infrared semiconductor laser device 30 may be fabricated on the same substrate. The resultant monolithic structure of the red semiconductor laser device 20 and the infrared semiconductor laser device 30 allows a significant improvement in the accuracy of the interval between the red beam emission point of the red semiconductor laser device 20 and the infrared emission point of the infrared semiconductor laser device 30.

(4) Correspondence Between Each Claim Element and Each Component in Embodiment

In the sixth embodiment, each of the conductive layers 36, 37 corresponds to a conductive layer, the current blocking layer 10c corresponds to a first current blocking layer, and each of the first current blocking layers 20c and 30c corresponds to a second current blocking layer.

7. Seventh Embodiment (1) Configuration of Semiconductor Laser Apparatus

A semiconductor laser apparatus according to a seventh embodiment comprises a first semiconductor laser device and a second semiconductor laser device. The first and second semiconductor laser devices emit laser beams having different wavelengths from each other.

A semiconductor laser device that emits a blue-violet laser beam (wavelength: around 400 nm), hereinafter referred to as a blue-violet semiconductor laser device, is used below as the first semiconductor laser device.

A semiconductor laser device that emits a red laser beam (wavelength: around 658 nm), hereinafter referred to as a red semiconductor laser device, is used as the second semiconductor laser device.

Figure 25:
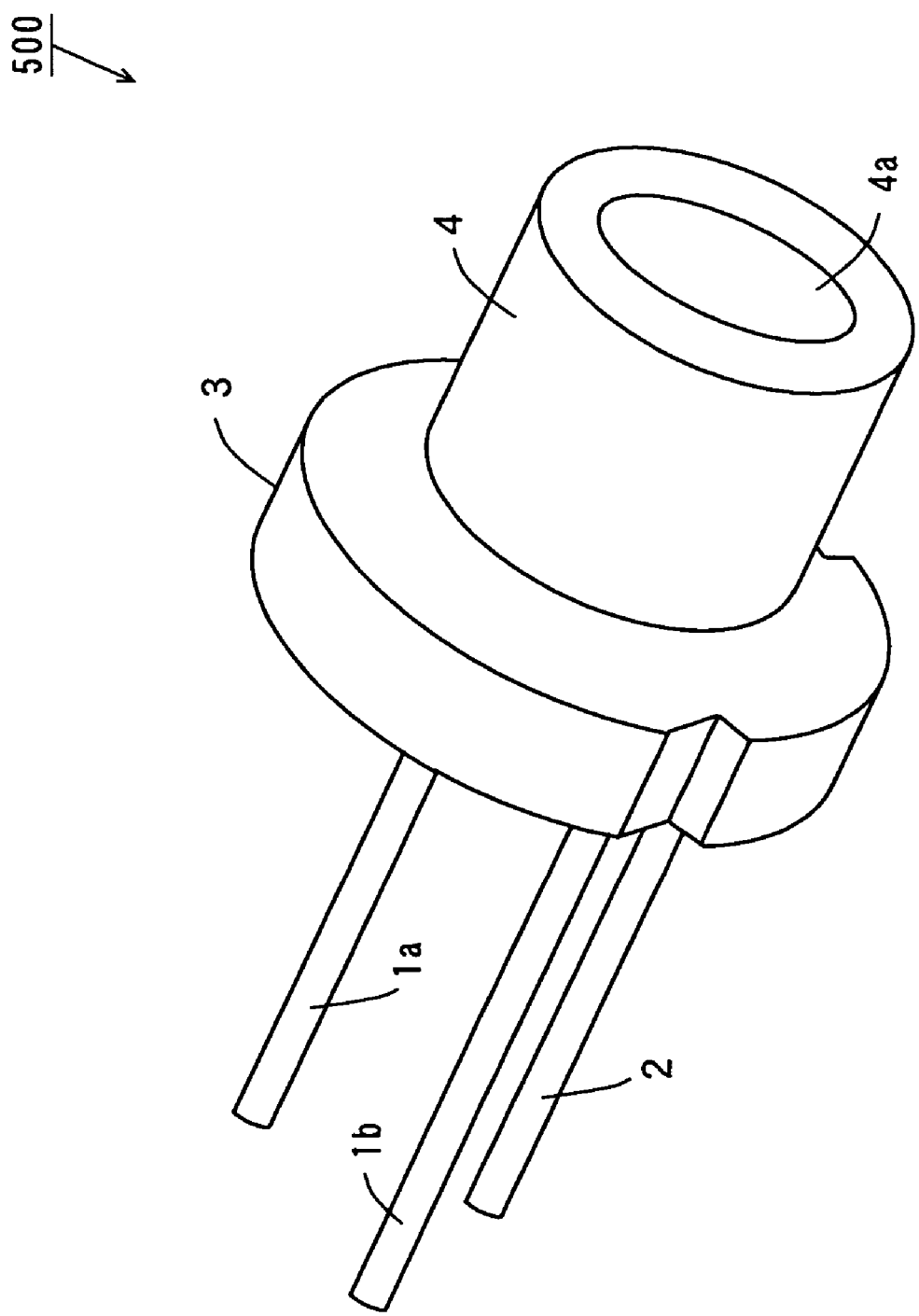
FIG. 25 is an external perspective view showing a semiconductor laser apparatus according to a seventh embodiment.

FIG. 25 is an external perspective view showing the semiconductor laser apparatus according to the seventh embodiment.

The semiconductor laser apparatus 500 in FIG. 25 comprises a conductive package body 3, power supply pins 1a, 1b, 2, and a cover 4.

A plurality of semiconductor laser devices described below are mounted on the package body 3, and sealed with the cover 4. The cover 4 is provided with an extraction window 4a. The extraction window 4a is made of a material that transmits laser beams. The power supply pin 2 is mechanically and electrically connected to the package body 3. The power supply pin 2 is used as a grounding terminal.

The semiconductor laser apparatus 500 will be described in detail. The "front" as mentioned below defines the direction in which the semiconductor laser devices emit laser beams.

Figure 26:
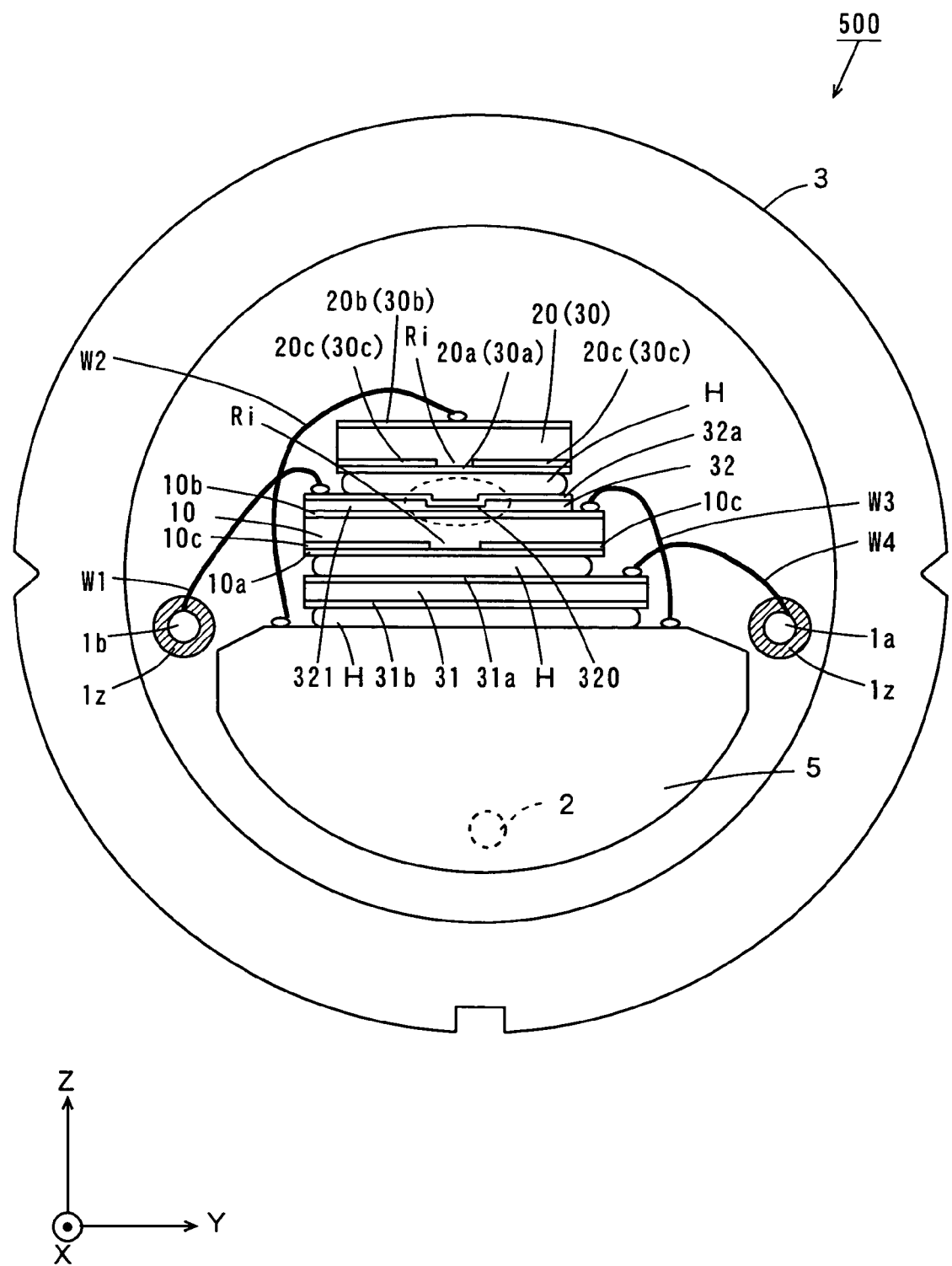
FIG. 26 is a schematic front view showing the semiconductor laser apparatus in FIG. 25 with a cover thereof being removed.
Figure 27:
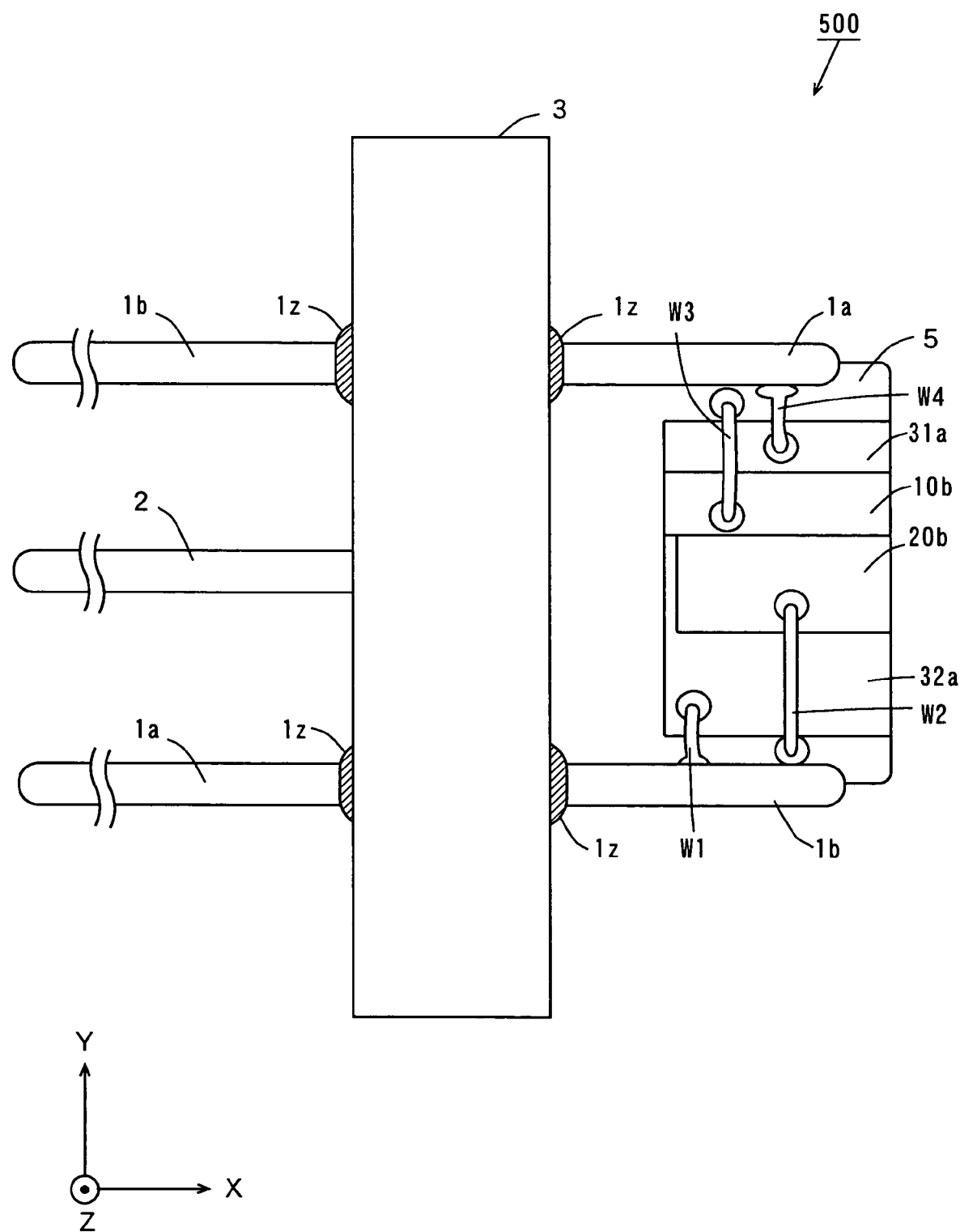
FIG. 27 is a schematic top view showing the semiconductor laser apparatus in FIG. 25 with the cover thereof being removed.
Figure 28:
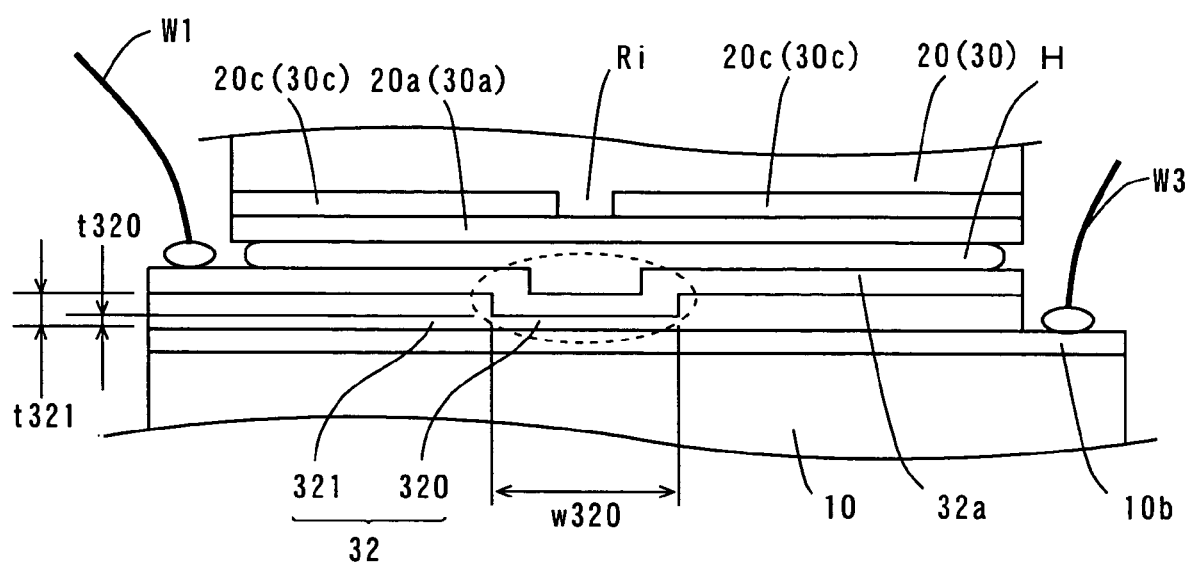
FIG. 28 is an enlarged front view of a portion of FIG. 26.

FIG. 26 is a schematic front view showing the semiconductor laser apparatus 500 in FIG. 25 with the cover 4 being removed, and FIG. 27 is a schematic top view showing the semiconductor laser apparatus 500 in FIG. 25 with the cover 4 being removed. FIG. 28 is an enlarged front view of a portion of FIG. 26.

As shown in FIG. 26 and FIG. 27, an X direction defines the direction in which the blue-violet semiconductor laser device 10 and the red semiconductor laser device 20 emit laser beams, and Y and Z directions define the two directions perpendicular to each other in a plane vertical to the X direction.

As shown in FIG. 26, a conductive fusion layer H is formed on a conductive support member 5 integral with the package body 3. The support member 5 is made of a material having good electrical conductivity and good thermal conductivity, and the fusion layer H is made of AuSn (gold-tin).

An insulating sub-substrate 31 having a conductive layer 31a on its upper surface and a conductive layer 31b on its lower surface is provided on the fusion layer H. The sub-substrate 31 is made of AlN (aluminum nitride). The sub-substrate 31 has a thickness of, e.g., about 200 μm. Each of the conductive layers 31a, 31b contains Au.

The blue-violet semiconductor laser device 10 is bonded on the conductive layer 31a of the sub-substrate 31 through a fusion layer H made of AuSn.

The blue-violet semiconductor laser device 10 has a laminated structure that includes a p-side pad electrode 10a, an n-side pad electrode 10b, and a current blocking layer 10c. The blue-violet semiconductor laser device 10 is disposed so that the p-side pad electrode 10a lies on the support member 5 side.

In FIG. 26, the n-side pad electrode 10b is positioned on an upper surface of the blue-violet semiconductor laser device 10, and the p-side pad electrode 10a is positioned on a lower surface thereof. The blue-violet semiconductor laser device 10 also has a ridge portion Ri that extends in the X direction on the p-side pad electrode 10a, and a current blocking layer 10c on the sides of the ridge portion Ri. The blue-violet semiconductor laser device 10 will be described in detail below.

An insulating layer 32 made of $SiO_2$ (silicon oxide) is provided on the n-side pad electrode 10b of the blue-violet semiconductor device 10. The red semiconductor laser device 20 is bonded on the insulating layer 32, as described below. The thickness (in the Z direction) of the insulating layer 32 below the ridge portion Ri of the bonded red semiconductor laser device 20 and the thickness of the remaining region of the insulating layer 32 are different.

A region including the ridge portion Ri of the semiconductor laser device and its vicinity will hereinafter be referred to as a ridge portion forming region. In FIG. 26, the portion of the insulating layer 32 that is positioned below the ridge portion forming region of the red semiconductor laser device 20 is surrounded by the dotted line.

The portion of the insulating layer 32 positioned below the ridge portion forming region of the red semiconductor laser device 20 is termed a "heat dissipation insulating layer 320". The remaining region of the insulating layer 32 is termed a "low capacitance insulating layer 321".

FIG. 28 shows an enlarged diagram of the ridge portion forming region. As shown in FIG. 28, the thickness of the low capacitance insulating layer 321 is defined as t321, and the thickness of the heat dissipation insulating layer 320 is defined as t320. The width (in the Y direction) of the heat dissipation insulating layer 320 is defined as w320.

The thickness t321 of the low capacitance insulating layer 321 and the thickness t320 of the heat dissipation insulating layer 320 as well as the width w320 of the heat dissipation insulating layer 320 will be described in detail below.

A conductive layer 32a containing Au is formed on the insulating layer 32. The red semiconductor laser device 20 is bonded on the conductive layer 32a through a fusion layer H of AuSn.

The red semiconductor laser device 20 has a laminated structure that includes a p-side pad electrode 20a, an n-side pad electrode 20b, and a first current blocking layer 20c. The red semiconductor laser device 20 is disposed so that the p-side pad electrode 20a lies on the support member 5 side.

In FIG. 26, the n-side pad electrode 20b is positioned on an upper surface of the red semiconductor laser device 20, and the p-side pad electrode 20a is positioned on a lower surface thereof. The red semiconductor laser device 20 has the ridge portion Ri that extends in the X direction on the p-side pad electrode 20a, and a first current blocking layer 20c on the sides of the ridge portion Ri.

The ridge portion Ri of the red semiconductor laser device 20 is disposed above the region where the heat dissipation insulating layer 320 is formed. Therefore, in this embodiment, the ridge portion forming regions of the blue-violet semiconductor laser device 10 and the red semiconductor laser device 20 coincide with each other in the Y direction. The red semiconductor laser device 20 will be described below.

The blue-violet semiconductor laser device 10 is positioned on a central portion of the extraction window 4a (see FIG. 25) of the cover 4.

(2) Connection of Semiconductor Laser Apparatus

As shown in FIG. 26 and FIG. 27, each of the power supply pins 1a, 1b is electrically isolated from the package body 3 through an insulating ring 1z. The power supply pin 1a is electrically connected to the conductive layer 31a on the sub-substrate 31 through a wire W4. The power supply pin 1b is electrically connected to the conductive layer 32a on the insulating layer 32 through a wire W1.

On the other hand, an exposed portion of the upper surface of the support member 5 is electrically connected to the n-side pad electrode 10b of the blue-violet semiconductor laser device 10 through a wire W3, and an exposed portion of the upper surface of the support member 5 is electrically connected to the n-side pad electrode 20b of the red semiconductor laser device 20 through a wire W2. This provides for an electrical connection of a power supply pin 2 to the n-side pad electrode 10b of the blue-violet semiconductor laser device 10 and the n-side pad electrode 20b of the red semiconductor laser device 20. That is, a common cathode connection of the blue-violet semiconductor laser device 10 and the red semiconductor laser device 20 is achieved.

When a voltage is applied between the power supply pins 1a and 2, the blue-violet semiconductor laser device 10 can be driven individually. When a voltage is applied between the power supply pins 1b and 2, the red semiconductor laser device can be drive individually. The semiconductor laser apparatus 500 is thus capable of selectively emitting two kinds of laser beams, i.e., the blue-violet laser beam and the red laser beam.

(3) Dimension of Insulating Layer

As described above, with the insulating layer 32, the thickness t321 of the low capacitance insulating layer 321 and the thickness t320 of the heat dissipation insulating layer 320 are different. Note that the thickness t320 of the heat dissipation insulating layer 320 is preferably about not more than half the thickness t321 of the low capacitance insulating layer 321.

In the semiconductor laser apparatus 500, the thickness t321 of the low capacitance insulating layer 321 is, e.g., 0.3 μm. It is thus preferred that the thickness t320 of the heat dissipation insulating layer 320 is not more than 0.15 μm. In this embodiment, the thickness t320 of the heat dissipation insulating layer 320 is set to, e.g., 0.05 μm.

The width 320 of the heat dissipation insulating layer 320 is preferably about not less than twice the width of the ridge portion Ri of the red semiconductor laser red semiconductor laser device 20, and preferably about not more than one-tenth of the width of the insulating layer 32 and the conductive layer 32a.

In the semiconductor laser apparatus 500, the width of the ridge portion Ri of the red semiconductor laser device 20 is about 2.5 µm as described below. It is thus preferred that the width w320 of the heat dissipation insulating layer 320 is not less than 5 µm.

The width of the insulating layer 32 and the conductive layer 32a in the Y direction is about 300 µm. It is thus preferred that the width w320 of the heat dissipation insulating layer 320 is not more than 30 µm. In this embodiment, the width w320 of the heat dissipation insulating layer 320 is set to, e.g., 15 µm.

(4) Effects of Heat Dissipation Capability

When driving the blue-violet semiconductor laser device 10 in the semiconductor laser apparatus 500, the ridge portion Ri of the blue-violet semiconductor laser device 10 and a semiconductor layer (i.e., the MQW active layer 104 mentioned below) positioned below the ridge portion Ri mainly generate heat. The heat generated from the blue-violet semiconductor laser device 10 is transmitted to the support member 5 via the fusion layer H, the sub-substrate 31, and the conductive layers 31a, 31b for dissipation.

When driving the red semiconductor laser device 20, the ridge portion Ri of the red semiconductor laser device 20 and a semiconductor layer (i.e., the MQW active layer 204 mentioned below) positioned below the ridge portion Ri mainly generate heat. The heat generated from the red semiconductor laser device 20 is transmitted to the support member 5 via the fusion layer H, the sub-substrate 31, and the conductive layers 31a, 31b for dissipation.

In this way, the heat generated from the red semiconductor laser device 20 is transmitted to the support member 5 via the path longer than that for the heat from the blue-violet semiconductor laser device 10 by the amount of the insulating layer 32 and the blue-violet semiconductor laser device 10. The red semiconductor laser device 20 accordingly has heat dissipation capability poorer than that of the blue-violet semiconductor laser device 10.

Note that the blue-violet semiconductor laser device 10 includes a nitride-based semiconductor as described below. Nitride-based semiconductors, in general, are known to have high thermal conductivities. For example, GaN for use as a nitride-based semiconductor has a thermal conductivity of about 130 W/m/K.

In contrast, the insulating layer 32 for interrupting electrical connection has a thermal conductivity lower than those of nitride-based semiconductors. For example, $SiO_2$ for use as the insulating layer 32 has a thermal conductivity of about 1.5 W/m/K.

In this embodiment, the thin heat dissipation insulating layer 320 is disposed below the ridge portion forming region of the red semiconductor laser device 20, and the low capacitance insulating layer 321 thicker than the heat dissipation insulating layer 320 is disposed on the remaining region.

This allows the heat generated from the ridge portion Ri of the red semiconductor laser device 20 and the semiconductor layer (i.e., MQW active layer below) that is positioned below the ridge portion Ri is efficiently transmitted to the blue-violet semiconductor laser device 10 by passing the thin heat dissipation insulating layer 320.

That is, the thin heat dissipation insulating layer 320 ensures electrical isolation between the blue-violet semiconductor laser device 10 and the red semiconductor laser device 20 while improving the heat dissipation capability of a portion of the red semiconductor laser device 20.

As shown in FIG. 28, since the thickness of the heat dissipation insulating layer 320 and the thickness of the low capacitance insulating layer 321 are different from each other, the insulating layer 32 has a recess in an upper surface side thereof. Accordingly, the conductive layer 32a that is formed along the upper surface of the insulating layer 32 also has a recess.

When bonding the red semiconductor laser device 20 on the blue-violet semiconductor laser device 10, the fusion layer H is formed on the conductive layer 32a as described above. At this time, the recess of the conductive layer 32a is completely filled with the fusion layer H.

This sufficiently prevents the generation of voids between the blue-violet semiconductor laser device 10 and the red semiconductor laser device 20. As a result, the heat generated from the red semiconductor laser device 20 is efficiently transmitted to the blue-violet semiconductor laser device 10 via the fusion layer H.

As described above, in this embodiment, the thin heat dissipation insulating layer 320 is disposed only below the ridge portion forming region, and the low capacitance insulating layer 321 is disposed on the remaining region. The reason for this will be described below.

(5) Electrical Wiring of Semiconductor Laser Apparatus

Figure 29:
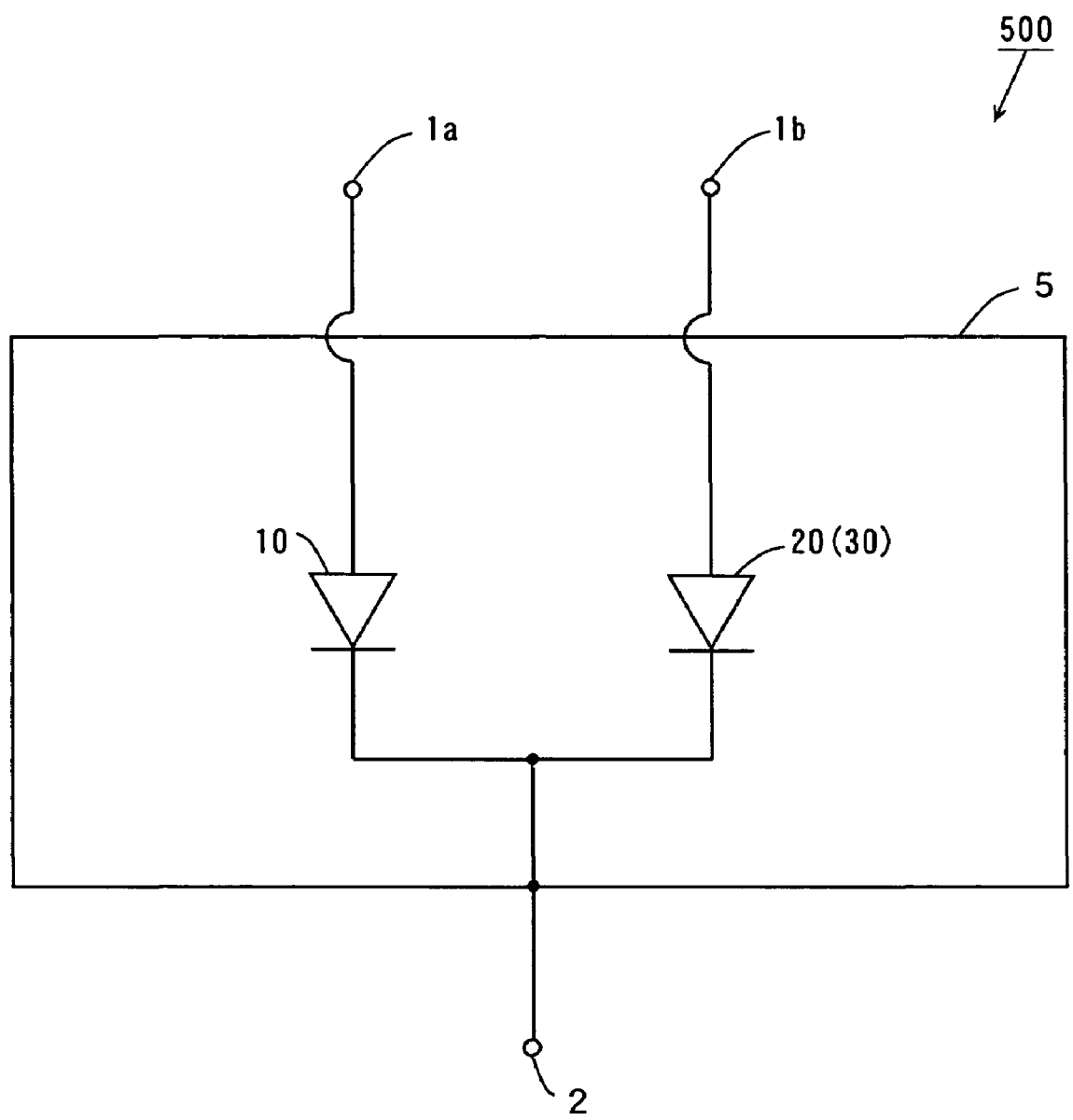
FIG. 29 is a circuit diagram showing electrical wiring of the semiconductor laser apparatus according to the seventh embodiment.

FIG. 29 is a circuit diagram showing electrical wiring of the semiconductor laser apparatus 500 according to the seventh embodiment.

As described above, the power supply pin 2 is electrically connected to the support member 5, and also electrically connected to the n-side pad electrode 10b of the blue-violet semiconductor laser device 10 and the n-side pad electrode 20b of the red semiconductor laser device 20.

On the other hand, the p-side pad electrode 10a of the blue-violet semiconductor laser device 10 and the p-side pad electrode 20a of the red semiconductor laser device 20 are electrically isolated from the support member 5, i.e., from the power supply pin 2.

In the semiconductor laser apparatus 500 according to the seventh embodiment, when a voltage higher than the ground potential is applied to either of the power supply pins 1a, 1b, the blue-violet semiconductor laser device 10 and the red semiconductor laser device 20 can be driven individually. As a result, the drive voltage of each of the semiconductor laser devices can be easily controlled.

(6) Functions of Sub-Substrate and Insulating Layer as Dielectrics and Effects Thereof By the way, the aforementioned semiconductor laser apparatus 500 is mounted in, e.g., an optical pickup apparatus. Optical pickup apparatuses, in general, are driven by alternating voltage. That is, the blue-violet semiconductor laser device 10 and the red semiconductor laser device 20 are driven by alternating voltage. In this case, each of the sub-substrate 31 and the insulating layer 32 in FIG. 26 functions as a dielectric.

Figure 30:
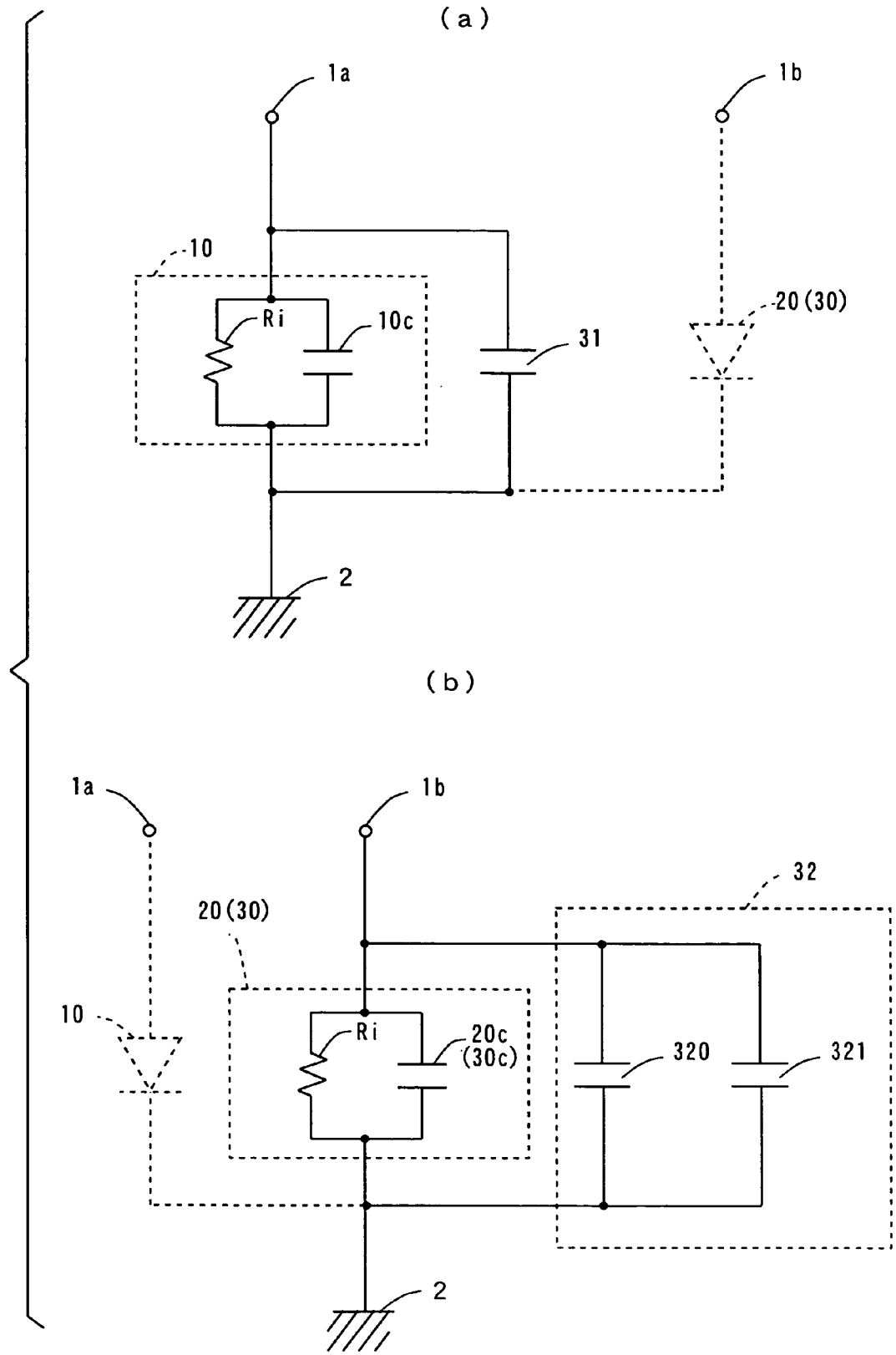
FIGS. 30 (a) and 30 (b) are equivalent circuit diagrams for use in illustrating the functions of the sub-substrate and the insulating layer in FIG. 26 as dielectrics.

FIG. 30 is an equivalent circuit diagram for use in illustrating the function of each of the sub-substrate 31 and the insulating layer 32 in FIG. 26 as a dielectric.

FIG. 30 (a) shows the equivalent circuit diagram in the case of driving the blue-violet semiconductor laser device 10, and FIG. 30 (b) shows the equivalent circuit diagram in the case of driving the red semiconductor laser device 20.

When the blue-violet semiconductor laser device 10 is driven by alternating voltage, the blue-violet semiconductor laser device 10 is represented by FIG. 30 (a), where the ridge portion Ri is a resistance, and the current blocking layer 10c is a dielectric. In this case, the insulating sub-substrate 31 functions as a dielectric that is connected in parallel with the blue-violet semiconductor laser device 10.

The value of capacitance induced in an insulating layer is generally given by the equation shown below:

$$C1 = \varepsilon s \cdot \varepsilon 0 \cdot S/d \tag{3}$$

where C1 is the value of capacitance induced in the insulating layer; $\varepsilon s$ is the relative dielectric constant of the insulating layer; $\varepsilon 0$ is the dielectric constant of vacuum; S is the area of the insulating layer; and d is the thickness of the insulating layer.

In the seventh embodiment, the current blocking layer 10c as the insulating layer has a thickness of 0.5 μm (in the Z direction). The blue-violet semiconductor laser device 10 has a width of, e.g., about 350 μm (in the Y direction) and a length of, e.g., about 600 μm (in the X direction).

The relative dielectric constant of the current blocking layer 10c of $SiO_2$ is four, and the vacuum dielectric constant is $8.854 \times 10^{-12}$ F/m.

The width of the ridge portion Ri (in the Y direction) formed in the blue-violet semiconductor laser device 10 is much smaller than the width of the blue-violet semiconductor laser device 10. Thus, the current blocking layer 10c is set to be 0.5 μm thick, 350 μm wide, and 600 μm long. The value of capacitance induced in this current blocking layer 10c is about 15 pF based on the equation (3).

On the other hand, the sub-substrate 31 has a thickness of about 200 μm, a width of about 450 μm (in the Y direction) and a length of about 600 μm (in the X direction), the value of capacitance induced in the sub-substrate 31 when driving the blue-violet semiconductor laser device 10 is about 100 fF based on the equation (3).

As described above, in the seventh embodiment, the value of capacitance induced in the sub-substrate 31 is much smaller than the value of capacitance induced in the current blocking layer 10c of the blue-violet semiconductor laser device 10.

Therefore, when driving only the blue-violet semiconductor laser device 10, the sum of the values of capacitances induced in the sub-substrate 31 and the current blocking layer 10c (hereinafter referred to as a value of effective capacitance) is almost equal to the value of capacitance induced in the current blocking layer 10c.

The cutoff frequency of the blue-violet semiconductor laser device 10 is determined based on the value of effective capacitance. The higher the cutoff frequency, the better the high frequency characteristics during the drive of a semiconductor laser device.

The cutoff frequency of a semiconductor laser device is simply represented by the equation shown below:

$$fT = \frac{1}{2\pi\sqrt{LC}} \tag{4}$$

where fT is the cutoff frequency of the semiconductor laser device; L is the inductance of the semiconductor laser device; and C is the value of effective capacitance during the drive of the semiconductor laser device.

In this case, as represented by the equation (4), the cutoff frequency of the blue-violet semiconductor laser device 10 is inversely proportional to the half power of the value of effective capacitance. Accordingly, the smaller the value of effective capacitance of the blue-violet semiconductor laser device 10, the higher the cutoff frequency thereof.

When the value of capacitance induced in the sub-substrate 31 is much smaller than that induced in the current blocking layer 10c as described above, the decrease in the cutoff frequency due to the influence of the sub-substrate 31 is sufficiently reduced. As a result, deterioration in the high frequency characteristics of the blue-violet semiconductor laser device 10 due to the influence of the sub-substrate 31 is sufficiently reduced.

When, on the other hand, driving only the red semiconductor laser device 20 by alternating voltage, the red semiconductor laser device 20 is represented by FIG. 30 (b), where the ridge portion Ri is a resistance, and the first current blocking layer 20c is a dielectric. In this case, the insulating layer 32 functions as a dielectric that is connected in parallel with the red semiconductor laser device 20.

In the seventh embodiment, the first current blocking layer 20c that serves as a depletion layer has a thickness of 0.5 μm (in the Z direction). The red semiconductor laser device 20 is about 200 μm wide (in the Y direction) and about 600 μm long (in the X direction). Note that the first current blocking layer 20c serving as the depletion layer is made of AlInP.

The width of the ridge portion Ri (in the Y direction) formed in the red semiconductor laser device 20 is much smaller than the width of the red semiconductor laser device 20. Thus, the first current blocking layer 20c is set to be 0.5 μm thick, 200 μm wide, and 600 μm long. The relative dielectric constant of AlInP is about 13. In this case, the value of capacitance induced in the first current blocking layer 20c is about 28 pF based on the equation (3).

Note that the dimension of the insulating layer 32 is set so that the value of capacitance induced in the insulating layer 32 is not more than the value of capacitance induced in the first current blocking layer 20c.

As described above, the insulating layer 32 comprises the heat dissipation insulating layer 320 that extends below the ridge portion forming region in the X direction and the low capacitance insulating layer 321 that extends on the remaining region which are aligned in the Y direction.

Accordingly, the heat dissipation insulating layer 320 and the low capacitance insulating layer 321 both function as dielectrics that are connected in parallel with the red semiconductor laser device 20.

Thus, the value of capacitance induced in the insulating layer 32 comprising the heat dissipation insulating layer 320 and the low capacitance insulating layer 321 is represented by the equation shown below:

$$C32 = C320 + C321 \tag{5}$$

where C32 is the value of capacitance induced in the insulating layer 32; C320 is the value of capacitance induced in the heat dissipation insulating layer 320; and C321 is the value of capacitance induced in the low capacitance insulating layer 321.

Further, the value of capacitance C320 in the equation (5) that is induced in the layer 320 is represented as follows using the equation (3):

$$C320 = \varepsilon s1 \varepsilon 0 \cdot Sa/da \tag{6}$$

where $\varepsilon s1$ is the relative dielectric constant of the insulating layer 32; Sa is the area of the heat dissipation insulating layer 320; and da is the thickness of the heat dissipation insulating layer 320.

In the seventh embodiment, the heat dissipation insulating layer 320 has a thickness t320 of 0.05 μm. The heat dissipation insulating layer 320 has a width w320 of 15 μm and a length of about 600 μm. The relative dielectric constant of the insulating layer 32 of $SiO_2$ is four. In this case, the value of capacitance induced in the heat dissipation insulating layer 320 is about 6 pF based on the equation (6).

Further, the value of capacitance C321 in the equation (5) that is induced in the low capacitance insulating layer 321 is represented as follows using the equation (3):

$$C321 = \in s1 \cdot \in 0 \cdot Sb/db \quad (7)$$

where ∈s1 is the dielectric constant of the insulating layer 32; Sb is the area of the low capacitance insulating layer 321; and db is the thickness of the low capacitance insulating layer 321.

In the seventh embodiment, the low capacitance insulating layer 321 has a thickness t321 of 0.3 μm, a width w321 of 285 μm, and a length of about 600 μm. In this case, the value of capacitance induced in the low capacitance insulating layer 321 is about 20 pF based on the equation (7).

Accordingly, the value of capacitance induced in the insulating layer 32 in the seventh embodiment is about 26 pF based on the equation (5).

In the seventh embodiment as described above, each of the heat dissipation insulating layer 320 and the low capacitance insulating layer 321 has the aforementioned dimension, so that the value of capacitance induced in the insulating layer 32 is not more than the value of capacitance induced in the first current blocking layer 20c of the red semiconductor laser device 20.

The value of effective capacitance in this case corresponds to the sum of the value of capacitance induced in the first current blocking layer 20c and the value of capacitance induced in the insulating layer 32, i.e., not more than twice the value of capacitance induced in the first current blocking layer 20c.

Based on the equation (4), the cutoff frequency of the red semiconductor laser device 20 is inversely proportional to the half power of the value of effective capacitance. As a result, when the value of capacitance induced in the insulating layer 32 is not more than the value of capacitance induced in the first current blocking layer 20c, the decrease in the cutoff frequency of each of the red semiconductor laser device 20 and the infrared semiconductor laser device 30 can be suppressed to a maximum of about 30% of the cutoff frequency thereof without the insulating layer 32.

As described above, by setting the dimension of the insulating layer 32 so that the value of capacitance induced in the insulating layer 32 is not more than the value of capacitance induced in the first current blocking layer 20c, the decrease in the cutoff frequency of the red semiconductor laser device 20 due to the influence of the insulating layer 32 is sufficiently reduced. That is, deterioration in the high frequency characteristics of the red semiconductor laser device 20 is sufficiently reduced.

In addition, when driving the blue-violet semiconductor laser device 10 by alternating voltage, the n-side pad electrode 10b in contact with the insulating layer 32 is grounded. Accordingly, the cutoff frequency of the blue-violet semiconductor laser device 10 is almost unaffected by the influence of the insulating layer 32.

(7) Details of Configuration of Blue-Violet Semiconductor Laser Device

Figure 31:
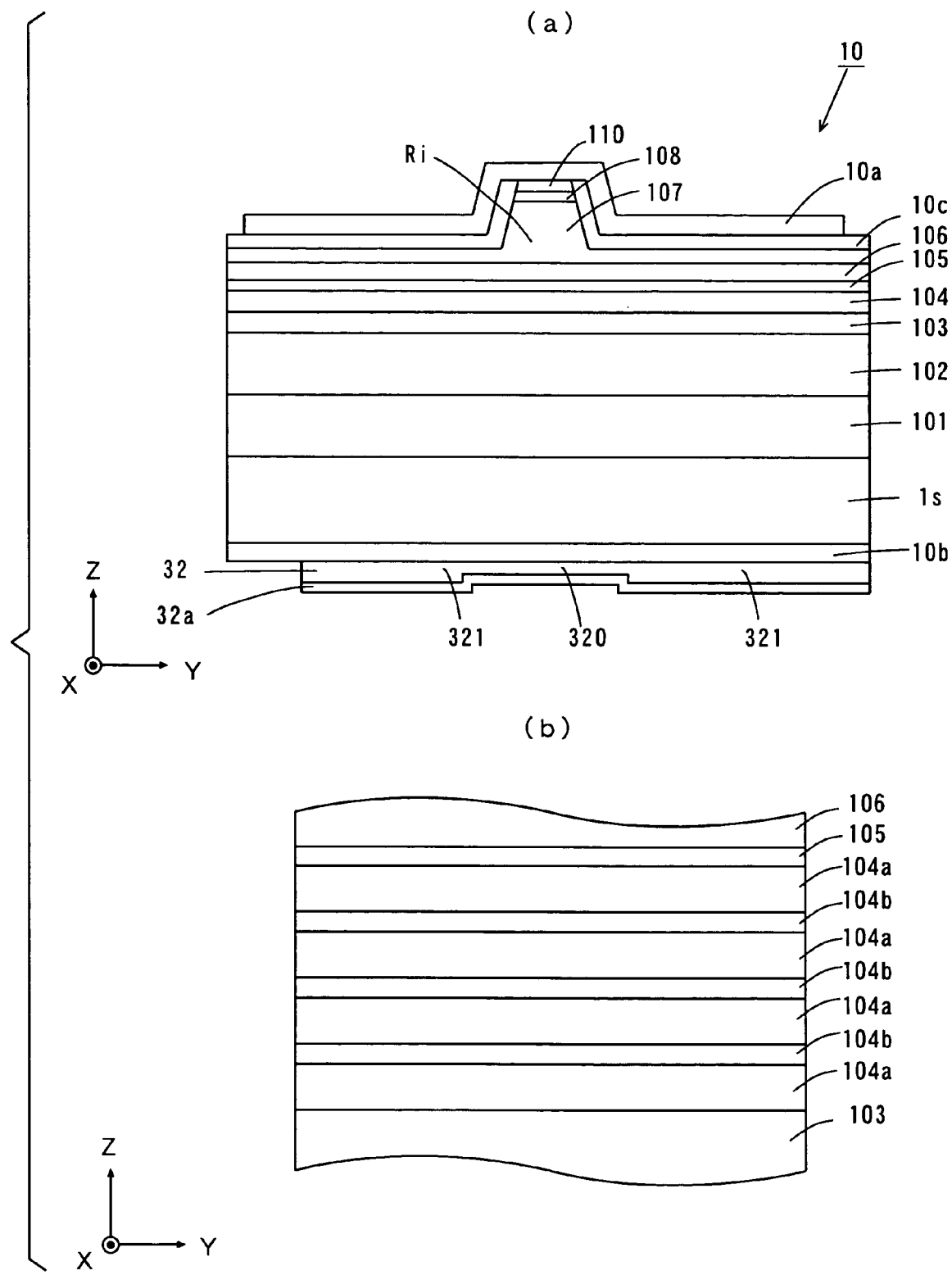
FIGS. 31 (a) and 31 (b) are schematic cross sections for use in illustrating details of the configuration of a blue-violet semiconductor laser device.

FIG. 31 is a schematic cross-section for use in illustrating the configuration of the blue-violet semiconductor laser device 10. The blue-violet semiconductor laser device 10 in the seventh embodiment has a configuration similar to that of the blue-violet semiconductor laser device 10 as described in the first embodiment except the following.

The insulating layer 32 comprises the thin heat dissipation insulating layer 320 and the thick low capacitance insulating layer 321. Therefore, the heat dissipation insulating layer 320 is partly formed on a predetermined region, and the low capacitance insulating layer 321 is formed on the remaining region.

As described above, the current blocking layer 10c of $SiO_2$ has a thickness of, e.g., 0.5 μm. The heat dissipation insulating layer 320 has a thickness of, e.g., 0.05 μm, and the low capacitance insulating layer 321 has a thickness of, e.g., 0.3 μm.

(8) Details of Configuration of Red Semiconductor Laser Device

The red semiconductor laser device 20 in the seventh embodiment has a configuration similar to that of the red semiconductor laser device 20 as described in the first embodiment.

The semiconductor laser apparatus 500 in the aforementioned seventh embodiment may employ a semiconductor laser device that emits an infrared laser beam (wavelength: around 790 mm), hereinafter referred to as an infrared semiconductor laser device, as the second semiconductor laser device. In this case, as shown by the parentheses in FIG. 26, FIG. 28, FIG. 29, and FIG. 30, the p-side pad electrode of the infrared semiconductor laser device 30 is bonded on the n-side pad electrode 10b of the blue-violet semiconductor laser device 10.

(9) Details of Configuration of Infrared Semiconductor Laser Device

The infrared semiconductor laser device 30 in the seventh embodiment has a configuration similar to that of the infrared semiconductor laser device 30 as described in the first embodiment.

This infrared semiconductor laser device 30 is about 200 μm wide (in the Y direction) and about 600 μm long (in the X direction), similarly to the red semiconductor laser device 20.

Using the infrared semiconductor laser device 30 that emits an infrared laser beam (wavelength: around 790 nm) as the second semiconductor laser device also, it is possible to provide a value of capacitance induced in the insulating layer 32 not more than the value of capacitance induced in the first current blocking layer 30c of the infrared semiconductor laser device 30 by setting the thickness t320 of the heat dissipation insulating layer 320 to 0.05 μm, the width w320 of the heat dissipation insulating layer 320 to 15 μm, and the thickness t321 of the low capacitance insulating layer 321 to 0.3 μm.

This allows the semiconductor laser apparatus 500 in this embodiment to selectively emit two kinds of laser beams, i.e., the blue-violet laser beam and the infrared laser beam. Further, this semiconductor laser apparatus 500 provides similar effects to those of the semiconductor laser apparatus using the red semiconductor laser device 20 as the second semiconductor laser device.

(10) Summary of Effects of Semiconductor Laser Apparatus (10-a) Main Effects

In the seventh embodiment, the thin heat dissipation insulating layer 320 is disposed below the ridge portion forming region of the red semiconductor laser device 20. This allows the heat generated from the ridge portion Ri of the red semiconductor laser device 20 and the semiconductor layer (i.e., the MQW active layer 204 in FIG. 8) positioned below the ridge portion Ri to be efficiently transmitted to the blue-violet semiconductor laser device 10 via the thin heat dissipation insulating layer 320.

As a result, the thin heat dissipation insulating layer 320 ensures electrical insulation between the blue-violet semiconductor laser device 10 and the red semiconductor laser device 20 while improving the heat dissipation capability of a portion of the red semiconductor laser device 20. This sufficiently reduces deterioration of the heat dissipation capability.

As described above, the common cathode connection of the blue-violet semiconductor laser device 10 and the red semiconductor laser device 20 is realized in the semiconductor laser apparatus 500 according to the seventh embodiment. Therefore, when a voltage higher than the ground potential is applied to either of the power supply pins 1a, 1b, each of the blue-violet semiconductor laser device 10 and the red semiconductor laser device 20 can be driven individually.

This facilitates controlling the drive voltage of each of the semiconductor laser devices. As a result, the semiconductor laser apparatus 500 is capable of selectively emitting two kinds of laser beams, i.e., the blue-violet laser beam and the red laser beam.

In the seventh embodiment, the value of capacitance induced in the insulating layer 32 is not more than the value of capacitance induced in the first current blocking layer 20c. This sufficiently reduces deterioration of the high frequency characteristics of the red semiconductor laser device 20 due to the influence of the insulating layer.

(10-b) Other Effects

A plurality of semiconductor laser apparatuses 500 can be simultaneously fabricated by overlapping a wafer having a plurality of blue-violet semiconductor laser devices 10 thereon with a wafer having a plurality of red semiconductor laser devices 20 thereon. This improves the positioning accuracy of each of the blue-violet semiconductor laser devices 10 and each of the red semiconductor laser devices 20. This results in improved positioning accuracy of the emission points of the blue-violet semiconductor laser devices 10 and the red semiconductor laser devices 20.

Also, providing the sub-substrate 31 between the support member 5 and the blue-violet semiconductor laser device 10 allows adjustments to be made to the positions of the emission points of the blue-violet semiconductor laser devices 10 and the red semiconductor laser devices 20.

The use of the blue-violet semiconductor laser device 10 that includes a nitride-based semiconductor as the first semiconductor laser device improves heat dissipation capability of the blue-violet semiconductor laser device 10. Stacking the red semiconductor laser device 20 on the blue-violet semiconductor laser device 10 also improves heat dissipation capability of the red semiconductor laser device 20.

Heat generated from the blue-violet semiconductor laser device 10 and the red semiconductor laser device 20 is dissipated through the support member 5. In the seventh embodiment, the blue-violet semiconductor laser device 10 is disposed on the support member 5 so that the p-side pad electrode 10a is positioned on the support member 5 side. This brings the emission point of the blue-violet semiconductor laser device 10 close to the support member 5. This results in improved heat dissipation capability of the blue-violet semiconductor laser device 10.

The red semiconductor laser device 20 is disposed so that the p-side pad electrode 20a is positioned on the support member 5 side. This brings the emission point of the red semiconductor laser device 20 close to the support member 5, resulting in improved heat dissipation capability.

In the foregoing embodiment, the red semiconductor laser device 20 as the second semiconductor laser device is stacked on the blue-violet semiconductor laser device 10 as the first semiconductor laser device. However, not only the single semiconductor laser device but also a plurality of semiconductor laser devices may be aligned on the blue-violet semiconductor laser device 10 in the Y direction. This allows for increases in the kinds (i.e., wavelengths) and the number of laser beams emitted from the semiconductor laser apparatus 500.

Furthermore, in the foregoing embodiment, the n-side pad electrode 10b of the blue-violet semiconductor laser device 10 and the n-side pad electrode 20b of the red semiconductor laser device 20 are both connected to the support member 5. However, then-side pad electrodes 10b and 20b may be electrically isolated from the support member 5.

In this case, a floating connection of the blue-violet semiconductor laser device 10 and the red semiconductor laser device 20 is achieved. This allows arbitrary voltages to be applied to the power supply pins that are electrically connected to the n-side pad electrode 10b of the blue-violet semiconductor laser device 10 and the n-side pad electrode 20b of the red semiconductor laser device 20. As a result, the drive voltages of the blue-violet semiconductor laser device 10 and the red semiconductor laser device 20 can be easily controlled by the drive device of the semiconductor laser apparatus 500.

(11) Other Examples of Configuration (11-a) Shape of Heat Dissipation Insulating Layer in X-Y Plane In the semiconductor laser apparatus 500 according to the seventh embodiment, the shape of the heat dissipation insulating layer 320 in the X-Y plane may be set as described below.

Figure 32:
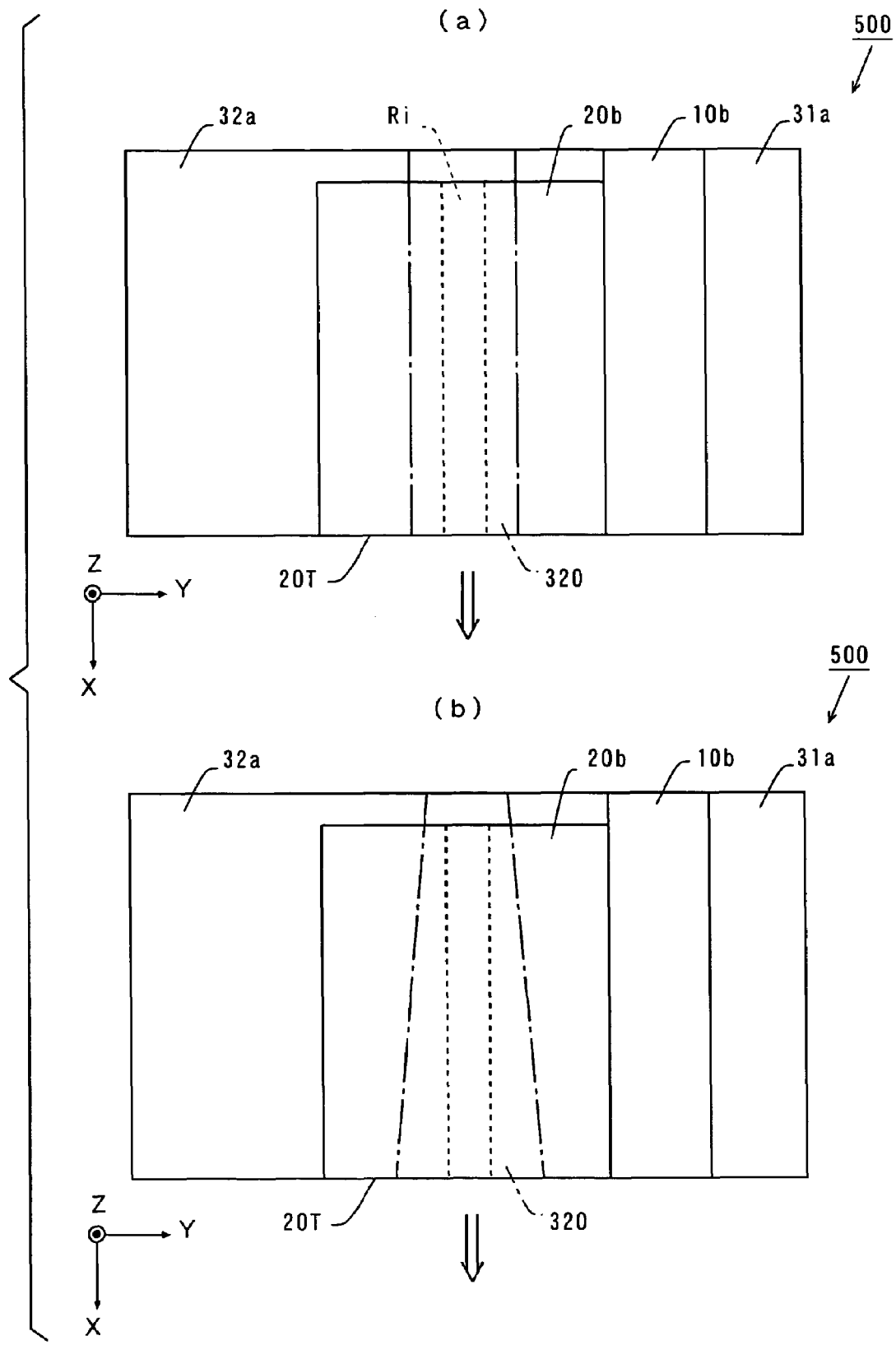
FIGS. 32 (a) and 32 (b) are top views of the semiconductor laser apparatus in FIG. 25 for use in illustrating the shape of the heat dissipation insulating layer in the X-Y plane.

FIGS. 32 (a) and 32 (b) are top views of the semiconductor laser apparatus 500 in FIG. 25 for use in illustrating the shape of the heat dissipation insulating layer 320 in the X-Y plane. For the sake of simplicity, FIG. 32 shows only the laminate that includes the sub-substrate 31 provided on the support member 5, the blue-violet semiconductor laser device 10, the insulating layer 32, and the red semiconductor laser device 20.

In each of FIGS. 32(a) and 32 (b), the thick arrow indicates the direction in which the red semiconductor laser device 20 emits a red laser beam.

As shown in FIG. 32 (a), the foregoing describes the formation of the heat dissipation insulating layer 320 (by the dashed line) that extends in the X direction with uniform width along the ridge portion Ri (by the dotted line) of the red semiconductor laser device 20 in the X direction.

The formation of the heat dissipation insulating layer 320 as described above allows the heat generated around the ridge portion Ri of the red semiconductor laser device 20 to be efficiently dissipated.

However, the shape of the heat dissipation insulating layer 320 in the X-Y plane is not limited to this. For example, the heat dissipation insulating layer 320 may be formed so that the width thereof decreases continuously or stepwise from one facet that emits a red laser beam of the red semiconductor laser device 20 (laser emitting facet 20T) to another facet. One such example is shown by the dashed line in FIG. 32 (*b*).

During the emission of a red laser beam, the optical density of a portion of the ridge portion Ri of the red semiconductor laser device 20 close to the laser emitting facet 20T increases. Therefore, the amount of heat generated from the portion of the ridge portion Ri close to the laser emitting facet 20T is higher than that from the remaining portions of the ridge portion Ri.

Therefore, by setting the shape of the portion of the heat dissipation insulating layer 320 close to the laser emitting facet 20T wider, the heat dissipation capability of the portion of the ridge portion Ri that generates a greater amount of heat is improved.

The shape of the heat dissipation insulating layer 320 is yet not limited to this. For example, the heat dissipation insulating layer 320 may be formed only on the portion close to the laser emitting facet 20T of the ridge portion Ri that extends in the X direction.

When setting the shape of the heat dissipation insulating layer 320 as shown in FIG. 32 (*b*) also, the dimension of the heat dissipation insulating layer 320 is set so that the value of capacity induced in the insulating layer 32 is not more than the value of capacity induced in the first current blocking layer 20*c*.

(11-b) Examples of Other Configurations of Insulating Layer

In the semiconductor laser apparatus 500 according to the seventh embodiment, the insulating layer 32 may be formed using, other than $SiO_2$, an inorganic insulating material composed of an oxide such as $Al_2O_3$ or $ZrO_2$ or using an inorganic insulating material composed of a nitride such as SiN or AlN.

The insulating layer 32 may also be formed using an inorganic insulating material composed of a carbon-based material such as diamond-like carbon or using an organic insulating material such as polyimide. The insulating layer 32 may also be formed of a multi-layer film composed of these materials.

Table 1 shows the relative dielectric constants and the thermal conductivities of $SiO_2$, SiN, $Al_2O_3$, AlN, $ZrO_2$, diamond-like carbon, and polyimide, respectively, and also shows for reference the dielectric constant and the thermal conductivity of GaN used in the blue-violet semiconductor laser device 10.

TABLE 1

| MATERIAL | RELATIVE DIELECTRIC CONSTANT | THERMAL CONDUCTIVITY [W/m · K] |
|---|---|---|
| $SiO_2$ | 4 | 1.5 |
| SiN | 7 | 2 |
| $Al_2O_3$ | 8 | 30 |
| AlN | 9 | 200 |
| $ZrO_2$ | 9 | 2 |
| DIAMAOND-LIKE CARBON | 5.5 | 1000 |
| POLYMIDE | 3.5 | 0.1 |
| GaN | 10 | 130 |

For example, AlN with a thermal conductivity (thermal conductivity: 200 W/m/K) higher than that of $SiO_2$ (thermal conductivity: 1.5 W/m/K) is used as the insulating layer 32. This allows the heat generated from the ridge portion Ri of the red semiconductor laser device and the semiconductor layer (i.e., the MQW active layer 204 in FIG. 8) positioned below the ridge portion Ri of the red semiconductor laser device 20 to be efficiently transmitted to the support member 5 via the blue-violet semiconductor laser device 10.

The relative dielectric constant of AlN is, however, nine, which is almost double the relative dielectric constant of four for $SiO_2$. Therefore, in order to obtain the cutoff frequency of the red semiconductor laser device 20 same as that of the semiconductor laser apparatus 500 obtained using the insulating layer 32 of $SiO_2$, the thickness of a low capacitance insulating layer 321 for the insulating layer 32 made of AlN is set to about double the thickness of $SiO_2$.

Figure 33:
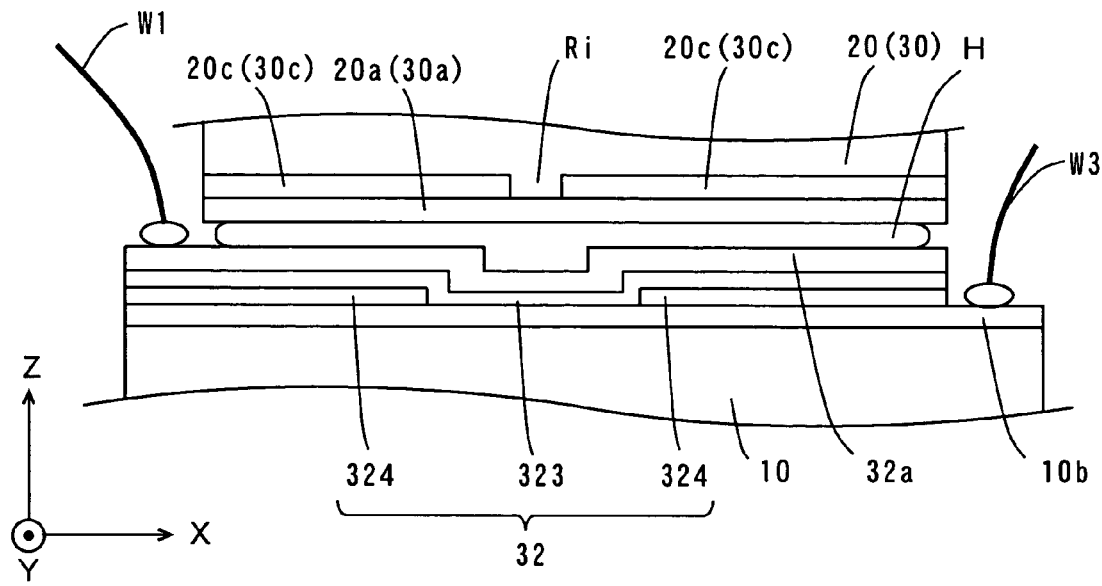
FIG. 33 is an enlarged front view showing a portion of another example of the configuration of the insulating layer in the semiconductor laser apparatus according to the seventh embodiment.
Figure 34:
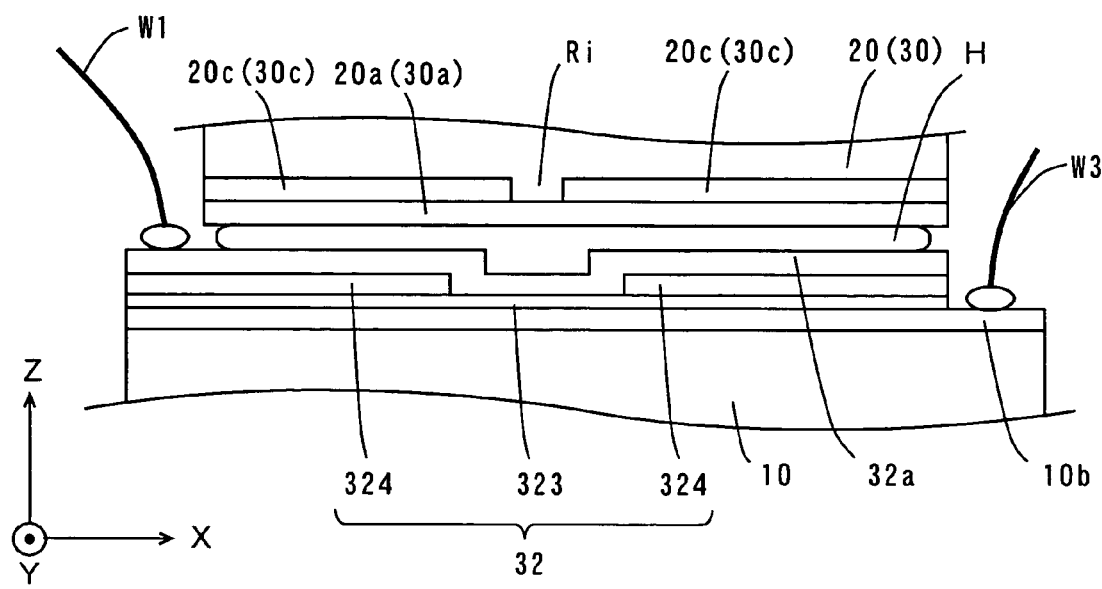
FIG. 34 is an enlarged front view showing a portion of another example of the configuration of the insulating layer in the semiconductor laser apparatus according to the seventh embodiment.
Figure 35:
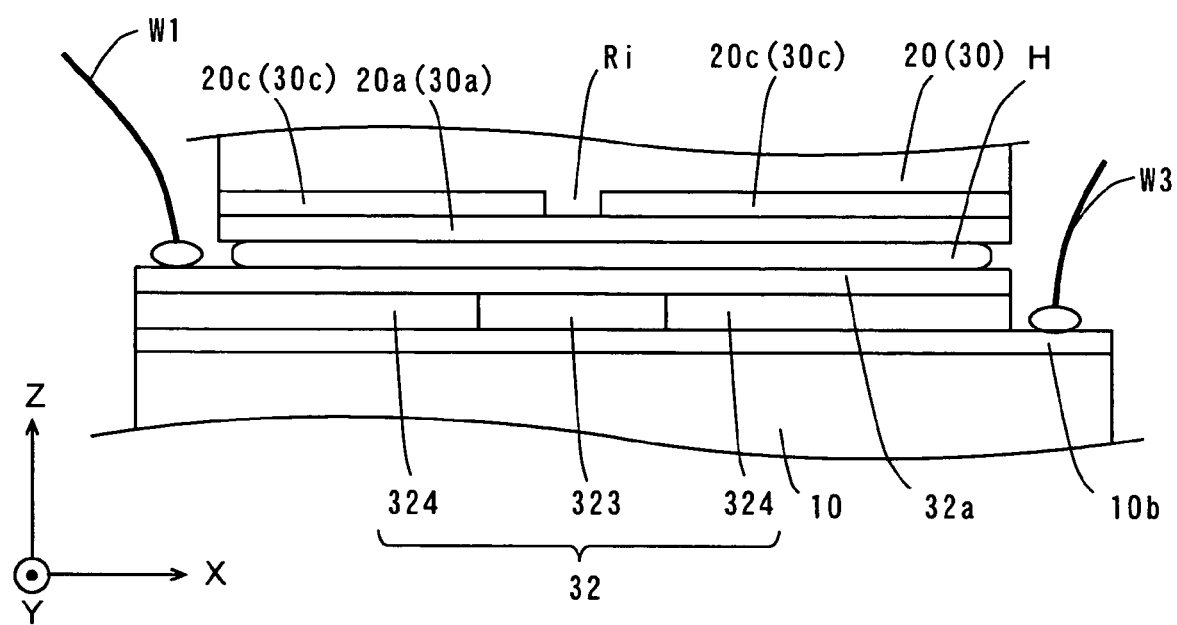
FIG. 35 is an enlarged front view showing a portion of another example of the configuration of the insulating layer in the semiconductor laser apparatus according to the seventh embodiment.

FIG. 33, FIG. 34, and FIG. 35 are enlarged front views showing a portion of other examples of the configuration of the insulating layer 32 in the semiconductor laser apparatus 500 according to the seventh embodiment.

In each of FIG. 33 and FIG. 34, the portion of the insulating layer 32 below the ridge portion forming region of the red semiconductor laser device 20 has a single-layer structure of a first insulating layer 323, and the remaining region of the insulating layer 32 has a double-layer structure of the first insulating layer 323 and a second insulating layer 324.

In the case of FIG. 33, the second insulating layer 324 with a given pattern is formed on the n-side pad electrode 10*b* except the portion below the ridge portion forming region by selective etching or liftoff.

After this, the first insulating layer 323 is formed on upper surfaces of the exposed n-side pad electrode 10*b* and the second insulating layer 324. In this way, the insulating layer 32 is completed that provides improved heat dissipation capability of the red semiconductor laser device 20 on the ridge portion forming region.

On the other hand, in the case of FIG. 34, the first insulating layer 323 is formed on a portion of the n-side pad electrode 10*b*. After this, the second insulating layer 324 with a given pattern is formed on the region of the first insulating layer 323 except the portion below the ridge portion forming region by selective etching or liftoff. In this way, the insulating layer 32 is completed that provides improved heat dissipation capability of the ridge portion forming region of the red semiconductor laser device 20.

As described above, each of the insulating layers 32 shown in FIG. 33 and FIG. 34 can be readily formed on the n-side pad electrode 10*b* by a patterning technique such as selective etching or liftoff.

In this embodiment, the first insulating layers 323 and the second insulating layers 324 may be composed of same materials or may be composed of different materials from each other.

The materials for use as the first insulating layers 323 and the second insulating layers 324 are preferably those from the insulating materials shown in Table 1.

Alternatively, the insulating layer 32 may comprise a first insulating layer 323 composed of a material with high thermal conductivity and a second insulating layer 324 composed of a material with low thermal conductivity.

In this case, as shown in FIG. 35, the first insulating layer 323 is disposed below the ridge portion forming region of the red semiconductor laser device 20, and the second insulating layer 324 is disposed on the remaining region. This allows for improved heat dissipation capability of the ridge portion forming region of the red semiconductor laser device 20.

For example, AlN is used as the first insulating layer 323, and $SiO_2$ is used as the second insulating layer 324.

This allows the heat generated from the ridge portion Ri of the red semiconductor laser device 20 and the semiconductor layer (i.e., the MQW active layer 204 in FIG. 8) positioned below the ridge portion Ri to be efficiently transmitted to the blue-violet semiconductor laser device 10 via the first insulating layer 323 made of AlN.

Moreover, $SiO_2$ on the region except the ridge portion forming region has a low relative dielectric constant, thus making the thickness necessary to prevent deterioration of the high frequency characteristics of the red semiconductor laser device 20 small. It is therefore possible to prevent deterioration of the high frequency characteristics of the red semiconductor laser device 20 also using the second insulating layer 324 having a thickness about half the thickness necessary for the second insulating layer 324 made of AlN.

The selection of suitable materials for the portion of the insulating layer 32 below the ridge portion forming region and the remaining region of the insulating layer 32 as described above also allows the upper surface of the insulating layer 32 to be equal in height.

8. Eighth Embodiment

(1) Configuration of Semiconductor Laser Apparatus

The semiconductor laser apparatus according to the eighth embodiment is different from the semiconductor laser apparatus 500 according to the seventh embodiment in configuration and operation as described below.

Figure 36:
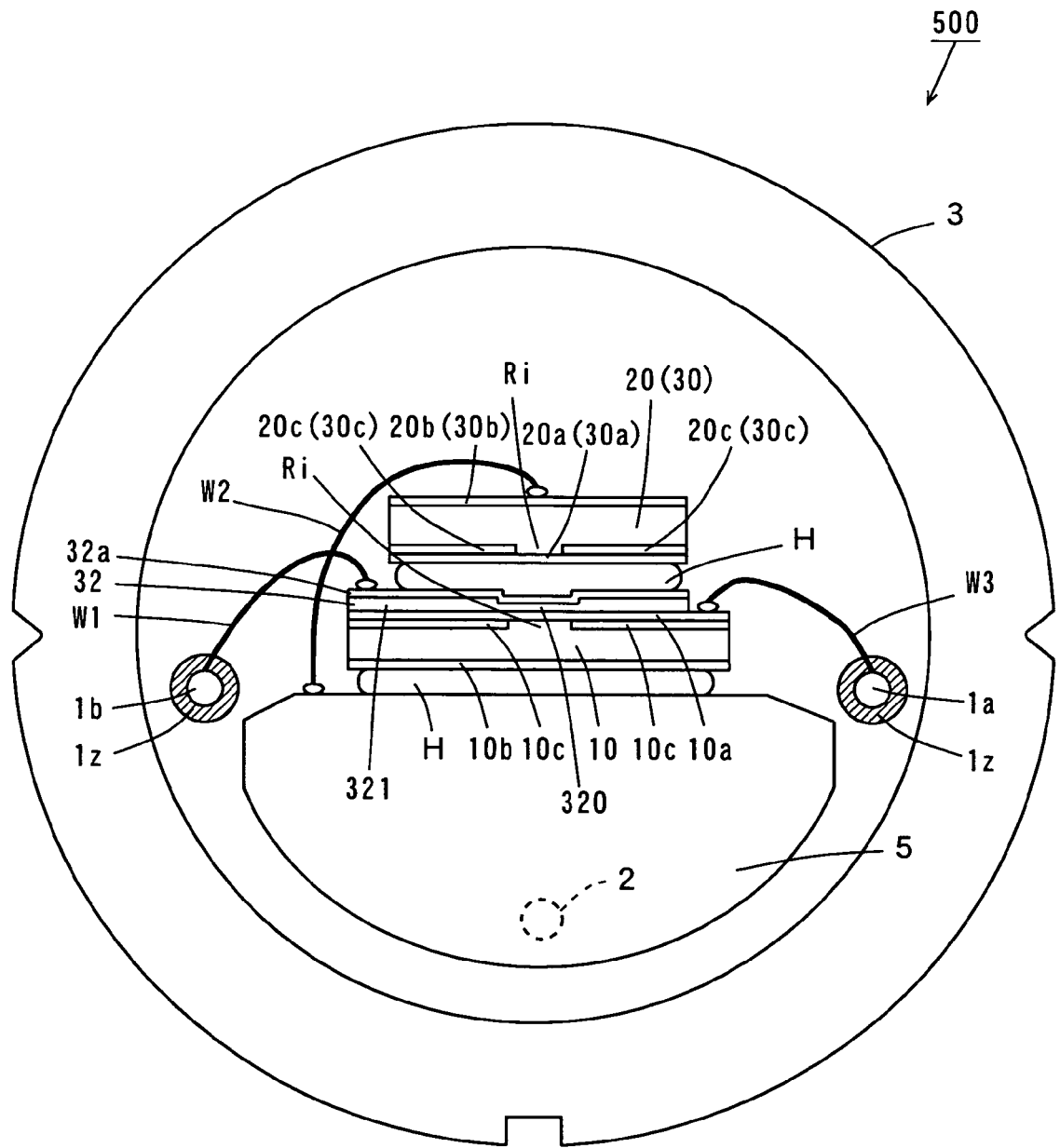
FIG. 36 is a schematic front view showing a semiconductor laser apparatus according to an eighth embodiment with a cover thereof being removed.
Figure 37:
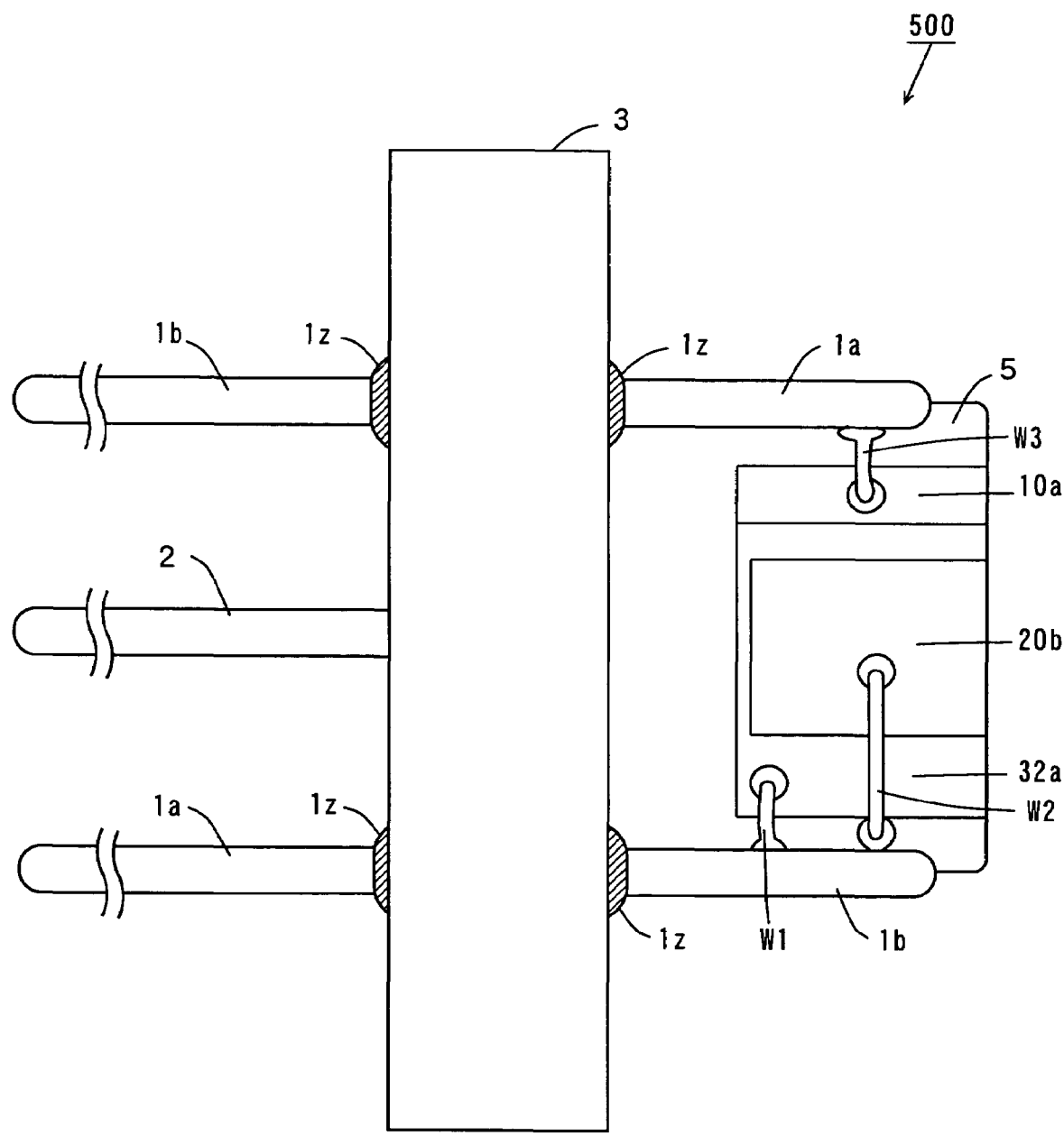
FIG. 37 is a schematic top view showing the semiconductor laser apparatus according to the eighth embodiment with the cover thereof being removed.

FIG. 36 is a schematic front view showing the semiconductor laser apparatus according to the eighth embodiment with a cover 4 being removed, and FIG. 37 is a schematic top view showing the semiconductor laser apparatus according to the eighth embodiment with the cover 4 being removed.

As shown in FIG. 36, a conductive fusion layer H is formed on a conductive support member 5 integral with the package body 3.

A blue-violet semiconductor laser device 10 is bonded on the fusion layer H so that an n-side pad electrode 10b lies on the support member 5 side.

An insulating layer 32 made of $SiO_2$ is provided on a p-side pad electrode 10a of the blue-violet semiconductor laser device 10. The configuration of the insulating layer 32 in the eighth embodiment is similar to that of the insulating layer 32 in the seventh embodiment. That is, the insulating layer 32 is formed to have small thickness below the ridge portion forming region of the red semiconductor laser device 20 (heat dissipation insulating layer 320). The insulating layer 32 is also formed to have great thickness on the remaining region (low capacitance insulating layer 321).

A conductive layer 32a containing Au is formed on the insulating layer 32. A red semiconductor laser device 20 is bonded on the conductive layer 32a through a fusion layer H made of AuSn so that a p-side pad electrode 20a lies on the support member 5 side.

As shown by the parentheses in FIG. 36, an infrared semiconductor laser device 30 may be stacked on the blue-violet semiconductor laser device 10 instead of the red semiconductor laser device 20. When stacking the infrared semiconductor laser device 30 on the blue-violet semiconductor laser device 10, the infrared semiconductor laser device 30 is disposed so that a p-side pad electrode 30a lies on the support member 5 side.

(2) Electrical Wiring of Semiconductor Laser Apparatus

As shown in FIG. 36 and FIG. 37, each of power supply pins 1a, 1b is electrically isolated from the package body 3 through an insulating ring 1z. The power supply pin 1a is electrically connected to the p-side pad electrode 10a of the blue-violet semiconductor laser device 10 through a wire W3. The power supply pin 1b is electrically connected to the conductive layer 32a on the insulating layer 32 through a wire W1. An exposed portion of the upper surface of the support member 5 is electrically connected to the n-side pad electrode 20b of the red semiconductor laser device 20 through a wire W2.

The n-side pad electrode 10b of the blue-violet semiconductor laser device 10 is electrically connected on the support member 5 through the fusion layer H. This provides an electrical connection of a power supply pin 2 to the n-side pad electrode 10b of the blue-violet semiconductor laser device 10 and the n-side pad electrode 20b of the red semiconductor laser device 20. That is, a common cathode connection of the blue-violet semiconductor laser device 10 and the red semiconductor laser device 20 is achieved.

When voltages are applied between the power supply pins 1a and 2 and between the power supply pins 1b and 2, respectively, the blue-violet semiconductor laser device 10 and the red semiconductor laser device 20 can be driven individually. The semiconductor laser apparatus 500 according to the eighth embodiment has similar electrical wiring to that shown in FIG. 29. Thus, in the semiconductor laser apparatus according to the eighth embodiment also, the drive voltage of each of the semiconductor laser devices can be easily controlled.

(3) Dimension of Insulating Layer and Effects Thereof

Similarly to the seventh embodiment, with the insulating layer 32 for use in the eighth embodiment also, the thin heat dissipation insulating layer 320 is formed below the ridge portion forming region of the red semiconductor laser device 20, and the thick low capacitance insulating layer 321 is formed on the remaining region.

Therefore, similarly to the seventh embodiment, in this embodiment also, the heat dissipation insulating layer 320 ensures electrical insulation between the blue-violet semiconductor laser device 10 and the red semiconductor laser device 20 while improving the heat dissipation capability of a portion of the red semiconductor laser device 20.

(4) Function of Insulating Layer as a Dielectric

When driving the semiconductor laser apparatus 500 according to the eighth embodiment by alternating voltage, the insulating layer 32 in FIG. 36 functions as a dielectric as in the seventh embodiment.

FIG. 38 is an equivalent circuit diagram for use in illustrating the function of the insulating layer 32 in FIG. 36 as a dielectric.

FIG. 38 (a) shows the equivalent circuit diagram in the case of driving the blue-violet semiconductor laser device 10, and FIG. 38 (b) shows the equivalent circuit diagram in the case of driving the red semiconductor laser device 20.

When driving the blue-violet semiconductor laser device 10 by alternating voltage, the blue-violet semiconductor laser device 10 is represented by FIG. 38 (a), where the ridge portion Ri is a resistance, and the current blocking layer 10c is a dielectric. The red semiconductor laser device 20 is also represented by FIG. 38 (a), where the ridge portion Ri is a resistance, the first current blocking layer 20c is a dielectric, and the p-n junction surface is a dielectric. The insulating layer 32 also functions as a dielectric as in the seventh embodiment.

In this way, when driving the blue-violet semiconductor laser device 10 by alternating voltage, the series circuit of the insulating layer 32 and the red semiconductor laser device 20 is connected in parallel with the blue-violet semiconductor laser device 10. The insulating layer 32 is represented in FIG. 38 (a) to comprise the heat dissipation insulating layer 320 and the low capacitance insulating layer 321 that are connected in parallel.

When, on the other hand, driving the red semiconductor laser device 20 by alternating voltage, the red semiconductor laser device 20 is represented by FIG. 38 (b), where the ridge portion Ri is a resistance, and the first current blocking layer 20c is a dielectric. The blue-violet semiconductor laser device 10 is also represented by FIG. 38 (b), where the ridge portion Ri is a resistance, the current blocking layer 10c is a dielectric, and the p-n junction surface is a dielectric. In this case also, the insulating layer 32 functions as a dielectric, and the insulating layer 32 is represented to comprise the heat dissipation insulating layer 320 and the low capacitance insulating layer 321 connected in parallel.

As shown in FIGS. 38 (a) and 38 (b), when driving either of the semiconductor laser devices, the current blocking layer of the other semiconductor laser device and the p-n junction surface thereof are connected in series with the insulating layer 32. This reduces the value of combined capacitance of the insulating layer 32, the current blocking layer of the other semiconductor laser device, and the p-n junction surface thereof. As a result, the influence of the insulating layer 32 on the other semiconductor laser device is reduced.

Moreover, as described in the seventh embodiment, the value of capacitance induced in the current blocking layer 10c when driving the blue-violet semiconductor laser device 10 is about 15 pF. It is thus preferred to adjust the value of capacitance induced in the insulating layer 32 to be not more than about 15 pF when driving the blue-violet semiconductor laser device 10. This sufficiently suppresses deterioration of the high frequency characteristics of the blue-violet semiconductor laser device 10 due to the influence of the insulating layer 32.

For example, the value of effective capacitance in this case is not more than twice the value of capacitance induced in the current blocking layer 10c. As a result, when the value of capacitance induced in the insulating layer 32 is not more than the value of capacitance induced in the current blocking layer 10c, the decrease in the cutoff frequency of the blue-violet semiconductor laser device 10 is suppressed to a maximum of about 30% of the cutoff frequency thereof without the insulating layer 32.

On the other hand, the value of capacitance induced in the first current blocking layer 20c when driving the red semiconductor laser device 20 is about 28 pF. It is thus preferred to set the value of capacitance induced in the insulating layer 32 during the drive of the red semiconductor laser device 20 to not more than about 28 pF. This sufficiently reduces deterioration in the high frequency characteristics of the red semiconductor laser device 20 due to the influence of the insulating layer 32.

For example, the value of effective capacitance in this case is not more than twice the value of capacitance induced in the current blocking layer 20c. As a result, when the value of capacitance induced in the insulating layer 32 is not more than the value of capacitance induced in the current blocking layer 20c, the decrease in the cutoff frequency of the red semiconductor laser device 20 is suppressed to a maximum of about 30% of the cutoff frequency thereof without the insulating layer 32.

By setting the value of capacitance induced in the insulating layer 32 to not more than about 15 pF as described above, it is possible to sufficiently reduce deterioration in the high frequency characteristics of each of the blue-violet semiconductor laser device 10 and the red semiconductor laser device 20 due to the influence of the insulating layer 32.

By setting the dimension, material, and the like of each of the heat dissipation insulating layer 320 and the low capacitance insulating layer 321 forming the insulating layer 32 so that the value of capacitance induced in the insulating layer 32 is not more than the value of capacitance induced in the current blocking layer 10c or 20c, the decrease in the cutoff frequency of the blue-violet semiconductor laser device 10 or the red semiconductor laser device 20 due to the influence of the insulating layer 32 is sufficiently reduced. That is, the decrease in the high frequency characteristics of both the blue-violet semiconductor laser device 10 and the red semiconductor laser device 20 due to the influence of the insulating layer 32 is sufficiently reduced.

In the eighth embodiment, the insulating layer 32 may have an alternative configuration. For example, an inorganic insulating material composed of an oxide such as $Al_2O_3$ or $ZrO_2$ or an inorganic insulating material composed of a nitride such as SiN or AlN may be used as the material of the insulating layer 32 instead of $SiO_2$.

Also, an inorganic insulating material composed of a carbon-based material such as diamond-like carbon or an organic insulating material such as polyimide may be used as the material of the insulating layer 32. The insulating layer 32 may also be formed of a multi-layer film composed of these materials. The insulating layer 32 may have the configuration described in any of FIG. 33, FIG. 34, and FIG. 35.

(5) Effects of Semiconductor Laser Apparatus

In the eighth embodiment, the heat dissipation capability of a portion of the red semiconductor laser device 20 is improved as in the seventh embodiment. This sufficiently reduces deterioration in the heat dissipation capability. Moreover, the common cathode connection is achieved in the semiconductor laser apparatus 500. It is thus possible to drive the blue-violet semiconductor laser device 10 and the red semiconductor laser device 20 individually.

The value of capacitance induced in the insulating layer 32 is set to not more than the value of capacitance induced in the current blocking layer 10c. This facilitates controlling the drive voltage of the blue-violet semiconductor laser device 10 while sufficiently suppressing deterioration in the high frequency characteristics of the red semiconductor laser device 20 due to the influence of the insulating layer 32.

In the eighth embodiment, the value of capacitance induced in the insulating layer 32 is set to not more than the value of capacitance induced in the first current blocking layer 20c. This facilitates controlling the drive voltage of the red semiconductor laser device 20 while sufficiently suppressing deterioration in the high frequency characteristics of the red semiconductor laser device 20 due to the influence of the insulating layer 32.

In addition, the blue-violet semiconductor laser device 10 and the red semiconductor laser device 20 are disposed so that the p-side pad electrode 10a and the p-side pad electrode 20a are positioned opposite to each other with the insulating layer 32 therebetween. This brings the semiconductor layer of the blue-violet semiconductor laser device 10 and the semiconductor layer of the red semiconductor laser device 20 close to each other, allowing the emission points of the blue-violet semiconductor laser device 10 and the red semiconductor laser device 20 to approach each other. Thus, when the laser beams emitted from the blue-violet semiconductor laser device 10 and the red semiconductor laser device 20 pass through a converging lens, aberration due to the lens can be reduced.

A sub-substrate 31 may be provided between the support member 5 and the blue-violet semiconductor laser device 10, although it is not provided in the semiconductor laser apparatus 500 according to the eighth embodiment.

In this case, the thickness of the sub-substrate 31 allows adjustments to be made to the position of each of the emission points of the blue-violet semiconductor laser device 10, the red semiconductor laser device 20, and the infrared semiconductor laser device 30.

When the sub-substrate 31 is provided between the support member 5 and the blue-violet semiconductor laser device 10, the n-side pad electrode 10b of the blue-violet semiconductor laser device 10 and the support member 5 may be electrically isolated through the sub-substrate 31. In this case, a floating connection of the blue-violet semiconductor laser device 10 is achieved. This allows an arbitrary voltage to be applied to the power supply pin that is electrically connected to the n-side pad electrode 10b of the blue-violet semiconductor laser device 10. As a result, the drive voltages of the blue-violet semiconductor laser device 10 and the red semiconductor laser device 20 can be easily controlled by the drive device of the semiconductor laser apparatus 500.

9. Ninth Embodiment

(1) Configuration of Semiconductor Laser Apparatus

A semiconductor laser apparatus according to the ninth embodiment is different from the semiconductor laser apparatus 500 according to the eighth embodiment in configuration and operation as described below.

Figure 39:
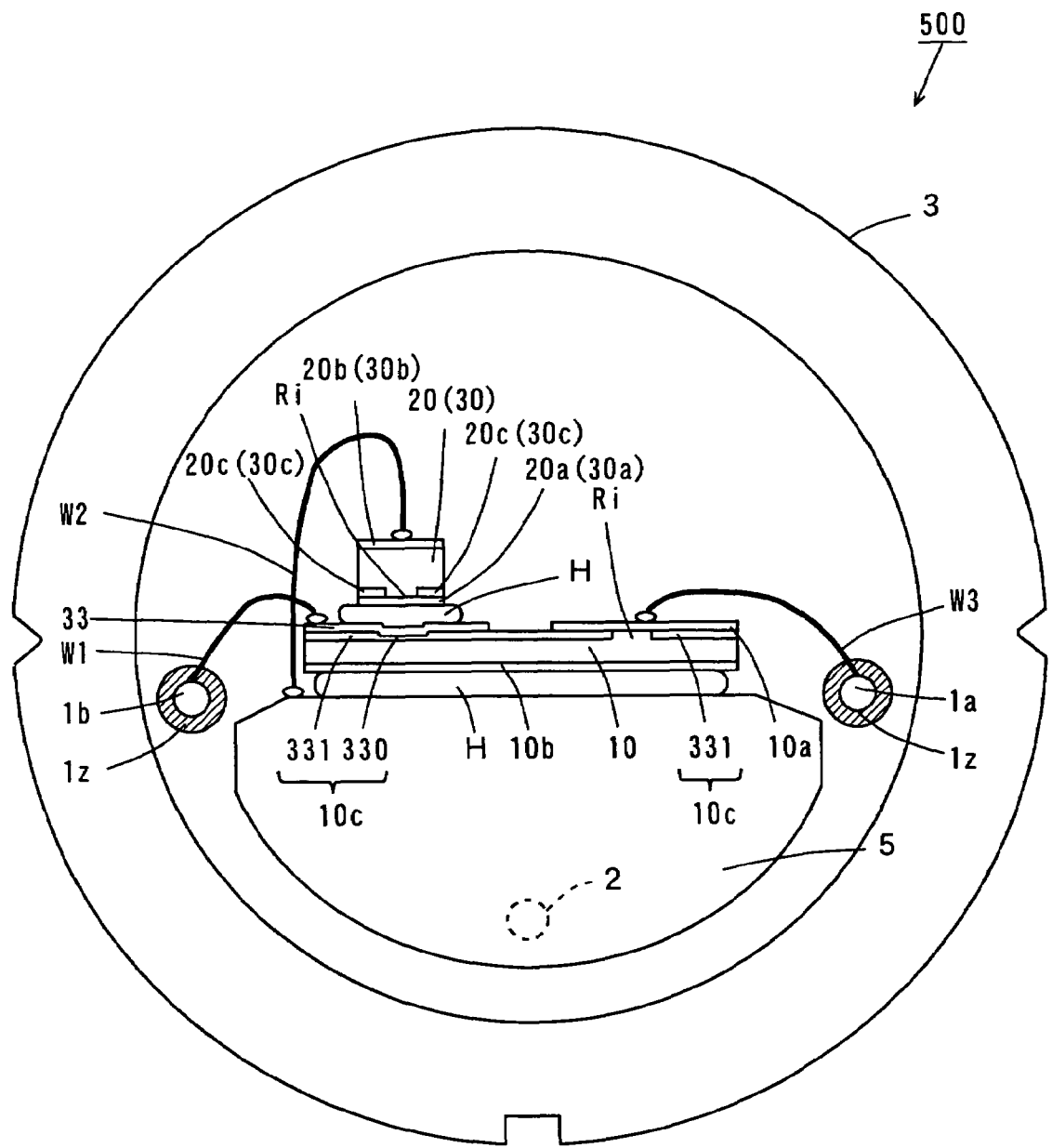
FIG. 39 is a schematic front view showing a semiconductor laser apparatus according to a ninth embodiment with a cover thereof being removed.
Figure 40:
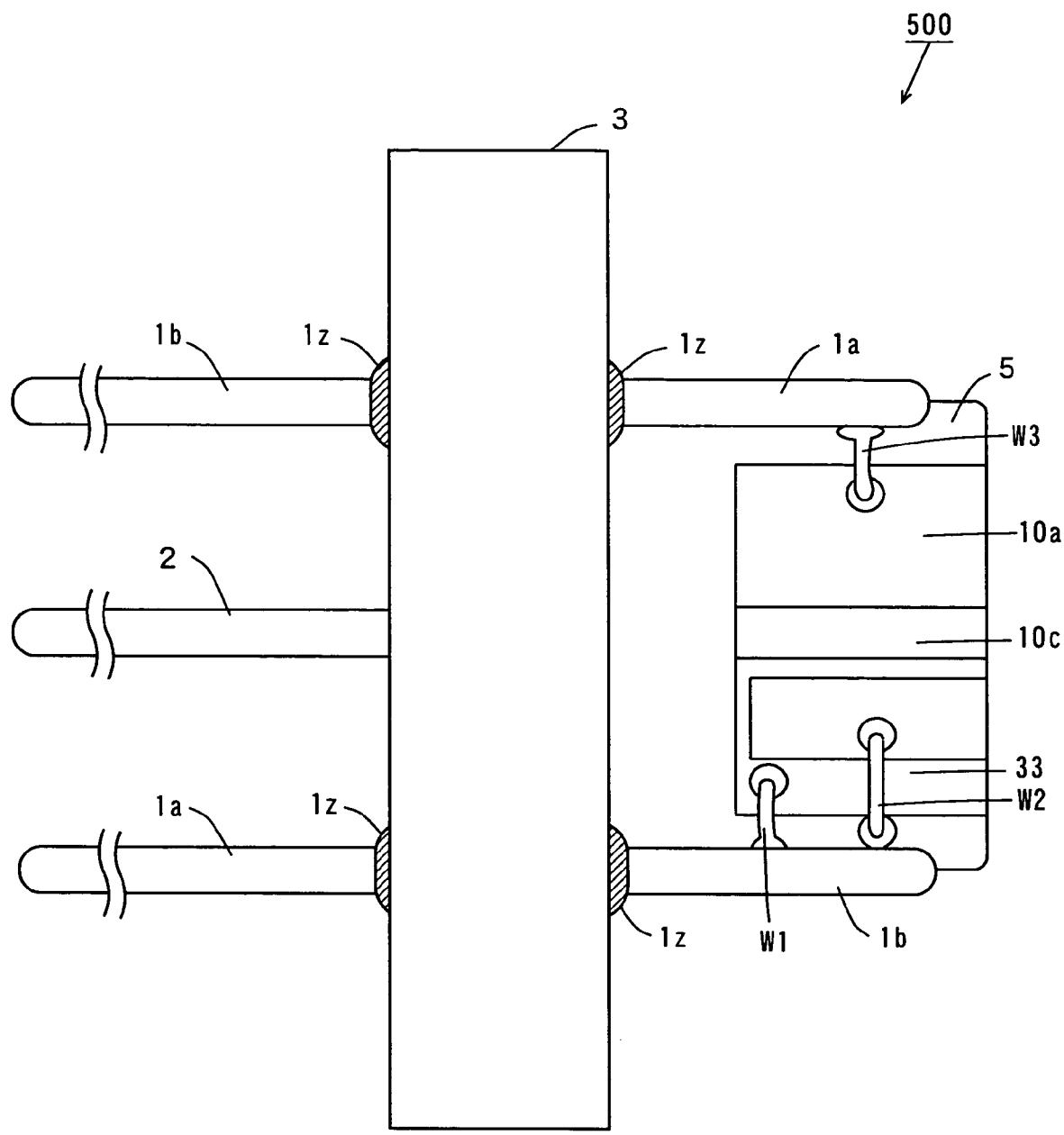
FIG. 40 is a schematic top view showing the semiconductor laser apparatus according to the ninth embodiment with the cover thereof being removed.

FIG. 39 is a schematic front view showing the semiconductor laser apparatus according to the ninth embodiment with a cover 4 being removed, and FIG. 40 is a schematic top view showing the semiconductor laser apparatus according to the ninth embodiment with the cover 4 being removed.

As shown in FIG. 39, a conductive fusion layer H is formed on a conductive support member 5 integral with the package body 3. A blue-violet semiconductor laser device 10 is bonded on the fusion layer H so that an n-side pad electrode 10b lies on the support member 5 side.

In the ninth embodiment, the width (in the Y direction) of the blue-violet semiconductor laser device 10 are greater than those of the blue-violet semiconductor laser device 10 in the seventh embodiment. More specifically, the width (in the Y direction) and the length (in the X direction) of the blue-violet semiconductor laser device 10 are about 500 μm and about 600 μm, respectively.

A p-side pad electrode 10a of the blue-violet semiconductor laser device 10 is formed on a portion of a current blocking layer 10c. The current blocking layer 10c thus blocks the current flowing in the blue-violet semiconductor laser device 10 under the p-side pad electrode 10a except the ridge portion Ri. As described above, the current blocking layer 10c is made of SiO$_2$.

In the semiconductor laser apparatus 500 of FIG. 39, the p-side pad electrode 10a is about 200 μm wide (in the Y direction) and about 600 μm long (in the X direction).

A red semiconductor laser device 20 is bonded on the current blocking layer 10c, as described below. The thickness (in the Z direction) of the portion of the current blocking layer 10c under the ridge portion Ri of the bonded red semiconductor laser device 20 and the thickness of the remaining region of the current blocking layer 10c are different.

The portion of the current blocking layer 10c positioned below the ridge portion forming region of the red semiconductor laser device 20 is termed a "heat dissipation blocking layer 330", and the remaining region of the current blocking layer 10c is termed a "low capacitance blocking layer 331". The heat dissipation blocking layer 330 and the low capacitance blocking layer 331 will be described in detail below.

In the X-Y plane, a conductive layer 33 containing Au is formed on another region of the current blocking layer 10c at a distance from the p-side pad electrode 10a. The region where the conductive layer 33 is formed in the X-Y plane is referred to as a conductive layer forming region.

The conductive layer forming region includes the ridge portion forming region of the red semiconductor laser device 20, and disposed on another region of the blue-violet semiconductor laser device 10. The conductive layer forming region, i.e., the conductive layer 33 is about 280 μm wide (in the Y direction) and about 600 μm long (in the X direction).

The red semiconductor laser device 20 is bonded on the conductive layer 33 through a fusion layer H so that a p-side pad electrode 20a lies on the support member 5 side. Note that the red semiconductor laser device 20 for use in this embodiment is similar to that shown in FIG. 31 described in the seventh embodiment. The red semiconductor laser device 20 is therefore about 200 μm wide (in the Y direction) and about 600 μm long (in the X direction).

As indicated by the parentheses in FIG. 39, an infrared semiconductor laser device 30, instead of the red semiconductor laser device 20, may be stacked on the blue-violet semiconductor laser device 10.

(2) Electrical Wiring of Semiconductor Laser Apparatus

As shown in FIG. 39 and FIG. 40, each of power supply pins 1a, 1b is electrically isolated from the package body 3 through an insulating ring 1z. The power supply pin 1a is electrically connected to the p-side pad electrode 10a of the blue-violet semiconductor laser device 10 through a wire W3. The power supply pin 1b is electrically connected to the conductive layer 33 through a wire W1. An exposed portion of the upper surface of the support member 5 is connected to an n-side pad electrode 20b of the red semiconductor laser device 20 through a wire W2.

The n-side pad electrode 10 of the blue-violet semiconductor laser device 10 is electrically connected on the support member 5 through the fusion layer H. This provides an electrical connection of a power supply pin 2 with the n-side pad electrode 10 b of the blue-violet semiconductor laser device 10 and the n-side pad electrode 20b of the red semiconductor laser device 20. That is, a common cathode connection of the blue-violet semiconductor laser device 10 and the red semiconductor laser device 20 is achieved.

When voltages are applied between the power supply pins 1a and 2 and between the power supply pins 1b and 2, respectively, the blue-violet semiconductor laser device 10 and the red semiconductor laser device 20 can be driven individually.

The semiconductor laser apparatus 500 in the ninth embodiment has electrical wiring similar to that shown in FIG. 29. Thus, in the semiconductor laser apparatus according to the ninth embodiment also, the drive voltage of each of the semiconductor laser devices can be easily controlled.

(3) Dimension of Current Blocking Layer

The heat dissipation blocking layer 330 and the low capacitance blocking layer 331 of the current blocking layer 10c are described. The heat dissipation blocking layer 330 and the low capacitance blocking layer 331 function similarly to the heat dissipation insulating layer 320 and the low capacitance insulating layer 321, respectively, of the insulating layer 32 described in each of the first and eighth embodiment.

Accordingly, the heat dissipation blocking layer 330 positioned below the ridge portion forming region of the red semiconductor laser device 20 has thickness smaller than that of the low capacitance blocking layer 331 positioned on the remaining region.

The thickness of the low capacitance blocking layer 331 will hereinafter be defined as t331, and the thickness of the heat dissipation blocking layer 330 as t330. The width (in the Y direction) of the heat dissipation blocking layer 330 will be defined as w330.

It is preferred here that the thickness t330 of the heat dissipation blocking layer 330 has a thickness about not more than half the thickness t331 of the low capacitance blocking layer 331.

In the semiconductor laser apparatus 500 of FIG. 39, the thickness t331 of the low capacitance blocking layer 331 is, e.g., 0.5 μm. It is thus preferred that the thickness t330 of the heat dissipation blocking layer 330 is not more than 0.25 μm. In this embodiment, the thickness t330 of the heat dissipation blocking layer 330 is set to, e.g., 0.05 μm.

It is also preferred that the width w330 of the heat dissipation blocking layer 330 is about not less than twice the width of the ridge portion Ri of the red semiconductor laser device 20, more preferably about not more than one-tenth the width of the conductive layer 33.

In the semiconductor laser apparatus 500 of FIG. 39, the width of the ridge portion Ri of the red semiconductor laser device 20 is about 2.5 μm, similarly to the ridge portion Ri of the red semiconductor laser device 20 for use in the seventh embodiment. It is thus preferred that the width w330 of the heat dissipation blocking layer 330 is not more than 5 μm.

Moreover, the width of the conductive layer 33 in the Y direction is about 280 μm. It is thus preferred that the width w330 of the heat dissipation blocking layer 330 is not more than 28 μm. In this embodiment, the width w330 of the heat dissipation blocking layer 330 is set to, e.g., 15 μm.

(4) Effects of Heat Dissipation Capability

As described above, in this embodiment, the thin heat dissipation blocking layer 330 is disposed below the ridge portion forming region of the red semiconductor laser device 20, and the low capacitance blocking layer 331 thicker than the heat dissipation blocking layer 330 is disposed on the remaining region.

This allows heat generated from the ridge portion Ri the red semiconductor laser device 20 and the semiconductor layer (i.e., the MQW active layer 204) that is positioned below the ridge portion Ri to be efficiently transmitted to the blue-violet semiconductor laser device 10 via the thin heat dissipation blocking layer 330.

That is, the thin heat dissipation blocking layer 330 ensures electrical isolation between the blue-violet semiconductor laser device 10 and the red semiconductor laser device 20 while improving the heat dissipation capability of a portion of the red semiconductor laser device 20.

(5) Function of Current Blocking Layer as a Dielectric

In the ninth embodiment also, the current blocking layer 10c under the conductive layer forming region functions as a dielectric when driving the red semiconductor laser device 20 by alternating voltage. Therefore, the value of capacitance induced in the current blocking layer 10c under the conductive layer forming region is set to not more than the value of capacitance induced in the first current blocking layer 20c.

The value of capacitance induced in the current blocking layer 10c may be adjusted by making adjustments to the thickness of the low capacitance blocking layer 331 of the current blocking layer 10c or setting the material, width, and length of the low capacitance blocking layer 331.

The value of capacitance induced in the current blocking layer 10c that is positioned under the conductive layer forming region is about 18 pF based on the equations (5) to (7).

On the other hand, the value of capacitance induced in the first current blocking layer 20c is about 28 pF based on the equation (3), as described in the seventh embodiment.

Accordingly, in the semiconductor laser apparatus 500 according to this embodiment, the value of capacitance induced in the current blocking layer 10c positioned under the conductive layer forming region is not more than the value of capacitance induced in the first current blocking layer 20c.

The value of effective capacitance in this case corresponds to not more than twice the value of capacitance induced in the first current blocking layer 20c. As a result, when the value of capacitance induced in the current blocking layer 10c is not more than the value of capacitance induced in the first current blocking layer 20c, the decrease in the cutoff frequency of the red semiconductor laser device 20 can be suppressed to a maximum of about 30% of the cutoff frequency thereof without the current blocking layer 10c.

As described above, by setting the thickness of the current blocking layer 10c so that the value of capacitance induced in the current blocking layer 10c is not more than the value of capacitance induced in the first current blocking layer 20c, the decrease in the cutoff frequency of the red semiconductor laser device 20 due to the influence of the current blocking layer 10c is sufficiently reduced. That is, deterioration in the high frequency characteristics of the red semiconductor laser device 20 due to the influence of the current blocking layer 10c is sufficiently reduced.

In addition, the blue-violet semiconductor laser device 10 and the red semiconductor laser device 20 are disposed so that the p-side pad electrode 10a and the p-side pad electrode 20a are positioned opposite to each other. This brings the semiconductor layer of the blue-violet semiconductor laser device 10 and the semiconductor layer of the red semiconductor laser device 20 close to each other, allowing the emission points of the blue-violet semiconductor laser device 10 and the red semiconductor laser device 20 to approach each other. Thus, when the laser beams emitted from the blue-violet semiconductor laser device 10 and the red semiconductor laser device 20 pass through a converging lens, aberration due to the lens can be reduced.

The current blocking layer 10c may have an alternative configuration. For example, an inorganic insulating material composed of an oxide such as $Al_2O_3$ or $ZrO_2$ or an inorganic insulting material composed of a nitride such as SiN or AlN may be used as the material of the current blocking layer 10c instead of $SiO_2$.

The current blocking layer 10c may also be formed of a multi-layer film composed of these materials. The current blocking layer 10c may also have any of the configurations described in FIG. 33 to FIG. 35.

10. Tenth Embodiment

(1) Configuration of Semiconductor Laser Apparatus

A semiconductor laser apparatus according to a tenth embodiment differs from the semiconductor laser apparatus 500 according to the seventh embodiment in configuration and operation as described below.

Figure 41:
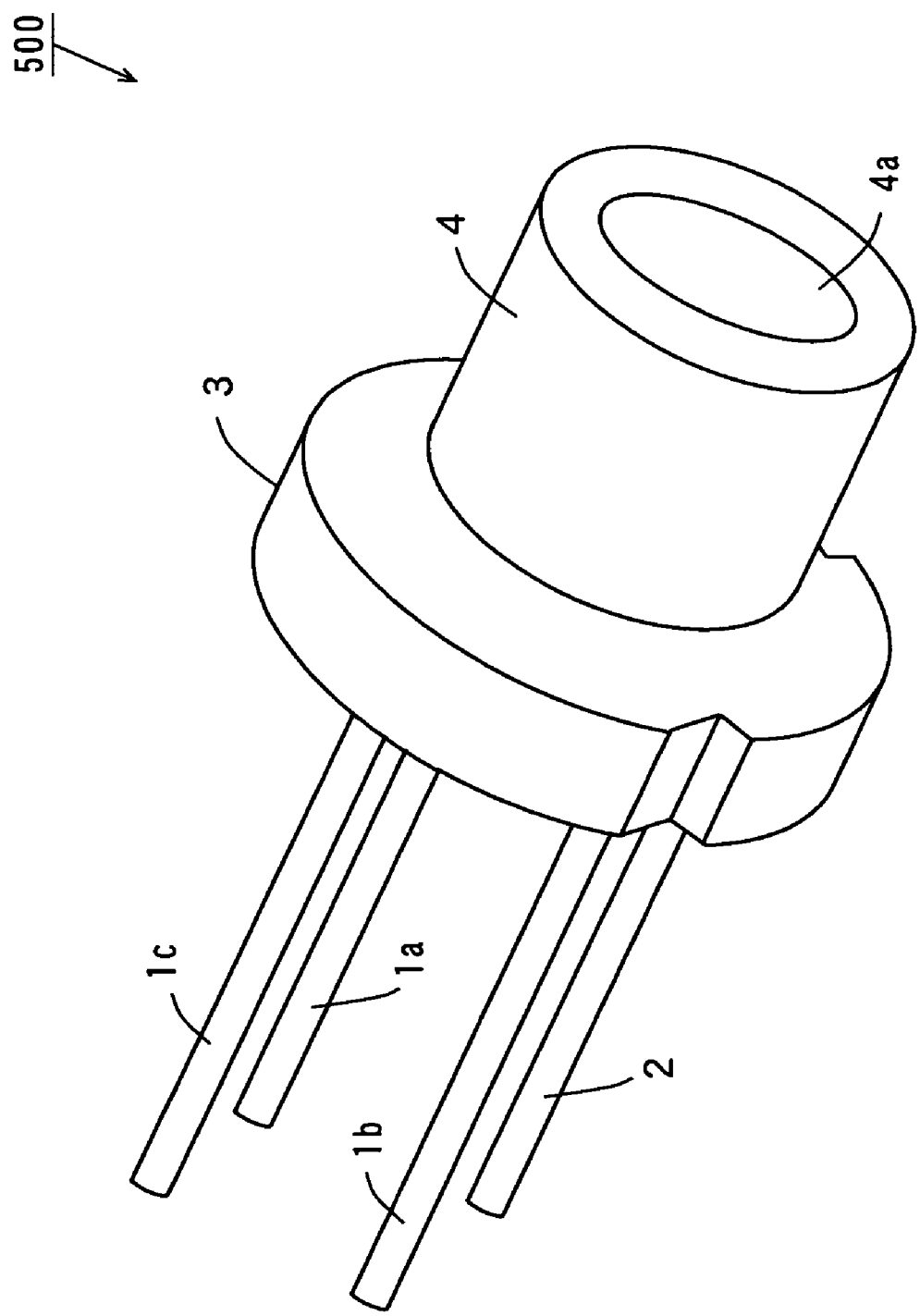
FIG. 41 is an external perspective view showing a semiconductor laser apparatus according to a tenth embodiment.

FIG. 41 is an external perspective view showing the semiconductor laser apparatus according to the tenth embodiment.

The semiconductor laser apparatus 500 according to the tenth embodiment in FIG. 41 further comprises a power supply pin 1c in addition to the semiconductor laser apparatus 500 according to the seventh embodiment.

Figure 42:
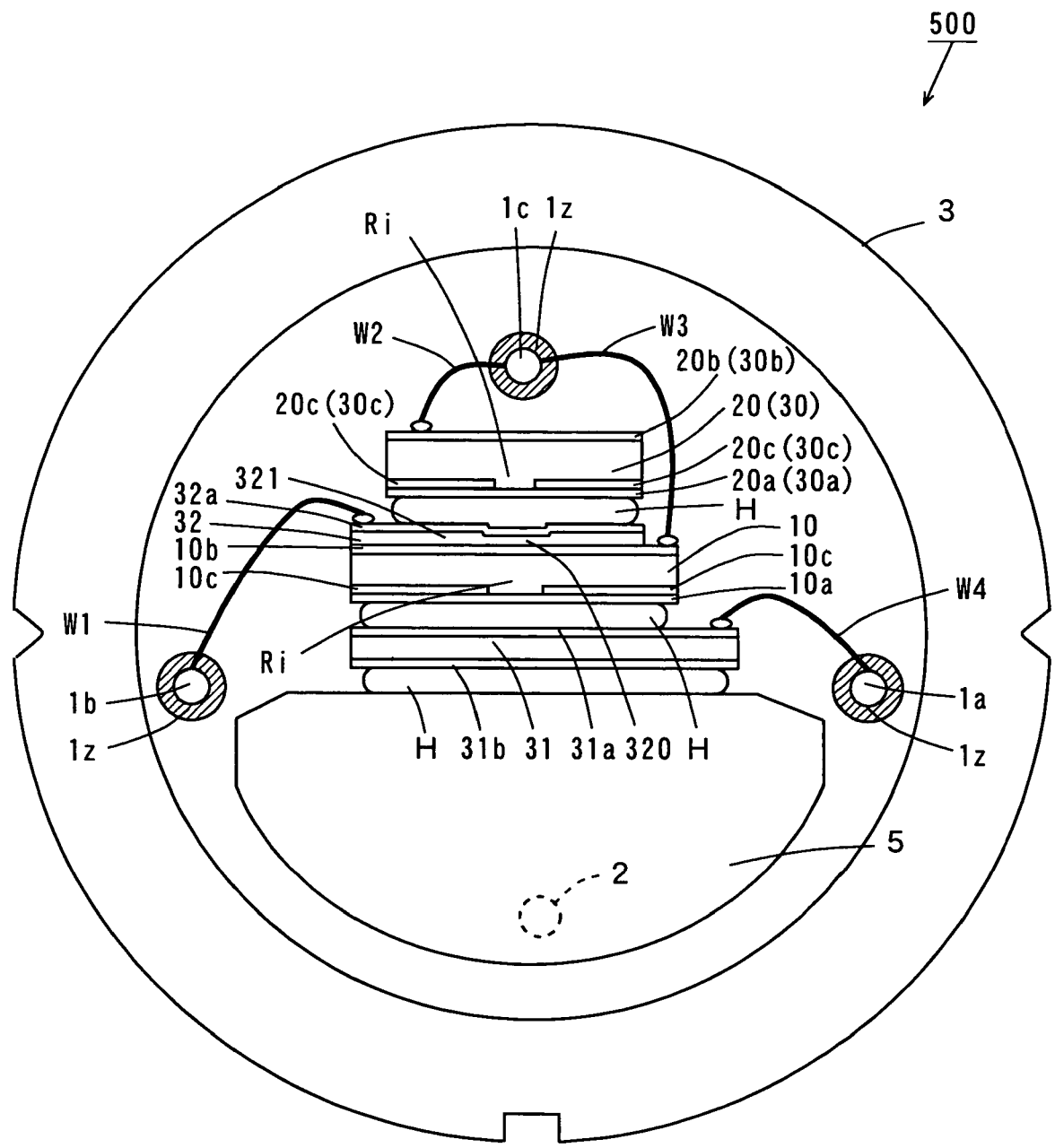
FIG. 42 is a schematic front view showing the semiconductor laser apparatus in FIG. 41 with a cover thereof being removed.
Figure 43:
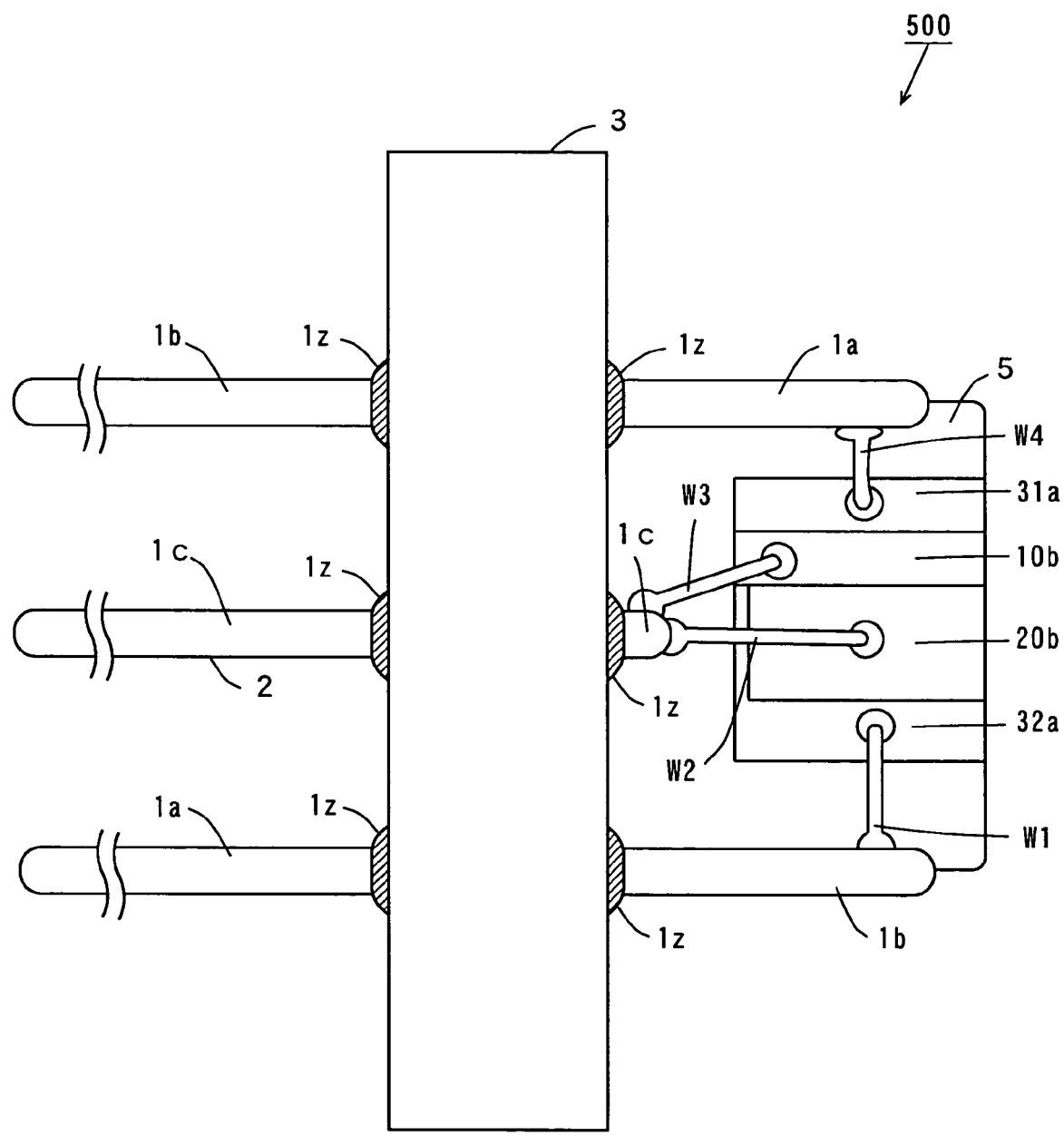
FIG. 43 is a schematic top view showing the semiconductor laser apparatus in FIG. 41 with the cover thereof being removed.

FIG. 42 is a schematic front view showing the semiconductor laser apparatus 500 in FIG. 41 with a cover 4 being removed, and FIG. 43 is a schematic top view showing the semiconductor laser apparatus 500 in FIG. 41 with the cover 4 being removed.

As shown in FIG. 42, similarly to the semiconductor laser apparatus 500 according to the seventh embodiment, a sub-substrate 31, a blue-violet semiconductor laser device 10, an insulating layer 32, and a red semiconductor laser device 20 are stacked in order through a plurality of fusion layers H on a conductive support member 5 integral with a package body 3.

In this embodiment also, the insulating layer 32 comprises a thin heat dissipation insulating layer 320 and a thick low capacitance insulating layer 321 as in the seventh embodiment.

In this embodiment also, the sub-substrate 31 has a conductive layer 31a on its upper surface and a conductive layer 31b on its lower surface. A conductive layer 32a is formed on the insulating layer 32.

As indicated by the parentheses in FIG. 42, an infrared semiconductor laser device 30 may be stacked on the blue-violet semiconductor laser device 10 instead of the red semiconductor laser device 20.

(2) Electrical Wiring of Semiconductor Laser Apparatus

As shown in FIG. 42 and FIG. 43, each of the power supply pins 1a, 1b, 1c is electrically isolated from the package body 3 through an insulating ring 1z.

The power supply pin 1a is electrically connected to the conductive layer 31a on the sub-substrate 31 through a wire W4. This provides an electrical connection of the power supply pin 1a to a p-side pad electrode 10a of the blue-violet semiconductor laser device 10.

The power supply pin 1b is electrically connected to the conductive layer 21a on the insulating layer 32 through a wire W1. This provides an electrical connection of the power supply pin 1b to a p-side pad electrode 20a of the red semiconductor laser device 20.

The power supply pin 1c is electrically connected to an n-side pad electrode 20b of the red semiconductor laser device 20 through a wire 2W, and also electrically connected to an n-side pad electrode 10b of the blue-violet semiconductor laser device 10 through a wire W3. The power supply pin 1c thus functions as a common n-side pad electrode for the blue-violet semiconductor laser device 10 and the red semiconductor laser device 20. That is, a common cathode connection of the blue-violet semiconductor laser device 10 and the red semiconductor laser device 20 is achieved.

Particularly in the tenth embodiment, each of the blue-violet semiconductor laser device 10 and the red semiconductor laser device 20 is electrically isolated from the conductive support member 5. That is, the blue-violet semiconductor laser device 10 and the red semiconductor laser device 20 are connected in a floating state from the support member 5.

When voltages are applied between the power supply pins 1a and 1c and between the power supply pins 1b and 1c, respectively, the blue-violet semiconductor laser device 10 and the red semiconductor laser device 20 can be driven individually.

Figure 44:
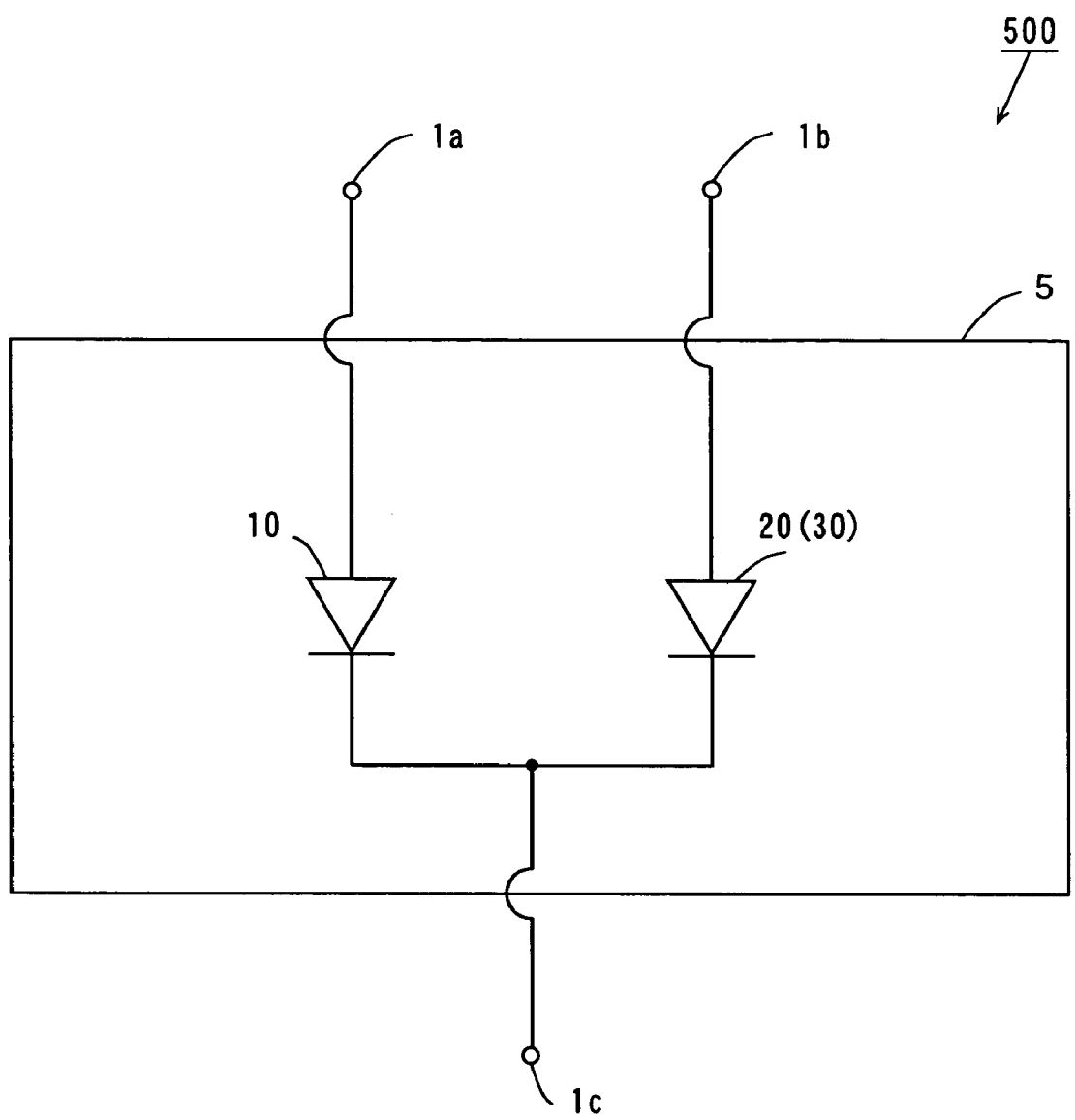
FIG. 44 is a circuit diagram showing electrical wiring of the semiconductor laser apparatus according to the tenth embodiment.

FIG. 44 is a circuit diagram showing electrical wiring of the semiconductor laser apparatus 500 according to the tenth embodiment.

As described above, the blue-violet semiconductor laser device 10 and the red semiconductor laser device 20 are both electrically isolated from the support member 5. This allows an arbitrary voltage to be applied to the power supply pin 1c.

For example, when driving the red semiconductor laser device 20, a ground potential is applied to the power supply pin 1c, and a voltage higher than the ground potential is applied to the power supply pin 1a. When, on the other hand, driving the blue-violet semiconductor laser device 10 that requires a drive voltage higher than that of the red semiconductor laser device 20, a negative voltage is applied to the power supply pin 1c, and a voltage equal to the drive voltage of the red semiconductor laser device 20 is applied to the power supply pin 1a.

The blue-violet semiconductor laser device 10 and the red semiconductor laser device 20 are thus electrically isolated from the support member 5. Besides, an arbitrary voltage can be applied to the power supply pin 1a that is electrically connected to the n-side pad electrode 10b of the blue-violet semiconductor laser device 10 and the n-side pad electrode 20b of the red semiconductor laser device 20, which facilitates controlling the drive voltage of each of the semiconductor laser devices.

In the tenth embodiment, the n-side pad electrode 10b of the blue-violet semiconductor laser device 10 and the n-side pad electrode 20b of the red semiconductor laser device 20 are electrically connected to each other while being electrically isolated from the support member 5. This allows voltages to be applied to the n-side pad electrode 10b of the blue-violet semiconductor laser device 10 and the n-side pad electrode 20b of the red semiconductor laser device 20, respectively.

11. Eleventh Embodiment

(1) Configuration of Semiconductor Laser Apparatus

A semiconductor laser apparatus according to an eleventh embodiment differs from the semiconductor laser apparatus 500 according to the seventh embodiment in configuration and operation as described below. The semiconductor laser apparatus according to the eleventh embodiment is externally similar to the semiconductor laser apparatus 500 in FIG. 41, and further comprises a power supply pin 1c in addition to the semiconductor laser apparatus 500 according to the seventh embodiment, similarly to the tenth embodiment.

Figure 45:
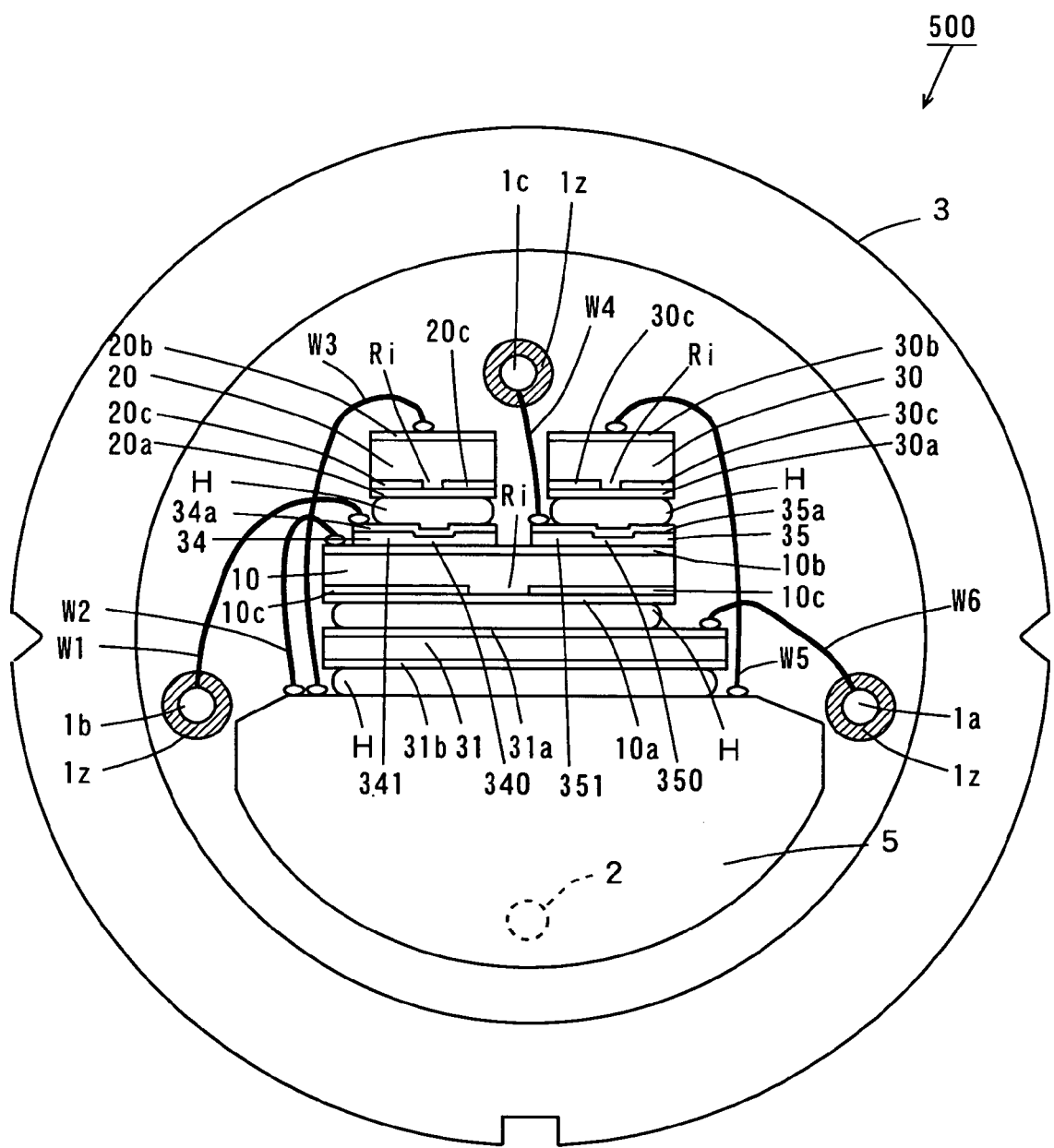
FIG. 45 is a schematic front view showing a semiconductor laser apparatus according to an eleventh embodiment with a cover thereof being removed.

FIG. 45 is a schematic front view showing the semiconductor laser apparatus according to the eleventh embodiment with a cover 4 being removed, and FIG. 46 is a schematic top view showing the semiconductor laser apparatus according to the eleventh embodiment with the cover 4 being removed.

Similarly to the semiconductor laser apparatus 500 according to the seventh embodiment, a sub-substrate 31 and a blue-violet semiconductor laser device 10 are stacked in order on a conductive support member 5 integral with a package body 3 through a plurality of fusion layers H therebetween. In the eleventh embodiment also, the sub-substrate 31 has a conductive layer 31a on its upper surface and a conductive layer 31b on its lower surface.

An insulating layer 34 made of $SiO_2$ is provided on a portion of an n-side pad electrode 10b (hereinafter referred to as a first insulating region) of the blue-violet semiconductor laser device 10. A red semiconductor laser device 20 is bonded on the insulating layer 34, as described below. The portion of the thickness (in the Z direction) of the insulating layer 34 below the ridge portion forming region of the bonded red semiconductor laser device 20 and the thickness of the remaining region of the insulating layer 34 are different.

That is, in this embodiment also, the insulating layer 34 between the blue-violet semiconductor laser device 10 and the red semiconductor laser device 20 comprises a thin heat dissipation insulating layer 340 and a thick low capacitance insulating layer 341. A conductive layer 34a containing Au is formed on the insulating layer 34.

Also, an insulating layer 35 made of $SiO_2$ is provided on a portion of the n-side pad electrode 10b except the first insulating region (hereinafter referred to as a second insulating region) of the blue-violet semiconductor laser device 10. An infrared semiconductor laser device 30 is bonded on the insulating layer 35, as described below. The portion of the thickness (in the Z direction) of the insulating layer 35 below the ridge portion forming region of the bonded infrared semiconductor laser device 30 and the thickness of the remaining region of the insulating layer 35 are different.

That is, in this embodiment also, the insulating layer 35 between the blue-violet semiconductor laser device 10 and the infrared semiconductor laser device 30 comprises a thin heat dissipation insulating layer 350 and a thick low capacitance insulating layer 351. A conductive layer 35a containing Au is formed on the insulating layer 35.

These first and second insulating regions are spaced from each other on the n-side pad electrode 10b. The conductive layer 34a on the insulating layer 34 and the conductive layer 35a on the insulating layer 35 are thus electrically isolated from each other.

The red semiconductor laser device 20 is bonded on the conductive layer 34a through a fusion layer H so that a p-side pad electrode 20a lies on the support member 5 side. The infrared semiconductor laser device 30 is bonded on the conductive layer 35a through a fusion layer H so that a p-side pad electrode 30a lies on the support member 5 side.

The blue-violet semiconductor laser device 10 in the eleventh embodiment is about 700 μm wide (in the Y direction) and about 600 μm long (in the X direction). The red semiconductor laser device 20 is about 200 μm wide (in the Y direction) and about 600 μm long (in the X direction). The infrared semiconductor laser device 30 is about 200 μm wide (in the Y direction) and about 600 μm long (in the X direction).

Further, each of the insulating layers 34, 35 is about 300 μm wide (in the Y direction) and about 600 μm long (in the X direction), similarly to the insulating layer 32 in the seventh embodiment.

(2) Electrical Wiring of Semiconductor Laser Apparatus

As shown in FIG. 45 and FIG. 46, each of power supply pins 1a, 1b, 1c is electrically isolated from the package body 3 through an insulating ring 1z.

The power supply pin 1a is electrically connected to the conductive layer 31a on the sub-substrate 31 through a wire W6. This provides an electrical connection of the power supply pin 1a to the p-side pad electrode 10a of the blue-violet semiconductor laser device 10.

The power supply pin 1b is electrically connected to the conductive layer 34a on the insulating layer 34 through a wire W1. This provides an electrical connection of the power supply pin 1b to the p-side pad electrode 20a of the red semiconductor laser device 20.

The power supply pin 1c is electrically connected to the conductive layer 35a on the insulating layer 35 through a wire W4. This provides an electrical connection of the power supply pin 1b to the p-side pad electrode 30a of the infrared semiconductor laser device 30.

An exposed portion of the upper surface of the support member 5 and the n-side pad electrode 10b of the blue-violet semiconductor laser device 10 are electrically connected through a wire W2, an exposed portion of the upper surface of the support member 5 and the n-side pad electrode 20b of the red semiconductor laser device 20 are electrically connected through a wire W3, and an exposed portion of the upper surface of the support member 5 and the n-side pad electrode 30b of the infrared semiconductor laser device 30 are electrically connected through a wire W5.

This provides an electrical connection of a power supply pin 2 to the n-side pad electrode 10b of the blue-violet semiconductor laser device 10, the n-side pad electrode 20b of the red semiconductor laser device 20, and the n-side pad electrode 30b of the infrared semiconductor laser device 30. That is, a common cathode connection of the blue-violet semiconductor laser device 10, the red semiconductor laser device 20 and the infrared semiconductor laser device 30 is achieved.

When voltages are applied between the power supply pins 1a and 2, between the power supply pins 1b and 2, and between the power supply pins 1c and 2, respectively, the blue-violet semiconductor laser device 10, the red semiconductor laser device 20, and the infrared semiconductor laser device 30 can be driven individually. The semiconductor laser apparatus 500 according to this embodiment is thus capable of selectively emitting three kinds of laser beams, i.e., the blue-violet laser beam, the red laser beam, and the infrared laser beam.

Figure 47:
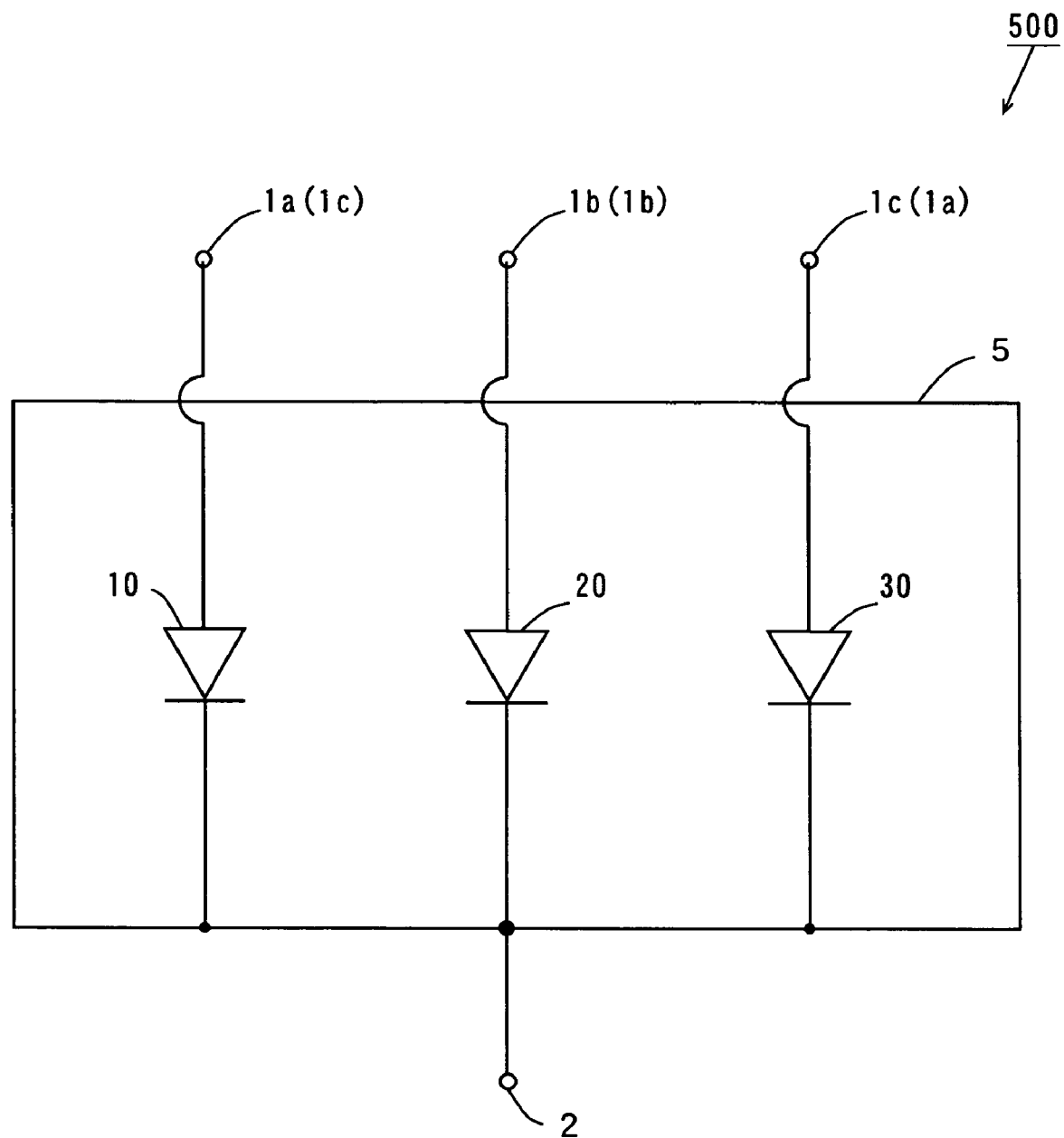
FIG. 47 is a circuit diagram showing electrical wiring of the semiconductor laser apparatus according to the eleventh embodiment.

FIG. 47 is a circuit diagram showing electrical wiring of the semiconductor laser apparatus 500 according to the eleventh embodiment.

As described above, the power supply pin 2 is electrically connected to the support member 5, and also electrically connected to the n-side pad electrode 10b of the blue-violet semiconductor laser device 10, the n-side pad electrode 20b of the red semiconductor laser device 20, and the n-side pad electrode 30b of the infrared semiconductor laser device 30.

On the other hand, the p-side pad electrode 10a of the blue-violet semiconductor laser device 10, the p-side pad electrode 20a of the red semiconductor laser device 20, and the p-side pad electrode 30a of the infrared semiconductor laser device 30 are electrically isolated from the support member 5, i.e., from the power supply pin 2.

In order to drive the blue-violet semiconductor laser device 10, therefore, it is necessary to apply a voltage higher than the ground potential at the power supply pin 2 to the power supply pin 1a. In order to drive the red semiconductor laser device 20, it is necessary to apply a voltage higher than the ground potential at the power supply pin 2 to the power supply pin 1b. In order to drive the infrared semiconductor laser device 30, it is necessary to apply a voltage higher than the ground potential at the power supply pin 2 to the power supply pin 1c.

By applying a voltage higher than the ground potential to any of the power supply pins 1a, 1b, 1c in this way, the blue-violet semiconductor laser device 10, the red semiconductor laser device 20, or the infrared semiconductor laser device 30 can be driven individually in the semiconductor laser apparatus 500 according to the eleventh embodiment. As a result, the drive voltage of each of the semiconductor laser devices can be easily controlled.

(3) Functions of Sub-Substrate and Insulating Layer as Dielectrics and Effects Thereof In the eleventh embodiment, when driving the blue-violet semiconductor laser device 10 by alternating voltage, the sub-substrate 31 functions as a dielectric. Similarly to the seventh embodiment, however, the thickness of the sub-substrate 31 is about 200 μm, which is significantly greater than a thickness of 0.5 μm for the current blocking layer 10c. This makes the influence of the sub-substrate 31 upon the blue-violet semiconductor laser device 10 almost negligible.

When, on the other hand, driving the red semiconductor laser device 20 by alternating voltage, the insulating layer 34 functions as a dielectric. In the eleventh embodiment, the shape of the first current blocking layer 20c is similar to that of the first current blocking layer 20c described in the seventh embodiment. The shape of the insulating layer 34 is also similar to that of the insulating layer 32 described in the seventh embodiment.

That is, the heat dissipation insulating layer 340 and the low capacitance insulating layer 341 of the insulating layer 34 correspond to the heat dissipation insulating layer 320 and the low capacitance insulating layer 321, respectively, of the insulating layer 32 in the seventh embodiment. As a result, deterioration of the high frequency characteristics of the red semiconductor laser device 20 due to the influence of the insulating layer is sufficiently reduced.

When, on the other hand, driving the infrared semiconductor laser device 30 by alternating voltage, the insulating layer 35 functions as a dielectric. In the eleventh embodiment, the shape of the first current blocking layer 30c is similar to that of the first current blocking layer 20c described in the seventh embodiment. The shape of the insulating layer 35 is also similar to that of the insulating layer 32 described in the seventh embodiment.

That is, the heat dissipation insulating layer 350 and the low capacitance insulating layer 351 of the insulating layer 35 correspond to the heat dissipation insulating layer 320 and the low capacitance insulating layer 321, respectively, of the insulating layer 32 in the seventh embodiment. As a result, deterioration of the high frequency characteristics of the infrared semiconductor laser device 30 due to the influence of the insulating layer is sufficiently reduced.

(4) Effects of Semiconductor Laser Apparatus (4-a) Main Effects

In the eleventh embodiment, the thin heat dissipation insulating layer 340 ensures electrical isolation between the blue-violet semiconductor laser device 10 and the red semiconductor laser device 20 while improving the heat dissipation capability of a portion of the red semiconductor laser device 20. This sufficiently reduces deterioration of the heat dissipation capability.

Also, the thin heat dissipation insulating layer 350 ensures electrical isolation between the blue-violet semiconductor laser device 10 and the infrared semiconductor laser device 30 while improving the heat dissipation capability of a portion of the infrared semiconductor laser device 30. This sufficiently reduces deterioration of the heat dissipation capability.

As described above, in the semiconductor laser apparatus 500 according to the eleventh embodiment, the common cathode connection of each of the blue-violet semiconductor laser device 10, the red semiconductor laser device 20 and the infrared semiconductor laser device 30 is achieved. It is therefore possible to drive the blue-violet semiconductor laser device 10, the red semiconductor laser device 20, and the infrared semiconductor laser device 30 individually by applying a voltage higher than the ground potential to any of the power supply pins 1a, 1b, 1c.

This facilitates controlling the drive voltage of each of the semiconductor laser devices. As a result, the semiconductor laser apparatus 500 is capable of selectively emitting three kinds of laser beams, i.e., the blue-violet laser beam, the red laser beam, and the infrared laser beam.

In the eleventh embodiment, the value of capacitance induced in the insulating layer 34 is not more than the value of capacitance induced in the first current blocking layer 20c. This sufficiently reduces deterioration of the high frequency characteristics of the red semiconductor laser device 20 due to the influence of the insulating layer.

In the eleventh embodiment, the value of capacitance induced in the insulating layer 35 is not more than the value of capacitance induced in the first current blocking layer 30c. This sufficiently reduces deterioration of the high frequency characteristics of the infrared semiconductor laser device 30 due to the influence of the insulating layer.

(4-b) Other Effects

In the eleventh embodiment, the red semiconductor laser device 20 and the infrared semiconductor laser device 30 may be fabricated on the same substrate. The resultant monolithic structure of the red semiconductor laser device 20 and the infrared semiconductor laser device 30 allows a significant improvement in the accuracy of the interval between the red beam emission point of the red semiconductor laser device 20 and the infrared emission point of the infrared semiconductor laser device 30.

12. Twelfth Embodiment

(1) Configuration of Semiconductor Laser Apparatus

A semiconductor laser apparatus according to a twelfth embodiment differs from the semiconductor laser apparatus 500 according to the eleventh embodiment in configuration and operation as described below. The semiconductor laser apparatus according to the twelfth embodiment is externally similar to the semiconductor laser apparatus 500 in FIG. 41, similarly to that in the eleventh embodiment.

Figure 48:
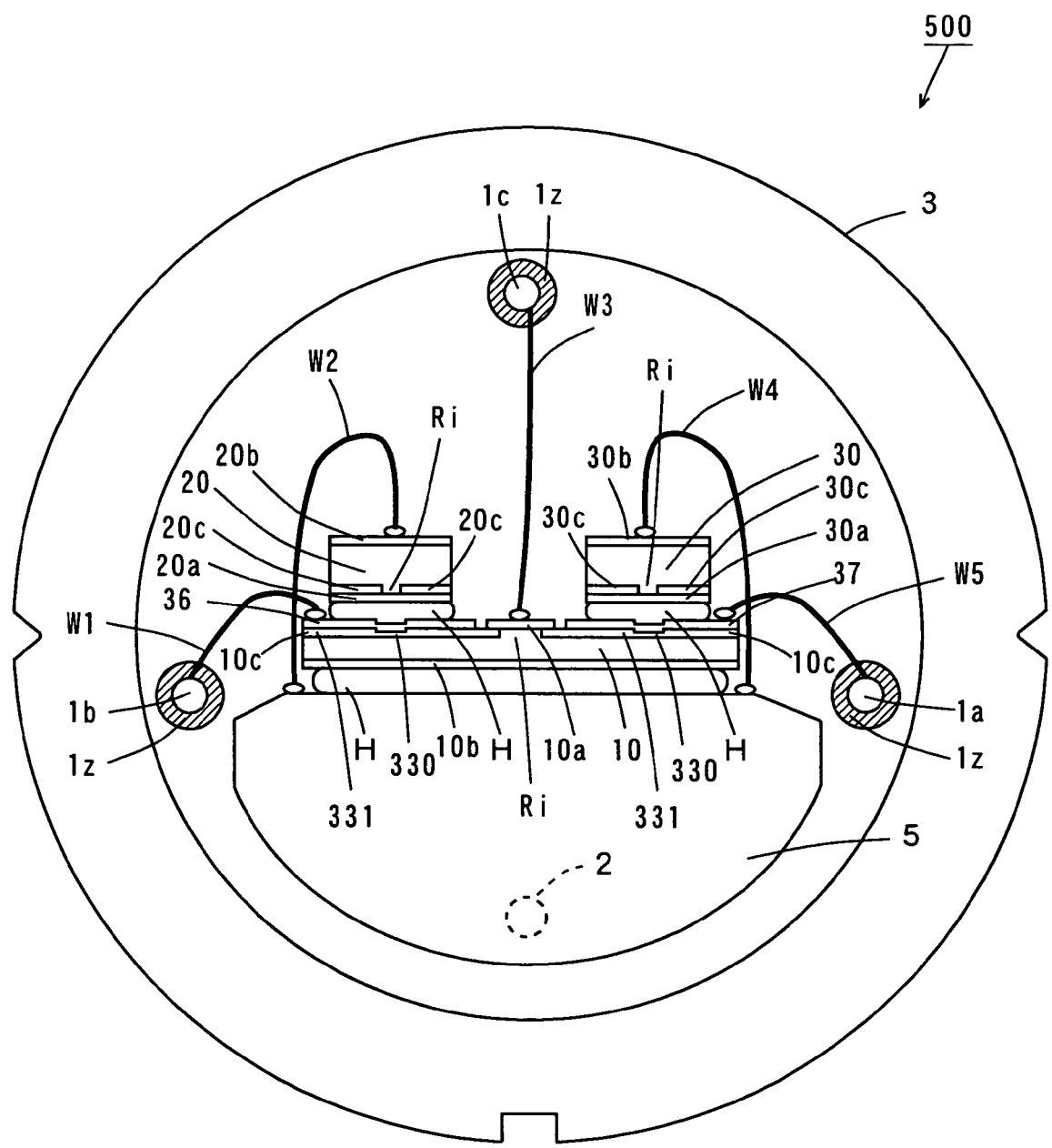
FIG. 48 is a schematic front view showing a semiconductor laser apparatus according to a twelfth embodiment with a cover thereof being removed.
Figure 49:
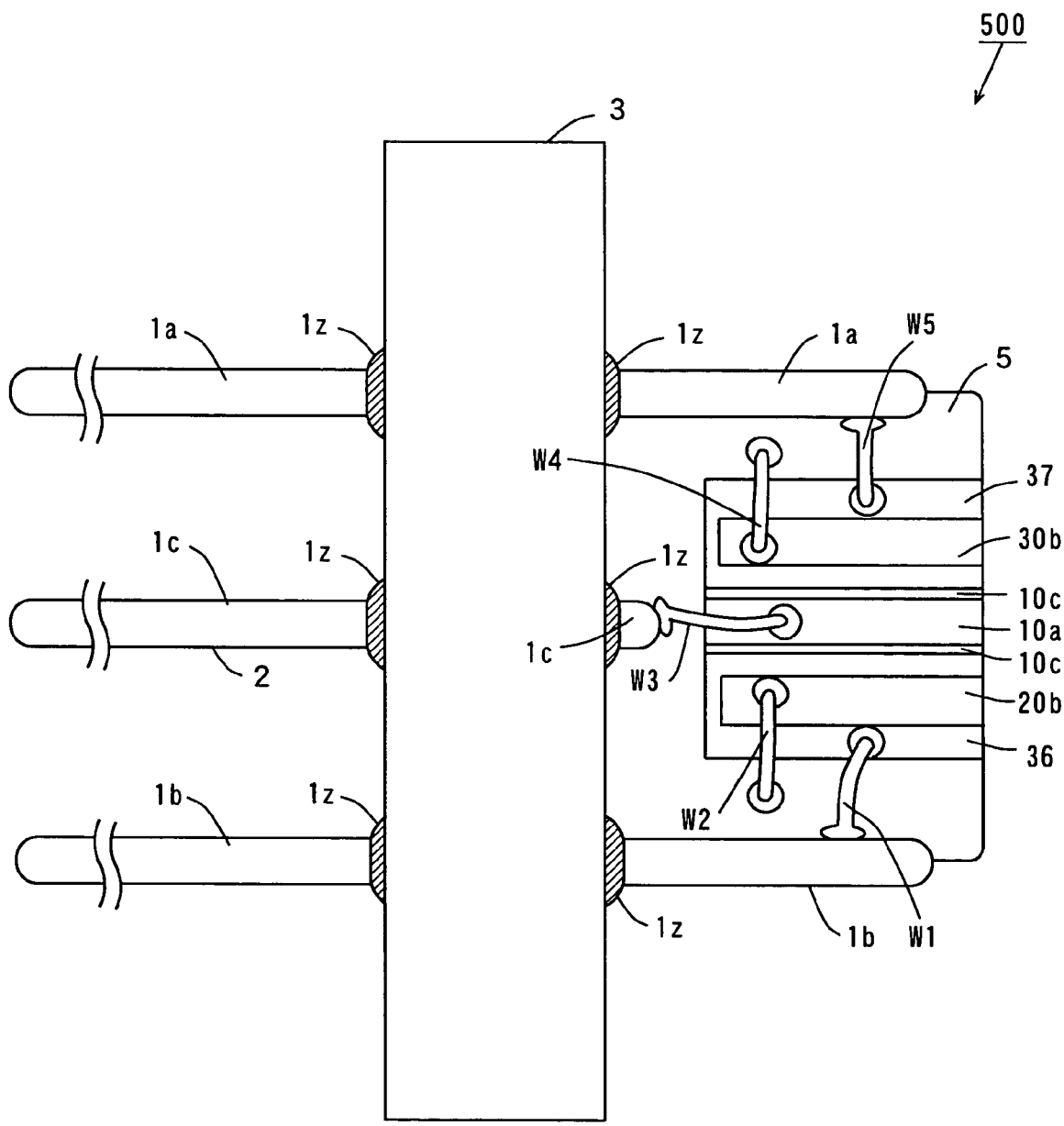
FIG. 49 is a schematic top view showing the semiconductor laser apparatus according to the twelfth embodiment with the cover thereof being removed.
Figure 50:
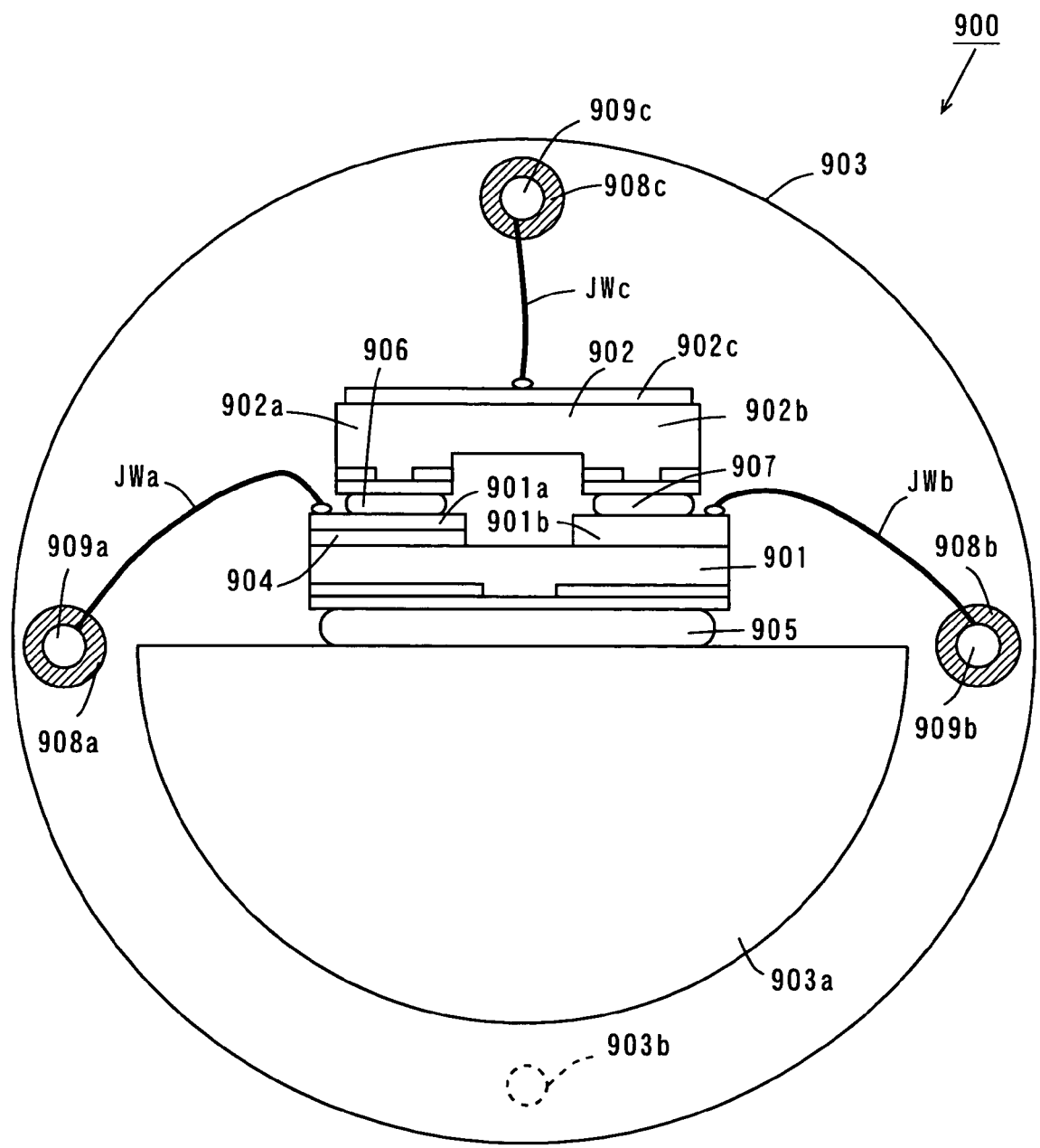
FIG. 50 is a schematic diagram showing the semiconductor laser apparatus described in JP 2001-230502 A.
Figure 51:
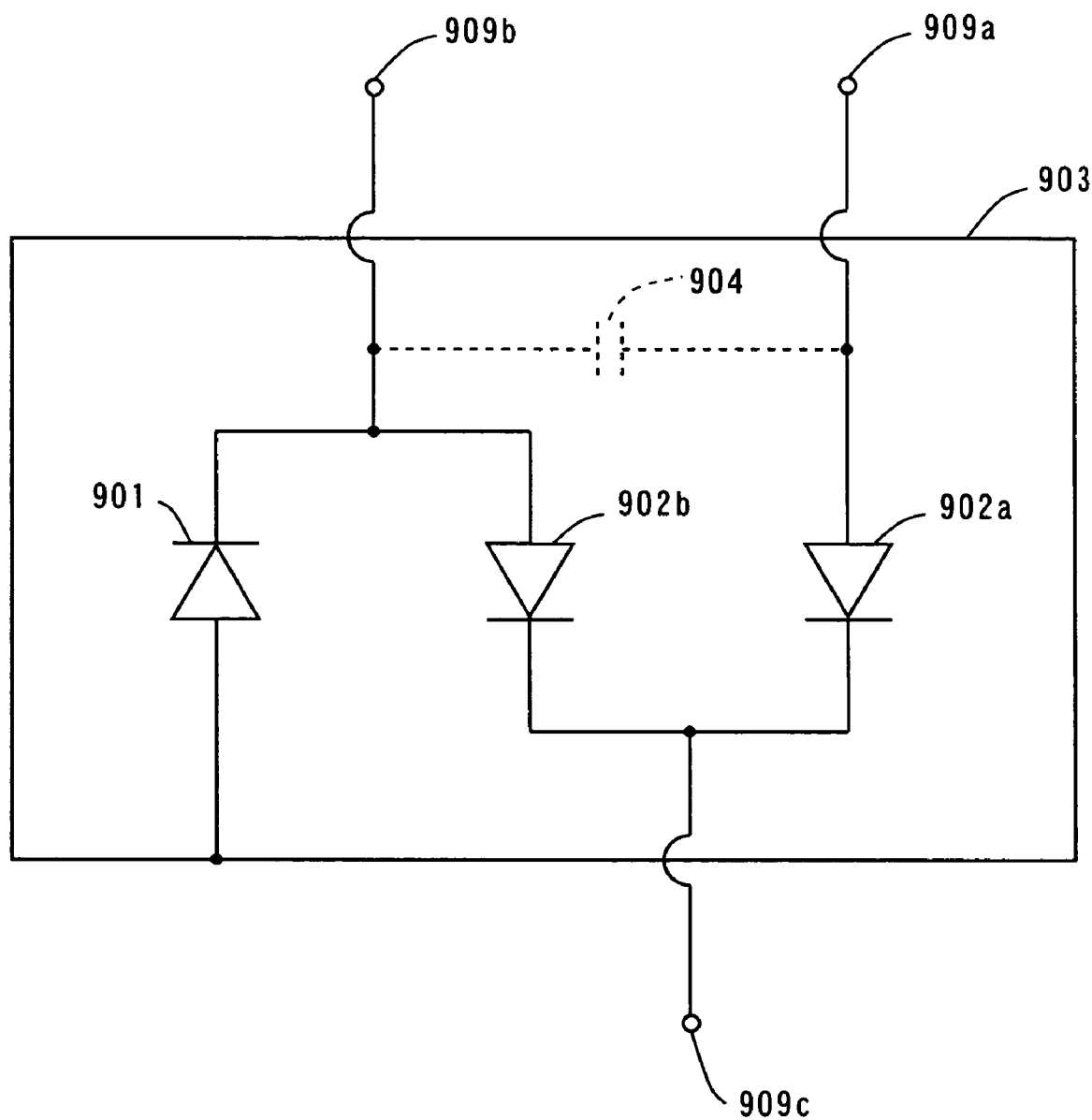
FIG. 51 is a circuit diagram showing electrical wiring of the semiconductor laser apparatus in FIG. 50.

FIG. 48 is a schematic front view showing the semiconductor laser apparatus according to the twelfth embodiment with a cover 4 being removed, and FIG. 49 is a schematic top view showing the semiconductor laser apparatus according to the twelfth embodiment with the cover 4 being removed.

As shown in FIG. 48, a conductive fusion layer H is formed on a conductive support member 5 integral with a package body 3. A blue-violet semiconductor laser device 10 is bonded on the fusion layer H so that an n-side pad electrode 10b lies on the support member 5 side.

In the twelfth embodiment, the blue-violet semiconductor laser device 10 is about 800 μm wide (in the Y direction) and about 600 μm long (in the X direction).

A p-side pad electrode 10a of the blue-violet semiconductor laser device 10 is formed on a portion of the current blocking layer 10c. Similarly to the ninth embodiment, the ridge portion Ri of the blue-violet semiconductor laser device 10 is formed under the p-side pad electrode 10a, and the current blocking layer 10c is made of $SiO_2$.

In the twelfth embodiment, the portion where the p-side pad electrode 10a is formed is about one-fourth the size of the entire blue-violet semiconductor laser device 10 in the X-Y plane. For example, the p-side pad electrode 10a is about 200 μm wide (in the Y direction) and about 600 μm long (in the X direction). In the semiconductor laser apparatus 500 of FIG. 48, a strip-like p-side pad electrode 10a is formed on a central portion of the blue-violet semiconductor laser device 10 in the Y direction.

A red semiconductor laser device 20 and an infrared semiconductor laser device 30 are bonded on a current blocking layer 10c, as described below. The thickness (in the Z direction) of the current blocking layer 10c below the ridge portion Ri of each of the bonded red semiconductor laser device 20 and the bonded infrared semiconductor laser device 30 and the thickness of the remaining region of the current blocking layer 10c are different.

Similarly to the ninth embodiment, the portion of the current blocking layer 10c that is positioned below the ridge portion forming region of each of the red semiconductor laser device 20 and the infrared semiconductor laser device 30 is termed a "heat dissipation blocking layer 330". The remaining region of the current blocking layer 10c is termed a "low capacitance blocking layer 331".

In the X-Y plane, conductive layers 36, 37, each containing Au, are formed on the remaining region of the current blocking layer 10c at a distance from the p-side pad electrode 10a. The portion where the conductive layer 36 is formed in the X-Y plane is referred to as a first conductive layer forming region, and the portion where the conductive layer 37 is formed in the X-Y plane is referred to as a second conductive layer forming region. The p-side pad electrode 10a is positioned between the first and second conductive layer forming regions in the Y direction.

Each of the conductive layers 36, 37 is about 280 μm wide (in the Y direction) and about 600 μm long (in the X direction).

The red semiconductor laser device 20 is bonded on the conductive layer 36 through a fusion layer H made of AuSn so that a p-side pad electrode 20a lies on the support member 5 side.

The infrared semiconductor laser device 30 is bonded on the conductive layer 37 through a fusion layer made of AuSn so that a p-side pad electrode 30a lies on the support member 5 side.

Similarly to the eleventh embodiment, each of the red semiconductor laser device 20 and the infrared semiconductor laser device 30 is about 200 μm wide (in the Y direction) and about 600 μm long (in the X direction).

(2) Electrical Wiring of Semiconductor Laser Apparatus

As shown in FIG. 48 and FIG. 49, each of power supply pins 1a, 1b, 1c is electrically isolated from the package body 3 through an insulating ring 1z.

The power supply pin 1a is electrically connected with the conductive layer 37 through a wire W5. This provides an electrical connection of the power supply pin 1a to a p-side pad electrode 30a of the infrared semiconductor laser device 30.

The power supply pin 1b is electrically connected with the conductive layer 36 through a wire W1. This provides an electrical connection of the power supply pin 1b to a p-side pad electrode 20a of the red semiconductor laser device 20.

The power supply pin 1c is electrically connected with the p-side pad electrode 10a of the blue-violet semiconductor laser device 10 through a wire W3.

An exposed portion of the upper surface of the support member 5 is electrically connected to an n-side pad electrode 20b of the red semiconductor laser device 20 through a wire W2. An exposed portion of the upper surface of the support member 5 is electrically connected to an n-side pad electrode 30b of the infrared semiconductor laser device 30 through a wire W4.

In the twelfth embodiment, the n-side pad electrode 10b of the blue-violet semiconductor laser device 10 is electrically connected on the support member 5 through the fusion layer H. This provides an electrical connection of a power supply pin 2 to then-side pad electrode 10b of the blue-violet semiconductor laser device 10, the n-side pad electrode 20b of the red semiconductor laser device 20, and the n-side pad electrode 30b of the infrared semiconductor laser device 30. That is, a common cathode connection of the blue-violet semiconductor laser device 10, the red semiconductor laser device 20, and the infrared semiconductor laser device 30 is achieved.

When voltages are applied between the power supply pins 1c and 2, between the power supply pins 1b and 2, and between the power supply pins 1a and 2, respectively, the blue-violet semiconductor laser device 10, the red semiconductor laser device 20, and the infrared semiconductor laser device 30 can be driven individually. The semiconductor laser apparatus 500 according to the twelfth embodiment has electrical wiring similar to that shown in FIG. 47. The parentheses in FIG. 47 indicate the power supply pins according to the twelfth embodiment. Accordingly, in the semiconductor laser apparatus 500 according to the twelfth embodiment also, the drive voltage of each of the semiconductor laser devices 10, 20, 30 can be easily controlled.

(3) Function of Current Blocking Layer as a Dielectric

When driving the red semiconductor laser device 20 by alternating voltage, the current blocking layer 10c under the first conductive layer forming region functions as a dielectric. Therefore, in the twelfth embodiment, the value of capacitance induced in the current blocking layer 10c under the conductive layer forming region is set to not more than the value of capacitance induced in the first current blocking layer 20c.

In the twelfth embodiment, the shape of the first conductive layer forming region, i.e., the conductive layer 36, is similar to the shape of the conductive layer forming region, i.e., the conductive layer 33, in the ninth embodiment.

In this embodiment, therefore, the shape of the current blocking layer 10c under the first conductive layer forming region is set similarly to the shape of the current blocking layer 10c below the conductive layer forming region in the ninth embodiment.

In this case, the heat dissipation blocking layer 330 and the low capacitance blocking layer 331 under the first conductive layer forming region correspond to the heat dissipation blocking layer 330 and the low capacitance blocking layer 331, respectively, under the conductive layer forming region in the ninth embodiment. As a result, deterioration of the high frequency characteristics of the red semiconductor laser device 20 due to the influence of the insulating layer is sufficiently reduced.

When driving the infrared semiconductor laser device 30 by alternating voltage, the current blocking layer 10c under the second conductive layer forming region functions as a dielectric. In the twelfth embodiment, therefore, the value of capacitance induced in the current blocking layer 10c under the first conductive forming region is set to not more than the value of capacitance induced in the first current blocking layer 30c.

In the twelfth embodiment, the shape of the second conductive forming region, i.e., the conductive layer 37, is similar to the shape of the conductive layer forming region, i.e., the conductive layer 33, in the ninth embodiment.

In this embodiment, therefore, the shape of the current blocking layer 10c under the second conductive layer forming region is set similarly to the shape of the current blocking layer 10c below the conductive layer forming region in the ninth embodiment.

In this case, the heat dissipation blocking layer 330 and the low capacitance blocking layer 331 under the second conductive layer forming region correspond to the heat dissipation blocking layer 330 and the low capacitance blocking layer 331, respectively, under the conductive layer forming region in the ninth embodiment. As a result, deterioration of the high frequency characteristics of the infrared semiconductor laser device 30 due to the influence of the insulating layer is sufficiently reduced.

(4) Effects of Semiconductor Laser Apparatus (4-a) Main Effects

In the twelfth embodiment, the thin heat dissipation blocking layer 330 ensures electrical isolation between the blue-violet semiconductor laser device 10 and the red semiconductor laser device 20 while improving the heat dissipation capability of a portion of the red semiconductor laser device 20. This sufficiently reduces deterioration of the heat dissipation capability.

Also, the thin heat dissipation blocking layer 330 ensures electrical isolation between the blue-violet semiconductor laser device 10 and the infrared semiconductor laser device 30 while improving the heat dissipation capability of a portion of the infrared semiconductor laser device 30. This sufficiently reduces deterioration of the heat dissipation capability.

As described above, in the semiconductor laser apparatus 500 according to the twelfth embodiment, the common cathode connection of the blue-violet semiconductor laser device 10, the red semiconductor laser device 20 and the infrared semiconductor laser device 30 is achieved. It is therefore possible to drive each of the blue-violet semiconductor laser device 10, the red semiconductor laser device 20, and the infrared semiconductor laser device 30 individually by applying a voltage higher than the ground potential to any of the power supply pins 1a, 1b, 1c.

This facilitates controlling the drive voltage of each of the semiconductor laser devices. As a result, the semiconductor laser apparatus 500 is capable of selectively emitting three kinds of laser beams, i.e., the blue-violet laser beam, the red laser beam, and the infrared laser beam.

In the twelfth embodiment, the value of capacitance induced in the current blocking layer 10c under the conductive layer 36 is not more than the value of capacitance induced in the first current blocking layer 20c. This sufficiently reduces deterioration of the high frequency characteristics of the red semiconductor laser device 20 due to the influence of the insulating layer.

In the twelfth embodiment, the value of capacitance induced in the current blocking layer 10c under the conductive layer 37 is not more than the value of capacitance induced in the first current blocking layer 30c. This sufficiently reduces deterioration of the high frequency characteristics of the infrared semiconductor laser device 30 due to the influence of the insulating layer.

(4-b) Other Effects

As described above, in the semiconductor laser apparatus 500 according to the twelfth embodiment, the p-side pad electrode 10a of the blue-violet semiconductor laser device 10 is disposed opposite to the p-side pad electrode 20a of the red semiconductor laser device 20 and the p-side pad electrode 30a of the infrared semiconductor laser device 30.

This allows the emission points of the respective blue-violet semiconductor laser device 10, the red semiconductor laser device 20, and the infrared semiconductor laser device 30 to be disposed almost in a line in the Y-Z plane.

In the twelfth embodiment, the red semiconductor laser device 20 and the infrared semiconductor laser device 30 may be fabricated on the same substrate. The resultant monolithic structure of the red semiconductor laser device 20 and the infrared semiconductor laser device 30 allows a significant improvement in the accuracy of the interval between the red beam emission point of the red semiconductor laser device 20 and the infrared emission point of the infrared semiconductor laser device 30.

(5) Correspondence Between Each Claim Element and Each Component in Embodiment

In each of the seventh to twelfth embodiments, the blue-violet laser beam corresponds to a light beam of a first wavelength; the blue-violet semiconductor laser device 10 corresponds to a first semiconductor laser device; each of the red laser beam and the infrared laser beam corresponds to a light beam of a second wavelength; and each of the red semiconductor laser device 20 and the infrared semiconductor laser device 30 corresponds to a second semiconductor laser device.

The portion of the MQW active layer 104 of the blue-violet semiconductor laser device 10 that is positioned below the ridge portion Ri (see FIG. 31) corresponds to a first optical waveguide; and each of the portion of the MQW active layer 204 of the red semiconductor laser device 20 positioned below the ridge portion (see FIG. 8) and the portion of the MQW active layer 304 of the infrared semiconductor laser device 30 positioned below the ridge portion Ri (see FIG. 9) corresponds to a second optical waveguide.

Each of the insulating layers 32, 34, 35 and the current blocking layer 10c corresponds to an insulating layer; the laser emitting facet 20T corresponds to a light beam emitting facet; each of the heat dissipation insulating layers 320, 340, 350 and the heat dissipation blocking layer 330 corresponds to a first portion of an insulating layer; and each of the low capacitance insulating layers 321, 341, 351 and the low capacitance blocking layer 331 corresponds to a second portion of the insulating layer.

The current blocking layer 10c corresponds to a first current blocking layer; each of the first current blocking layers 20c, 30c corresponds to a second current blocking layer; the n-GaN substrate 1s corresponds to a first substrate; the semiconductor layer on the n-GaN substrate is corresponds to a first semiconductor layer; the p-side pad electrode 10a corresponds to a first electrode; and the n-side pad electrode 10b corresponds to a second electrode.

The n-GaAs substrate 5X corresponds to a second substrate; the semiconductor layer on the n-GaAs substrate 5X corresponds to a second semiconductor layer; each of the p-side pad electrode 20a and the p-side pad electrode 30a corresponds to a third electrode; and each of the n-side pad electrode 20b and the n-side pad electrode 30b corresponds to a fourth electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser apparatus comprising:
a conductive support member;
an insulating layer;
a conductive layer formed on one surface of said insulating layer;
a first semiconductor laser device having a first semiconductor layer formed on a first substrate, a first electrode formed on said first semiconductor layer, and a second electrode formed on said first substrate, and emitting a light beam of a first wavelength; and
a second semiconductor laser device having a second semiconductor layer formed on a second substrate, a third electrode formed on said second semiconductor layer, and a fourth electrode formed on said second substrate, and emitting a light beam of a second wavelength,
said second semiconductor layer including a current blocking layer that blocks a current that flows from said third electrode to said fourth electrode,
said first semiconductor laser device being provided on said support member so that said first electrode is positioned on said support member side,
said insulating layer and said conductive layer being provided in order on said second electrode of said first semiconductor laser device,
said second semiconductor laser device being provided on said conductive layer so that said third electrode is electrically connected to said conductive layer,
said fourth electrode being electrically connected with said second electrode,
a value of capacitance induced between said second electrode and said conductive layer with said insulating layer sandwiched therebetween, being not more than a value of capacitance induced in said current blocking layer,
said first semiconductor laser device having a first optical waveguide,
said second semiconductor laser device having a second optical waveguide,
said insulating layer having a first portion and a second portion that is different from said first portion,
said first portion of said insulating layer being positioned in at least a region corresponding to a light beam emitting facet of said second optical waveguide,
said first portion having a thermal conductive property higher than that of said second portion,
said first portion having a thickness smaller than that of said second portion, and
said first portion extends along said second optical waveguide, the width of said first portion becoming greater toward the light emitting facet side of said second optical waveguide.

2. The semiconductor laser apparatus according to claim 1, wherein
the value of capacitance induced in said insulating layer is not more than one-fifth the value of capacitance induced in said current blocking layer.

3. The semiconductor laser apparatus according to claim 1, further comprising a sub-substrate having a predetermined thickness that is inserted between said support member and said first semiconductor laser device.

4. The semiconductor laser apparatus according to claim 1, wherein
said first semiconductor laser device includes a nitride-based semiconductor.

5. The semiconductor laser apparatus according to claim 1, wherein
said second electrode and said fourth electrode are electrically connected to each other while being electrically isolated from said support member.

6. The semiconductor laser apparatus according to claim 1, wherein said first portion has a strip shape corresponding to said second optical waveguide.

7. The semiconductor laser apparatus according to claim 1, wherein said first portion is formed only on a region of said second optical wave guide on the light beam emitting facet side.

8. A semiconductor laser apparatus comprising:
a conductive support member;
an insulating layer;
a conductive layer formed on one surface of said insulating layer;
a first semiconductor laser device having a first semiconductor layer formed on a first substrate, a first electrode formed on said first semiconductor layer, and a second electrode formed on said first substrate, and emitting a light beam of a first wavelength; and
a second semiconductor laser device having a second semiconductor layer formed on a second substrate, a third electrode formed on said second semiconductor layer, and a fourth electrode formed on said second substrate, and emitting a light beam of a second wavelength,
said second semiconductor layer including a current blocking layer that blocks a current that flows from said third electrode to said fourth electrode,
said first semiconductor laser device being provided on said support member so that said first electrode is positioned on said support member side,
said insulating layer and said conductive layer being provided in order on said second electrode of said first semiconductor laser device,
said second semiconductor laser device being provided on said conductive layer so that said third electrode is electrically connected to said conductive layer,
said fourth electrode being electrically connected with said second electrode,
a value of capacitance induced between said second electrode and said conductive layer with said insulating layer sandwiched therebetween, being not more than a value of capacitance induced in said current blocking layer,
said first semiconductor laser device having a first optical waveguide,
said second semiconductor laser device having a second optical waveguide,
said insulating layer having a first portion and a second portion that is different from said first portion,
said first portion of said insulating layer being positioned in at least a region corresponding to a light beam emitting facet of said second optical waveguide, said first portion having a thermal conductive property higher than that of said second portion, said first portion including a first material having a first thermal conductivity, said second portion including a second material having a second thermal conductivity lower than said first thermal conductivity, and said first portion extends along said second optical waveguide, the width of said first portion becoming greater toward the light emitting facet side of said second optical waveguide.

9. A semiconductor laser apparatus comprising:

a conductive support member;

an insulating layer;

a conductive layer formed on one surface of said insulating layer;

a first semiconductor laser device having a first semiconductor layer formed on a first substrate, a first electrode formed on said first semiconductor layer, and a second electrode formed on said first substrate, and emitting a light beam of a first wavelength; and a second semiconductor laser device having a second semiconductor layer formed on a second substrate, a third electrode formed on said second semiconductor layer, and a fourth electrode formed on said second substrate, and emitting a light beam of a second wavelength, said second semiconductor layer including a current blocking layer that blocks a current that flows from said third electrode to said fourth electrode, said first semiconductor laser device being provided on said support member so that said first electrode is positioned on said support member side, said insulating layer and said conductive layer being provided in order on said second electrode of said first semiconductor laser device, second semiconductor laser device being provided on said conductive layer so that said third electrode is electrically connected to said conductive layer, said fourth electrode being electrically connected with said second electrode, said a value of capacitance induced between said second electrode and said conductive layer with said insulating layer sandwiched therebetween, being not more than a value of capacitance induced in said current blocking layer, and the fourth electrode being connected with the second electrode by a wire.

* * * * *

UNITED STATES PATENT AND TRADEMARK OFFICE
CERTIFICATE OF CORRECTION

PATENT NO. : 7,655,953 B2
APPLICATION NO. : 11/215129
DATED : February 2, 2010
INVENTOR(S) : Inoue et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 883 days.

Signed and Sealed this

Thirtieth Day of November, 2010

David J. Kappos
*Director of the United States Patent and Trademark Office*